(12) United States Patent
Trokhan et al.

(10) Patent No.: US 6,576,090 B1
(45) Date of Patent: Jun. 10, 2003

(54) DEFLECTION MEMBER HAVING SUSPENDED PORTIONS AND PROCESS FOR MAKING SAME

(75) Inventors: Paul Dennis Trokhan, Hamilton, OH (US); David William Cabell, Cincinnati, OH (US); Michael Douglas Hill, Tunkhannock, PA (US)

(73) Assignee: The Procter & Gamble Company, Cincinnati, OH (US)

( * ) Notice: Subject to any disclaimer, the term of this patent is extended or adjusted under 35 U.S.C. 154(b) by 238 days.

(21) Appl. No.: 09/694,915

(22) Filed: Oct. 24, 2000

(51) Int. Cl.$^7$ .............................. D21F 1/10; G03C 5/56
(52) U.S. Cl. ...................... 162/348; 162/116; 162/903; 428/135; 428/196; 430/11; 430/18; 430/320
(58) Field of Search ..................... 162/109–117, 202, 162/211, 217, 218, 228, 289, 291, 296, 348, 351, 358.1, 358.3, 382, 383, 387, 407, 409, 411, 415, 416, 900–903; 139/383 A, 425 A; 34/111, 116, 123; 430/11, 18, 320; 428/131, 170, 134, 171, 137, 172, 156, 195, 165, 196

(56) References Cited

U.S. PATENT DOCUMENTS

| | | | |
|---|---|---|---|
| 1,536,533 A | * 5/1925 | Sheehan | 139/383 A |
| 1,716,866 A | 6/1929 | Sherman | 162/231 |
| 3,034,180 A | 5/1962 | Greiner et al. | 19/301 |
| 3,240,657 A | * 3/1966 | Hynek | 162/116 |
| 3,322,617 A | 5/1967 | Osborne | 162/296 |
| 3,350,260 A | 10/1967 | Johnson | 162/116 |

(List continued on next page.)

FOREIGN PATENT DOCUMENTS

| | | |
|---|---|---|
| EP | 1 217 106 A1 | 6/2002 |
| GB | 2 254 288 A | 10/1992 |
| WO | WO 91/14558 | 10/1991 |
| WO | WO 99/14425 | 3/1999 |

OTHER PUBLICATIONS

Tomorrow's Paper Machine Clothing Is Staring You In The Face Right Now, Scapa Group.
PCT International Search Report for PCT/US01/50472; date of mailing Sep. 12, 2002.

Primary Examiner—Steven P. Griffin
Assistant Examiner—Eric Hug
(74) Attorney, Agent, or Firm—David M. Weirich; Vladimir Vitenberg; Ken K. Patel

(57) ABSTRACT

A deflection member comprising a patterned framework having a web-side and a backside opposite to the web-side and forming an X-Y plane. The framework comprises a plurality of bases extending from the X-Y plane in a Z-direction perpendicular to the X-Y plane, and a plurality of suspended portions laterally extending from the plurality of bases to form void spaces between the X-Y plane and the suspended portions. The deflection member can comprise a reinforcing element joined to the plurality of bases and positioned between the web-side and at least a portion of the backside of the framework. A process for making the deflection member comprises curing a coating of a liquid photosensitive resin supported by a forming surface through a mask having a pattern of transparent and opaque regions. The opaque regions comprise regions having first opacity and regions having second opacity less than the first opacity. The transparent regions leave coating's areas corresponding thereto unshielded to allow said areas to cure through the entire thickness of the coating, thereby forming the bases. The opaque regions having the first opacity shield first areas of the coating to preclude curing thereof through the entire thickness of the coating. The opaque regions having the second opacity partially shield second areas of the coating to allow them to cure through a predetermined second thickness less than the entire thickness of the coating, thereby forming the suspended portions. The mask can have a gradient opacity that gradually changes in at least one direction to cause the coating to cure though a differential thickness. The mask can also have a three-dimensional topography pattern therein to imprint the coating.

21 Claims, 27 Drawing Sheets

U.S. PATENT DOCUMENTS

| | | | |
|---|---|---|---|
| 3,549,742 A | 12/1970 | Benz | 264/250 |
| 3,834,983 A | 9/1974 | Conway et al. | 162/168.3 |
| 3,994,771 A | 11/1976 | Morgan, Jr. et al. | 162/113 |
| 4,208,459 A | 6/1980 | Becker et al. | 428/154 |
| 4,514,345 A | 4/1985 | Johnson et al. | 264/22 |
| 4,528,239 A | 7/1985 | Trokhan | 428/247 |
| 4,529,480 A | 7/1985 | Trokhan | 162/109 |
| 4,541,895 A * | 9/1985 | Albert | 162/348 |
| 4,637,859 A | 1/1987 | Trokhan | 162/109 |
| 4,740,409 A | 4/1988 | Lefkowitz | 428/131 |
| 5,066,532 A | 11/1991 | Gaisser | 428/137 |
| 5,077,116 A | 12/1991 | Lefkowitz | 428/141 |
| 5,098,522 A | 3/1992 | Smurkoski et al. | 162/358 |
| 5,245,025 A | 9/1993 | Trokhan et al. | 536/56 |
| 5,260,171 A | 11/1993 | Smurkoski et al. | 430/320 |
| 5,275,700 A | 1/1994 | Trokhan | 162/358 |
| 5,328,565 A | 7/1994 | Rasch et al. | 162/113 |
| 5,330,604 A | 7/1994 | Allum et al. | 156/304 |
| 5,334,289 A | 8/1994 | Trokhan et al. | 162/358.2 |
| 5,364,504 A | 11/1994 | Smurkoski et al. | 162/116 |
| 5,429,686 A | 7/1995 | Chiu et al. | 139/383 |
| 5,431,786 A | 7/1995 | Rasch et al. | 162/348 |
| 5,462,642 A * | 10/1995 | Kajander | 162/109 |
| 5,496,624 A | 3/1996 | Stelljes, Jr. et al. | 428/229 |
| 5,500,277 A | 3/1996 | Trokhan et al. | 428/196 |
| 5,514,523 A | 5/1996 | Trokhan et al. | 430/320 |
| 5,527,428 A | 6/1996 | Trokhan et al. | 162/116 |
| 5,529,664 A | 6/1996 | Trokhan et al. | 162/109 |
| 5,549,790 A | 8/1996 | Phan | 162/109 |
| 5,554,467 A | 9/1996 | Trokhan et al. | 430/11 |
| 5,556,509 A | 9/1996 | Trokhan et al. | 162/111 |
| 5,566,724 A | 10/1996 | Trokhan et al. | 139/383 |
| 5,580,423 A | 12/1996 | Ampulski et al. | 162/111.7 |
| 5,609,725 A | 3/1997 | Phan | 162/117 |
| 5,624,790 A | 4/1997 | Trokhan et al. | 430/320 |
| 5,628,876 A | 5/1997 | Ayers et al. | 162/358.2 |
| 5,629,052 A | 5/1997 | Trokhan et al. | 427/508 |
| 5,637,194 A | 6/1997 | Ampulski et al. | 162/109 |
| 5,672,248 A | 9/1997 | Wendt et al. | 162/109 |
| 5,674,663 A | 10/1997 | McFarland et al. | 430/320 |
| 5,679,222 A | 10/1997 | Rasch et al. | 162/358.1 |
| 5,693,187 A | 12/1997 | Ampulski et al. | 162/358.2 |
| 5,709,775 A | 1/1998 | Trokhan et al. | 162/117 |
| 5,714,041 A | 2/1998 | Ayers et al. | 162/111 |
| 5,718,806 A | 2/1998 | Trokhan et al. | 162/363 |
| 5,741,402 A | 4/1998 | Trokhan et al. | 162/374 |
| 5,744,007 A | 4/1998 | Trokhan et al. | 162/374 |
| 5,746,887 A | 5/1998 | Wendt et al. | 162/109 |
| 5,776,311 A | 7/1998 | Trokhan et al. | 162/252 |
| 5,795,440 A | 8/1998 | Ampulski et al. | 162/117 |
| 5,814,190 A | 9/1998 | Phan | 162/111 |
| 5,817,377 A | 10/1998 | Trokhan et al. | 427/508 |
| 5,820,730 A | 10/1998 | Phan et al. | 162/112 |
| 5,846,379 A | 12/1998 | Ampulski et al. | 162/109 |
| 5,885,421 A | 3/1999 | Ensign et al. | 162/306 |
| 5,893,965 A | 4/1999 | Trokhan et al. | 162/205 |
| 5,900,122 A | 5/1999 | Huston | 162/348 |
| 5,948,210 A | 9/1999 | Huston | 162/117 |
| 5,954,097 A | 9/1999 | Boutilier | 139/383 |
| 5,972,813 A | 10/1999 | Polat et al. | 442/320 |
| 6,017,417 A | 1/2000 | Wendt et al. | 162/109 |
| 6,039,839 A | 3/2000 | Trokhan et al. | 162/116 |
| 6,165,585 A | 12/2000 | Trokhan | 428/101 |
| 6,398,910 B1 | 6/2002 | Burazin et al. | 162/109 |
| 6,436,240 B1 * | 8/2002 | Jeffrey | 162/358.2 |

* cited by examiner

DEFLECTION MEMBER HAVING SUSPENDED PORTIONS AND PROCESS FOR MAKING SAME

FIELD OF THE INVENTION

The present invention is related to processes for making strong, soft, absorbent fibrous webs, such as, for example, paper webs. More particularly, this invention is concerned with structured fibrous webs, equipment used to make such structured fibrous webs, and processes therefor.

BACKGROUND OF THE INVENTION

Products made from a fibrous web are used for a variety of purposes. For example, paper towels, facial tissues, toilet tissues, napkins, and the like are in constant use in modern industrialized societies. The large demand for such paper products has created a demand for improved versions of the products. If the paper products such as paper towels, facial tissues, napkins, toilet tissues, mop heads, and the like are to perform their intended tasks and to find wide acceptance, they must possess certain physical characteristics.

Among the more important of these characteristics are strength, softness, and absorbency. Strength is the ability of a paper web to retain its physical integrity during use. Softness is the pleasing tactile sensation consumers perceive when they use the paper for its intended purposes. Absorbency is the characteristic of the paper that allows the paper to take up and retain fluids, particularly water and aqueous solutions and suspensions. Important not only is the absolute quantity of fluid a given amount of paper will hold, but also the rate at which the paper will absorb the fluid.

Through-air drying papermaking belts comprising a reinforcing element and a resinous framework, and/or fibrous webs made using these belts are known and described, for example, in the following commonly assigned U.S. Patents, the disclosures of which are incorporated herein by reference: U.S. Pat. No. 4,514,345, issued Apr. 30, 1985 to Johnson et al.; U.S. Pat. No. 4,528,239, issued Jul. 9, 1985 to Trokhan; U.S. Pat. No. 4,529,480 issued Jul. 16, 1985 to Trokhan; U.S. Pat. No. 4,637,859 issued Jan. 20, 1987 to Trokhan; U.S. Pat. No. 5,098,522, issued Mar. 24, 1992 to Smurkoski, et al.; U.S. Pat. No. 5,245,025 issued Sep. 14, 1993 to Trokhan et al.; U.S. Pat. No. 5,260,171, issued Nov. 9, 1993 to Smurkoski et al.; U.S. Pat. No. 5,275,700, issued Jan. 4, 1994 to Trokhan; U.S. Pat. No. 5,328,565, issued Jul. 12, 1994 to Rasch et al.; U.S. Pat. No. 5,334,289, issued Aug. 2, 1994 to Trokhan et al.; U.S. Pat. No. 5,431,786, issued Jul. 11, 1995 to Rasch et al.; U.S. Pat. No. 5,496,624, issued Ma. 5, 1996 to Stelljes, Jr. et al.; U.S. Pat. No. 5,500,277, issued Mar. 19, 1996 to Trokhan et al.; U.S. Pat. No. 5,514,523, issued May 7, 1996 to Trokhan et al.; U.S. Pat. No. 5,527,428 issued Jun. 18, 1996 to Trokhan et al.; U.S. Pat. No. 5,554,467, issued Sep. 10, 1996, to Trokhan et al.; U.S. Pat. No. 5,566,724, issued Oct. 22, 1996 to Trokhan et al.; U.S. Pat. No. 5,624,790, issued Apr. 29, 1997 to Trokhan et al.; U.S. Pat. No. 5,628,876 issued May 13, 1997 to Ayers et al.; U.S. Pat. No. 5,679,222 issued Oct. 21, 1997 to Rasch et al.; U.S. Pat. No. 5,714,041 issued Feb. 3, 1998 to Ayers et al.; U.S. Pat. No. 5,900,122 issued May 4, 1999 to Huston; and U.S. Pat. No. 5,948,210 issued Sep. 7, 1999 to Huston.

In the aforementioned belts of prior art the resinous framework is joined to the fluid-permeable reinforcing element (such as, for example, a woven structure, or a felt). The resinous framework may be continuous, semi-continuous, comprise a plurality of discrete protuberances, or any combination thereof. The resinous framework extends outwardly from the reinforcing element to form a web-side of the belt (i. e., the surface upon which the web is disposed during a papermaking process), a backside opposite to the web-side, and deflection conduits extending therebetween. The deflection conduits provide spaces into which papermaking fibers deflect under application of a pressure differential during a papermaking process. Because of this quality, such papermaking belts are also known in the art as "deflection members." The terms "papermaking belt" and "deflection member" may be used herein interchangeably.

Papers produced on such deflection members, disclosed in the aforementioned patents, are generally characterized by having at least two physically distinct regions: a region having a first elevation and typically having a relatively high density, and a region extending from the first region to a second elevation and typically having a relatively low density. The first region is typically formed from the fibers that have not been deflected into the deflection conduits, and the second region is typically formed from the fibers deflected into the deflection conduits of the deflection member. The papers made using the belts having a continuous resinous framework and a plurality of discrete deflection conduits dispersed therethrough comprise a continuous high-density network region and a plurality of discrete low-density pillows (or domes), dispersed throughout, separated by, and extending from the network region. The continuous high-density network region is designed primarily to provide strength, while the plurality of the low-density pillows is designed primarily to provide softness and absorbency. Such belts have been used to produce commercially successful products, such as, for example, Bounty® paper towels, Charmin® toilet tissue, and Charmin Ultra® toilet tissue, all produced and sold by the instant assignee.

Typically, certain aspects of absorbency of a fibrous structure are highly dependent on its surface area. That is, for a given fibrous web (including a fiber composition, basis weight, etc.), the greater the web's surface area the higher the web's absorbency. In the structured webs, the low-density pillows, dispersed throughout the web, increase the web's surface area, thereby increasing the web's absorbency. However, increasing the web's surface area by increasing the area comprising the relatively low-density pillows would result in decreasing the web's area comprising the relatively high-density network area that imparts the strength. That is, increasing a ratio of the area comprising pillows relative to the area comprising the network would negatively affect the strength of the paper, because the pillows have a relatively low intrinsic strength compared to the network regions. Therefore, it would be highly desirable to minimize the trade-off between the surface area of the high-density network region primarily providing strength, and the surface area of the low-density region primarily providing softness and absorbency.

Now, it has been discovered that the areas of the high-density region and the low-density region can be effectively de-coupled in a fibrous structure, e. g., that the surface area of the fibrous structure may be increased without sacrificing the strength of the fibrous structure. Specifically, it has been discovered that the surface area of the relatively low-density and absorbent pillows can be sufficiently increased, without decreasing the area of the relatively high-density network, by forming a novel fibrous structure using a deflection member of the present invention.

Accordingly, the present invention provides a novel strong, soft, and absorbent fibrous structure and a process for making such a fibrous structure. More specifically, the present invention provides a fibrous structure that has at least two regions: a first region having a first elevation and a second region extending from the first region to define a second elevation, the second region having an increased surface area that enhances absorption qualities of the fibrous structure.

The present invention further provides a fibrous structure wherein the second region comprises fibrous domes and fibrous cantilever portions laterally extending from the domes. The fibrous cantilever portions increase the surface area of the second region and form, in some embodiments, pockets comprising substantially void spaces between the fibrous cantilever portions and the first region. These pockets are capable of receiving additional amounts of liquid and thus further increase absorbency of the fibrous structure.

The present invention also provides novel deflection members useful for making such structured fibrous structures. More specifically, the present invention provides deflection members comprising a patterned framework having suspended portions that form voids into which the fibers can be deflected during a process for making the fibrous structure of the present invention, to form the fibrous cantilever portions.

The present invention further provides processes for making such deflection members. In one embodiment, such a deflection member comprises a multi-layer framework formed by at least two layers joined together in a face-to-face relationship. Each of the layers has a deflection conduit portion. The deflection conduit portion of one layer is fluid-permeable and positioned such that portions of that layer correspond to the deflection conduits of the other layer and thus comprise a plurality of suspended portions.

In another embodiment, such a deflection member comprises a single-layer framework wherein the suspended portions are formed by curing a layer of a curable material through a novel mask of the present invention, comprising regions of differential opacities.

In still another embodiment, the deflection member can be made by curing a coating of the curable material through a novel mask of the present invention, comprising opaque regions and transparent regions, and a three-dimensional topography.

The present invention further provides novel masks that can be used in a process for selective curing of a curable material, such as, for example, a photosensitive resinous material. Such masks can also be used in making deflection members of the present invention. More specifically, the present invention provides a mask having a pattern of transparent regions and opaque regions, the opaque regions comprising differential opacity.

The present invention also provides a mask in which the opaque regions comprise a gradient opacity that gradually changes in at least one direction. The present invention further provides a mask having a combined pattern comprising a pattern of the transparent/opaque regions and a three-dimensional pattern of protrusions extending from at least one side of the mask. The present invention also provides processes for making the masks of the present invention.

SUMMARY OF THE INVENTION

A deflection member of the present invention comprises a framework having a web-side and a backside opposite to the web-side. The framework can be made of any suitable material, including, without limitation, a resinous material (such as, for example, a photosensitive resin), a plastic, a metal, metal-impregnated polymers, etc. The back side of the framework defines an X-Y plane. A thickness of the framework extends between the web-side and the backside in a Z-direction perpendicular to the X-Y plane.

The framework comprises a plurality of bases extending from the X-Y plane in the Z-direction, and a plurality of suspended portions laterally extending from the plurality of bases, wherein the suspended portions are elevated in the Z-direction from the X-Y plane to form void spaces between the X-Y plane and the suspended portions. While the suspended portions themselves do not need to be parallel to the X-Y plane, it is said that the suspended portions can "extend" in directions substantially parallel to the X-Y plane, to indicate that the suspended portions extend "laterally" from the bases (i. e. not parallel to the Z-direction).

In one embodiment, the framework comprises a multi-layer (laminated) structure formed by at least two layers: a first layer and a second layer joined together in a face-to-face relationship. Each of the layers has a top surface and a bottom surface opposite to the top surface. Each of the layers can have a conduit portion comprising at least one deflection conduit extending in the Z-direction from the top surface toward the bottom surface. The conduit portion can extend from the top surface to the bottom surface through the entire thickness of the layer. The bottom surface of the first layer forms the backside of the framework, and the top surface of the second layer forms the web-side of the framework. In a multi-layer embodiment of the deflection member (i. e., the deflection member comprising a plurality of layers), the plurality of bases is formed by the first layer.

According to the present invention, in an exemplary dual-layer deflection member (i. e., the deflection member comprising two layers), the second layer comprises a plurality of suspended portions elevated in the Z-direction from the X-Y plane to form void spaces between the X-Y plane and the suspended portions. During a process of making a fibrous structure of the present invention, these void spaces can receive a plurality of fibers to form fibrous cantilever portions of the fibrous structure being formed.

The deflection member of the present invention can further comprise a reinforcing element positioned between the web-side and at least a portion of the backside of the framework. The reinforcing element can be fluid-permeable, fluid-impermeable, or partially fluid-permeable (meaning that some portions of the reinforcing element may be fluid-permeable, while other portions thereof may be not). Examples of the reinforcing element include, without limitation, a woven element, a felt, a mesh wire, or a combination thereof. In the embodiment comprising the multi-layer deflection member, the reinforcing element is typically positioned between the top surface of the first layer and at least a portion of the bottom surface of the first layer, in which instance, the void spaces are formed between the reinforcing element and the suspended portions of the second layer.

In a multi-layer deflection member of the present invention, each of the layers can comprise a substantially continuous framework, a substantially semi-continuous framework, a plurality of discrete protuberances, or any combination thereof. In the exemplary dual-layer deflection member, examples of combinations of the first and second layers include, without limitation, the following: the deflection member, wherein the first layer comprises a substantially continuous patterned network defining a first plurality of discrete deflection conduits therewithin, and the second layer comprises a substantially continuous patterned network defining a second plurality of discrete deflection conduits therewithin; the deflection member, wherein the first layer comprises a substantially continuous patterned network defining a first plurality of discrete deflection conduits therewithin, and the second layer comprises a semi-continuous patterned network; the deflection member, wherein the first layer comprises a substantially continuous patterned network defining a first plurality of discrete deflection conduits therewithin, and the second layer comprises a plurality of discrete protuberances; the deflection member, wherein the first layer comprises a semi-continuous patterned network, and the second layer comprises a substantially continuous patterned network defining a second plurality of discrete deflection conduits therewithin; the deflection member, wherein the first layer comprises a first semi-continuous patterned network, and the second layer comprises a second semi-continuous patterned network; the deflection member, wherein the first layer comprises a semi-continuous patterned network, and the second layer comprises a plurality of discrete protuberances; the deflection member, wherein the first layer comprises a plurality of discrete protuberances, and the second layer comprises a substantially continuous patterned network defining a second plurality of discrete deflection conduits therewithin; the deflection member, wherein the first layer comprises a plurality of discrete protuberances, and the second layer comprises a semi-continuous patterned network; the deflection member, wherein the first layer comprises a first plurality of discrete protuberances, and the second layer comprises a second plurality of discrete protuberances.

The first layer and/or the second layer may be fluid-impermeable or partially fluid-permeable. One example of the partially-fluid permeable layer comprises a layer having a plurality of deflection conduits, wherein at least some of the deflection conduits are "closed" with a fluid-impermeable material.

A process for making the multi-layer deflection member comprises the following steps:

forming a first layer having a top surface and a bottom surface opposite to the top surface and defining an X-Y plane, the first layer further having a first conduit portion extending between the top and bottom surfaces of the first layer;

forming a second layer having a top surface, a bottom surface opposite to the top surface, and a second conduit portion extending between the top and bottom surfaces of the second layer; and joining the first layer and the second layer together in a face-to-face relationship such that the top surface of the first layer faces the bottom surface of the second layer, wherein suspended portions of the second layer corresponding to the first conduit portion of the first layer are spaced at a distance from the X-Y plane to form void spaces between the X-Y plane and the suspended portions of the second layer.

Either one or both of the first layer and the second layer may be formed by a process comprising the following steps:

providing a coating of a liquid photosensitive resin supported by a forming surface, the coating having a first thickness;

providing a source of curing radiation;

providing a mask having a pre-selected pattern of transparent regions and opaque regions therein and positioning the mask between the coating of the liquid photosensitive resin and the source of curing radiation so that the opaque regions of the mask shield areas of the coating from the curing radiation while the transparent regions of the mask cause other areas of the coating to be unshielded;

curing the unshielded areas of the coating by exposing the coating to the curing radiation through the mask while leaving the shielded areas of the coating uncured, thereby forming a partly-formed layer;

removing substantially all uncured liquid photosensitive resin from the partly-formed layer to leave a hardened resinous structure.

Optionally, a backing film may be provided and positioned between the forming surface and the coating of a liquid photosensitive resin, to protect the forming surface from being contaminated by the liquid resin.

Alternatively or additionally to the process of making the layers described herein above, each or both of the layers can be formed by providing a ply of a predetermined thickness and forming therein a plurality of apertures of predetermined shapes and according to a pre-selected pattern.

If the deflection member having the reinforcing element is desired, the process may further include steps of providing a suitable reinforcing element supported by the forming surface, the reinforcing element having a lower side facing the forming surface and an upper side opposite to the lower side, and depositing the coating of a liquid photosensitive resin to the upper side of the reinforcing element.

Optionally, a thickness of the coating can be controlled by, for example, a roll, a bar, a knife, or any other suitable means known in the art.

In one embodiment, the first and second layers are produced simultaneously on two respective forming surfaces and then are joined together, upon contact, in a press nip. According to one embodiment of the present invention, a step of maintaining at least one of the top surface of the first layer and the bottom surface of the second layer in a partially uncured condition is required to enable the first and second layers to join together upon contact therebetween. Alternatively or additionally, the first and second layers can be joined by using an adhesive material. In one embodiment, the top surface of the first layer and/or the bottom surface of the second layer comprise(s) a chemically-active ingredients causing or facilitating joining together of the first and second layers.

Each of the suspended portions has a web-oriented surface comprising the web-side of the framework, and a back surface opposite thereto. The void spaces formed between the suspended portions and the X-Y plane, or between the suspended portions and the reinforcing element, are formed—more specifically—between the back surfaces of the suspended portions and either the X-Y plane or the reinforcing element. A plurality of shapes and configurations of the back surfaces of the suspended portions are contemplated in the present invention, all of which could be formed using one of the processes of the present invention. The suspended portion may have the back surface that is substantially parallel to the X-Y plane. The suspended portion may also have the back surface that is not parallel to the web-oriented surface. The suspended portion may have curving, circular, "waving" back surfaces, or back surfaces having different irregular shapes.

When viewed in a particular cross-section perpendicular to the X-Y plane, the suspended portion may form either a "cantilever" portion or a "bridge" portion in a cross-section. As used herein, the "cantilever" suspended portion means the suspended portion that has at least one free end in a cross-section perpendicular to the X-Y plane, while the "bridging" suspended portion is the suspended portion that interconnects (or "bridges") at least two adjacent bases in a cross-section perpendicular to the X-Y plane.

Analogously with the differential patterns of the layers, described above, the web-side and the backside of the framework may comprise a substantially continuous pattern, a substantially semi-continuous pattern, or a pattern formed by a plurality of discrete protuberances. The difference between the patterns as regards the framework as a whole and the patterns as regards the web-side or backside surfaces of the framework is that in the context of the framework as a whole, the entire thickness of the framework is under consideration for the purposes of continuity, semi-continuity, or discontinuity of the framework; while in the context of the web-side and the backside of the framework, only a relevant surface (of the web-side or the backside) is under consideration for the purposes of continuity, semi-continuity, or discontinuity of that relevant surface.

The framework as a whole, whether multi-layer or single-layer, may have a fluid-permeable conduit portion extending from the web-side to the backside of the framework. In one embodiment, at least one of the web-side and the backside of the framework comprises a substantially continuous pattern of a plurality of discrete openings dispersed therethrough, wherein the plurality of discrete openings comprises a plurality of discrete deflection conduits. Some of the plurality of openings in the web-side or the backside may be closed by a fluid-impermeable material to form fluid-impermeable portions of the framework, if desired.

Another embodiment of a process for making a deflection member, or a single layer thereof, comprises the following steps:

providing a coating of a liquid photosensitive resin supported by a forming surface, the coating having a top surface, a bottom surface opposite thereto and facing the forming surface, and a pre-selected first thickness defined between the top and bottom surfaces;

providing a source of curing radiation;

providing a mask having transparent regions and opaque regions, the opaque regions comprising at least first opaque regions and second opaque regions, the first opaque regions having a first opacity, and the second opaque regions having a second opacity less that the first opacity;

positioning the mask between the coating and the source of curing radiation; curing the liquid photosensitive resin through the mask, wherein the first opaque regions shield first areas of the coating from the curing radiation to preclude curing of the first areas of the coating through the first thickness of the coating, the second opaque regions partially shield second areas of the coating to allow the curing radiation to cure the second area of the coating to a predetermined second thickness less than the first thickness of the coating, and the transparent regions leave third areas of the coating unshielded to allow the curing radiation to cure the third areas through the first thickness of the coating, thereby forming a partly-formed deflection member; and removing substantially all uncured liquid photosensitive resin from the partly-formed deflection member to leave a hardened resinous structure which forms a macroscopically monoplanar, patterned framework having a web-side formed from the top surface of the coating, and a backside formed from the bottom surface of the coating and defining an X-Y plane.

The resulting framework comprises a plurality of bases formed from the third areas of the coating and a plurality of suspended portions formed from the second areas of the coating, wherein the suspended portions laterally extend from the plurality of bases and are spaced from the X-Y plane to form void spaces between the X-Y plane and the suspended portions.

A fibrous structure of the present invention comprises at least two regions: a first plurality of micro-regions (or simply a first region) defining a first plane and having a first elevation, and a second plurality of micro-regions (or simply a second region) outwardly extending from the first plane to define a second elevation, wherein at least some of the second plurality of micro-regions comprise a fibrous dome and a fibrous cantilever portion extending laterally from the dome at a second elevation. As used herein, the fibrous dome and the cantilever portion extending therefrom comprise a "pillow." It is to be understood, however, that some pillows may not have the cantilever portion.

Each of the first and second pluralities of micro-regions can be substantially continuous, substantially semi-continuous, be formed by a plurality of discrete protuberances, or comprise a combination thereof. If the first plurality of micro-regions comprises a substantially continuous and macroscopically monoplanar network area, the second plurality of micro-regions can comprise a plurality of discrete pillows dispersed throughout the network area, at least some of the pillows comprising the fibrous dome extending from the network area and the fibrous cantilever portion laterally extending from the dome.

Some of the fibrous cantilever portions are elevated from the first plane to form pockets comprising substantially void spaces between the first plane and the fibrous cantilever portion. These pockets are believed to provide additional room for receiving liquids during the use of the fibrous structure and thus enhance its absorptive properties. The fibrous cantilever portions of the fibrous structure also increase its overall surface area, thereby further contributing to increasing the absorptive properties of the fibrous structure. In a cross-section perpendicular to the X-Y plane, a ratio of an overall cross-sectional perimeter of at least one of the pillows comprising the fibrous cantilever portion to a cross-sectional base of said pillow is 4/1 or greater.

Some of the pillows, whether they comprise a continuous pattern, a semi-continuous pattern, or a pattern of discrete protuberances, may not have a well-defined fibrous cantilever portion in a cross-section perpendicular to the X-Y plane. But even without the fibrous cantilever portions, the fibrous structure of the present invention provides the benefit of an increased surface area of the second plurality of micro-regions. Therefore, in another aspect, the fibrous structure of the present invention comprises a first plurality of micro-regions defining a first plane and having a first elevation and a second plurality of micro-regions outwardly extending from the first plane to form a second elevation, wherein in at least one cross-section perpendicular to the first plane the second plurality of micro-regions comprises a pillow having a cross-sectional perimeter and a cross-sectional base measured at the first elevation, wherein a ratio of the cross-sectional perimeter to the cross-sectional base is 4/1 or greater.

The differential regions of the fibrous structure may have differential basis weights and/or differential densities, and/or differential fiber compositions. In one embodiment, a density of the first plurality of micro-regions is greater than a density of the second plurality of micro-regions. In another embodiment, a basis weight of the second plurality of micro-regions is greater than a basis weight of the first plurality of micro-regions. In still another embodiment, a ratio of the amount of long fibers relative to the amount of short fibers can be varied such that that ratio is 1.0, greater than 1.0, or less than 1.0. The fibrous structure of the present invention can have an intermediate density relative to the high density of the first plurality of micro-regions and the low density of the second plurality of micro-regions. The fibrous cantilever portions may have such an intermediate density.

A laminated structure of the present invention comprises at least two laminae. A least one of the laminae comprises the fibrous structure described above. In one embodiment, the laminated fibrous structure of the present invention comprises at least a first lamina and a second lamina joined together. The first lamina comprises a fibrous sheet having at least two regions and comprising a first plurality of micro-regions defining a first plane and having a first elevation, and a second plurality of micro-regions comprising a plurality of fibrous domes outwardly extending from the first plane to define a second elevation and a plurality of fibrous cantilever portions laterally extending from the domes at the second elevation. The other lamina or laminae in the laminated structure may or may not have fibrous cantilever portions. Of course, the other lamina or laminae may be made by any process known in the art, including, without limitation, through-air-drying and conventional processes. The laminae can be joined such that the fibrous cantilever portions of one lamina face the other lamina. Alternatively, the laminae having the fibrous cantilever portions can be joined by a side opposite to that having the fibrous cantilever portions.

In the laminated fibrous structure comprising at least two laminae, each laminae can have the fibrous cantilever portions spaced from the first plane to form pockets comprising substantially void spaces between the first plane and the fibrous cantilever portions. Then, if the two laminae are joined together such that the fibrous cantilever portions of one lamina face the fibrous cantilever portions of the other lamina, at least some of the fibrous cantilever portions of one lamina can be disposed in the pockets formed between the fibrous cantilever portions and the first plane of the other lamina. Such a joining of two laminae is believed to provide a limited movability of the laminae relative to one another in at least one lateral direction, without tearing of either lamina or separation of the laminae. Such a movability is believed to facilitate softness and absorbency of the laminated fibrous structure of the present invention. Alternatively, the laminae can be joined such that their respective fibrous cantilever portions face opposite directions.

A process for making a fibrous structure of the present invention comprises the following steps:

providing the deflection member of the present invention, described above;

providing a plurality of fibers and depositing the plurality of fibers on the deflection member;

deflecting a portion of the plurality of fibers into the deflection conduits of the deflection member such as to cause some of the deflected fibers or portions thereof to be disposed within the void spaces formed between the X-Y plane and the suspended portions of the deflection member, thereby forming a partly-formed fibrous structure; and separating the partly-formed fibrous structure from the deflection member, thereby forming the fibrous structure of the present invention.

The process can further comprise a step of pressing the deflection member having the partly-formed fibrous structure thereon against a pressing surface, such as, for example, a surface of a Yankee drying drum, thereby densifying portions of the partly-formed fibrous structure.

The step of deflecting a portion of the plurality of fibers may comprise applying a mechanical pressure to the portion of the fibers, or a fluid pressure differential, such as, for example, a vacuum pressure, to the plurality of fibers. In one embodiment, a web disposed on the deflection member can be overlaid with a flexible sheet of material such that the web is disposed between the flexible sheet of material and the deflection member. The flexible sheet of material has an air permeability less than that of the deflection member. The flexible sheet of material can also be air-impermeable. An application of a fluid pressure differential to the sheet of material causes deflection of at least a portion of the sheet of material towards the papermaking belt and deflection of at least a portion of the web into the conduits of the papermaking belt.

The plurality of fibers can be selected from any fibers known in the art, for example, cellulosic fibers, synthetic fibers, or any combination thereof. The plurality of fibers can also be supplied in the form of a moistened fibrous web in which portions of the web could be effectively deflected into the deflection conduits and the void spaces formed between the suspended portions and the X-Y plane of the deflection member.

The present invention also provides a mask for use in a process for curing a curable material, such as, for example, a photosensitive resinous material, suitable for making the deflection member of the present invention. In one embodiment, the mask of the present invention comprises a structure having a top side and a bottom side opposite to the top side, and a pattern of transparent regions and opaque regions, wherein the opaque regions comprise at least first opaque regions having a first opacity and second opaque regions having a second opacity different from the first opacity.

The transparent regions and the opaque regions can comprise a non-random and repeating pattern. The opaque regions can comprise a substantially continuous pattern, a substantially semi-continuous pattern, a pattern formed by a plurality of discrete areas, or any combination thereof. Furthermore, the first opaque regions and the second opaque regions can comprise a non-random and repeating pattern. The first opaque regions, the second opaque regions, or both of the first and second opaque regions can comprise a substantially continuous pattern, a substantially semi-continuous pattern, a pattern formed by a plurality of discrete areas, or any combination thereof. The second opaque regions can be adjacent to or separated from the first opaque regions.

The opaque regions can comprise more than two differential opacities. For example, the mask according to the present invention can comprise third opaque regions having a third opacity intermediate the first opacity and the second opacity.

In one embodiment, the opaque regions comprise a gradient opacity that gradually changes in at least one direction. The region of gradient opacity may comprise the first opaque region, the second opaque region, or be separate from those. The gradient opacity can change, in equal increments or alternatively in unequal increments, in one or several directions.

In another embodiment, the mask comprises a three-dimensional topography, such as, for example, a pattern of protrusions extending from at least one side of the mask. Protrusions extending from the bottom side of the mask can be structured and configured to be imprinted into the coating of a curable material to form corresponding depressions, or voids, in the coating. Protrusions extending from the top side of the mask can be structured and configured to provide voids into which the liquid curable material can flow to approximate the contours of the mask's topography. Either one or both of the patterns of protrusions can comprise a substantially continuous pattern, a substantially semi-continuous pattern, a pattern formed by a plurality of discrete protuberances, or any combination thereof. Either one or both of the patterns of protrusions can correlate with the pattern of transparent regions and opaque regions to form a combined non-random and repeating pattern. In one such embodiment, the opaque regions comprise distal surfaces of the protrusions.

In one embodiment of the mask, the pattern of transparent and opaque regions is independent and separable from the pattern of the protrusions. Such a mask can comprise a composite structure formed by at least a first element and a second element juxtaposed therewith in a face-to-face relationship, wherein the first element forms the pattern of transparent and opaque regions, and the second element forms the pattern of protrusions. The first and second elements in such a composite mask can be superimposed to form a combined non-random and repeating pattern of the opaque regions and the protrusions.

The mask having differential opacities can be used in a process for curing a curable material for constructing the deflection member of the present invention. For example, when the mask comprising the first and second opacities is positioned between the source of curing radiation and a coating of the curable material, to selectively shield the coating from the curing radiation, the first opaque regions having a first opacity shield first areas of the coating from the curing radiation to cause the first regions to remain uncured through the entire thickness of the coating, the second opaque regions having the second opacity partially shield second areas of the coating to allow the curing radiation to cure the coating through a partial thickness less than the entire thickness of the coating, and the transparent regions leave third areas of the coating unshielded to allow the curing radiation to cure the curable material through its entire thickness.

If the mask having gradient opacity is used for curing a coating, a region having the gradient opacity shields a corresponding area of the coating from the curing radiation such as to cause said corresponding area to cure through a gradually changing thickness correlating with the gradually changing opacity of the mask's gradually-opaque region. For example, if the gradient opacity changes (increases or decreases) in equal increments or decrements in one direction, a depth of curing of the corresponding area of the coating will also change gradually in equal decrements or increments. Of course, the gradient opacity may change in unequal increments.

The mask of the present invention can be made by a process comprising the steps of providing a thin transparent material of substantially uniform thickness, such as, for example, a transparent film; forming a pattern of opaque regions on the material according to a first predetermined pattern; and embossing the material according to a second predetermined pattern. The process can be structured such that the first predetermined pattern substantially correlates with the second predetermined pattern to form a combined non-random repeating pattern. For example, the steps of forming the opaque regions and embossing the material can be performed simultaneously. The step of forming a pattern of opaque regions can comprise applying ink to selected regions of the thin transparent material. The selected regions can comprise distal surfaces of the embossed areas of the material.

The mask having regions of differential opacities can be formed in a multi-step process comprising printing a transparent film to form a pattern of opaque regions having a certain initial opacity, and then printing the film a second (third, fourth, etc.) time, as needed, to form a pattern (or patterns) of opaque regions having another opacity (or other opacities), different from the initial opacity (or different from one another). The differential opacities can also be formed in one-step printing, for example, by a Gravure roll comprising a pattern having a differential depths for receiving ink. During printing, the ink transferred from the Gravure roll to the transparent film will have regions of differential intensities, reflecting the differential depths of the roll's pattern. Other methods of forming opaque regions can be used in the present invention, including, without limitation, chemical, electromagnetic, laser, heat, etc.

In another aspect, a process for making the deflection member of the present invention, using a three-dimensional mask described above, comprises the following steps:

providing a coating of a liquid curable material supported by a forming surface, the coating having a bottom surface facing the forming surface, a top surface opposite to the bottom surface, and a first thickness defined between the top and bottom surfaces;

providing a source of curing radiation structured and configured to emit a curing radiation to cure the coating supported by the forming surface;

providing a mask having a first pattern of transparent regions and opaque regions therein, and a second pattern of protrusions outwardly extending from one side of the mask;

positioning the mask between the coating and the source of curing radiation such that the second pattern of protrusions is at least partially submerged into the coating, thereby forming three-dimensional voids therein;

curing the curable material, wherein the opaque regions of the first pattern at least partially shield selected areas of the coating from the curing radiation such that the selected areas are cured through at least a portion of the first thickness, thereby forming a partly-formed deflection member; and removing substantially all uncured material from the partly-formed deflection member to leave a hardened resinous structure which forms the deflection member comprising a macroscopically monoplanar, patterned framework having a web-side formed from the top surface of the coating, and a backside formed from the bottom surface of the coating.

As explained above, the first pattern, the second pattern, or both the first and second patterns can be non-random and repeating. Depending on a specific embodiment of the mask, the mask can be positioned such that the second pattern of protrusions is submerged into the selected areas that are at least partially shielded by the opaque regions of the first pattern of the mask. Alternatively or additionally, the mask can be positioned such that that the second pattern of protrusions is submerged into the areas that are not shielded by the opaque regions of the first pattern of the mask.

In one embodiment, the mask comprises a composite structure formed by at least a film and an embossing element juxtaposed therewith, the embossing element forming the second pattern of protrusions. In such an embodiment, the embossing element, the film, or both the embossing element and the film can comprise opaque regions. If both the embossing element and the film comprise opaque regions, it may be beneficial to provide that the opaque regions of the embossing element and the opaque regions of the film are mutually coordinated to form the first pattern of transparent and opaque regions.

The embossing element can be transparent to the curing radiation. Alternatively, the embossing element can be impermeable to the curing radiation. In one embodiment, the embossing element has voids therethrough. Such an embossing element can comprise, for example, and without limitation, a woven element having open areas therethrough, or a mesh wire.

A process for making a deflection member, using the composite mask can comprise the following steps:

providing a coating of a liquid curable material supported by a forming surface, the coating having a bottom surface facing the forming surface, a top surface opposite to the bottom surface, and a first thickness defined between the top and bottom surfaces;

providing a source of curing radiation structured and configured to emit a curing radiation to cure the coating of the liquid curable material supported by the forming surface;

providing an embossing element and juxtaposing the embossing element with the top surface of the coating such that the embossing element is at least partially submerged into the coating, thereby forming a pattern of voids in the coating;

providing a film and juxtaposing the film with the embossing element, wherein the embossing element and the film in combination comprise a pattern of transparent regions and opaque regions, wherein the opaque regions shield areas of the coating from the curing radiation, while the transparent regions cause other areas of the coating to be unshielded;

curing the unshielded areas of the coating by exposing the coating to the curing radiation through the embossing element and the film, while leaving the shielded areas of the coating uncured, thereby forming a partly-formed deflection member; and removing substantially all uncured material from the partly-formed deflection member to leave a hardened resinous structure comprising a macroscopically monoplanar, patterned framework having a web-side formed from the top surface of the coating, and a backside formed from the bottom surface of the coating.

In its industrial application, each of the processes of making the deflection member, described herein, can comprise a continuous process. For example, the continuous process of making the deflection member, using the three-dimensional mask, comprises the following steps:

providing a coating of a liquid curable material supported by a forming surface, and continuously moving the forming surface with the coating in a machine direction, the coating having a bottom surface facing the forming surface, a top surface opposite to the bottom surface, and a first thickness defined between the top and bottom surfaces;

providing a source of curing radiation structured and configured to emit a curing radiation to continuously cure the coating supported by the forming surface moving in the machine direction;

continuously providing a transparent film;

continuously printing the film to form a first pattern of opaque regions therein;

continuously embossing the film to form a second pattern of protrusions therein; continuously moving the film having the first pattern of opaque regions and the second pattern of protrusions to position said film between the coating and the source of curing radiation such that the second pattern of protrusions is at least partially submerged into the coating, thereby forming three-dimensional voids therein;

continuously curing the curable material, wherein the opaque regions of the first pattern at least partially shield selected areas of the curable material from the curing radiation such that the selected areas are cured through at least a portion of the first thickness of the coating, thereby forming a partly-formed deflection member; and continuously removing substantially all uncured material from the partly-formed deflection member to leave a hardened resinous structure comprising a macroscopically monoplanar, patterned framework having a web-side formed from the top surface of the coating, and a backside formed from the bottom surface of the coating.

BRIEF DESCRIPTION OF DRAWINGS

In FIG. 48 the deflection member is shown free of a compressive force, and in FIG. 49 the deflection member is shown under application of the compressive force.

DETAILED DESCRIPTION OF THE INVENTION

Deflection Member

Figure 1:
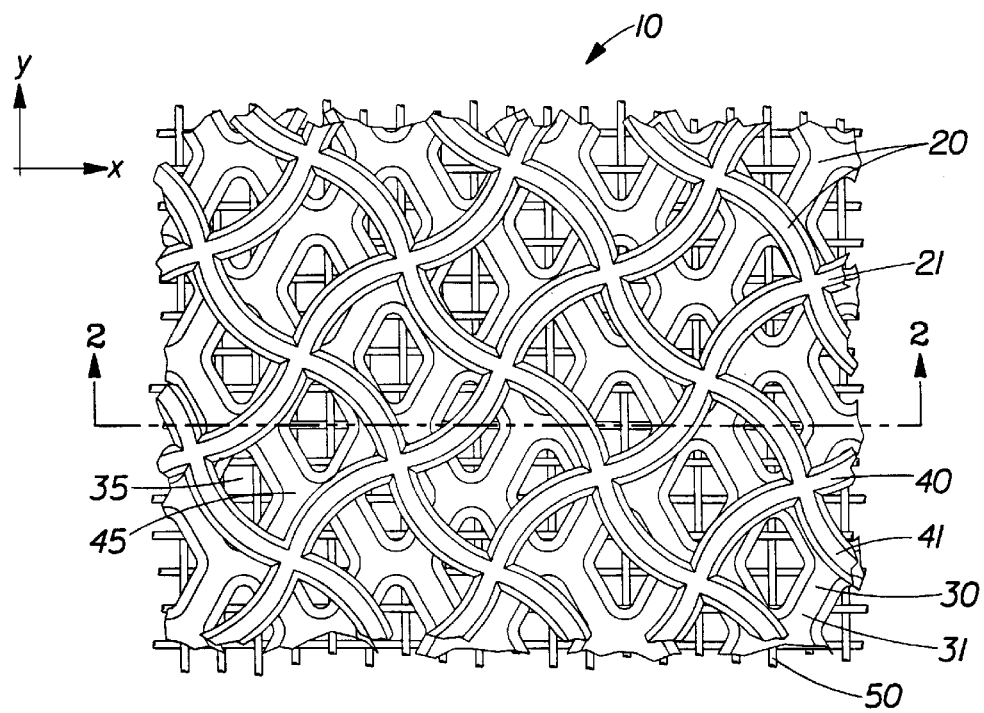
FIG. 1 is a schematic plan view of an embodiment of a deflection member of the present invention, comprising a framework formed by a first layer and a second layer joined together in a face-to-face relationship, each of the first and second layers comprising a continuous network and a plurality of discrete deflection conduits dispersed therethrough.
Figure 2:
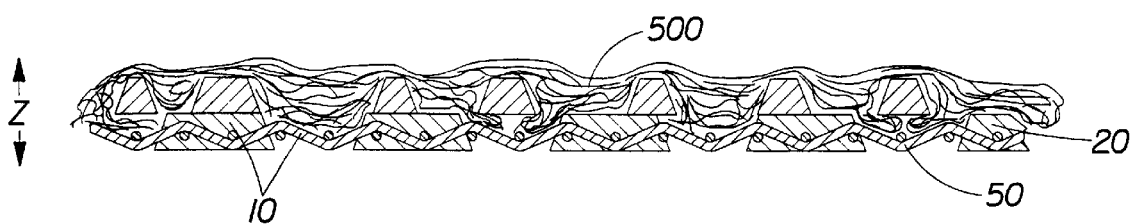
FIG. 2 is a schematic instantaneous cross-sectional view of the deflection member shown in FIG. 1, taken along lines 2—2 of FIG. 1, and also showing a fibrous web of the present invention disposed on the deflection member.

As shown in FIGS. 1–18, a deflection member 10 of the present invention comprises a macroscopically monoplanar, patterned framework 20. The patterned framework 20 may be made from a variety of materials, including but not limited to: resinous material, metal, metal-impregnated resin, plastic, or any combination thereof. However, as used herein, the term "framework" does not include a structure that is formed by mutually perpendicular interwoven filaments, such as, for example, a forming wire or a similarly formed structure. Such a structure, comprising a plurality of mutually perpendicular filaments, may be used as a reinforcing element in the deflection member 10 of the present invention, as will be discussed below, but does not constitute the "framework" of the deflection member 10.

If the framework 20 of the deflection member 10 is made of the resinous material or other material having insufficient inherent strength, or has a pattern that can be distorted when pulled in a machine direction (defined below), a reinforcing element 50 is typically used to enforce the framework 20 of the deflection member 10. The reinforcing element 50 may be necessary when the patterned framework 20 comprises a semi-continuous pattern or a pattern comprising a plurality of discrete protuberances, as will be discussed in greater detail below. The reinforcing element 50 is positioned between the web-side 21 and at least a portion of the backside 22 of the framework 20. While the reinforcing element 50 is generally parallel to the backside 22 of the framework, a portion of the reinforcing element 50 may extend beyond the backside 22 of the framework 20, thereby creating surface irregularities in the backside 22 of the framework 20, as discussed in more detail below. In some embodiments, the reinforcing element 50 may comprise the backside 22 of the framework 20.

The patterned framework 20 can be joined to the reinforcing element 50. The reinforcing element 50 has an upper side 51 and a lower side 52 opposite to the upper side 51. The web-side 21 of the framework 20 and the upper side 51 of the reinforcing element 50 face one direction, and the backside 22 of the framework 20 and the lower side 52 of the reinforcing element 50 face the opposite direction. As defined herein, the backside 22 of the framework forms an X-Y plane. Since the reinforcing element 50 is most typically adjacent to the backside 22 of the framework 20 (FIGS. 2, 4, 6, 8, 10, 12, 14, 16, and 18), it could also be said that in some embodiments the reinforcing element 50, as a whole, defines the X-Y plane. One skilled in the art will appreciate that the symbols "X," "Y," and "Z" designate a system of Cartesian coordinates, wherein mutually perpendicular "X" and "Y" define a reference plane formed by the backside 22 of the framework 20 (or by the reinforcing element 50) when the deflection member 10 is disposed on a flat surface, and "Z" defines an orthogonal to the X-Y plane. As used herein, the term "Z-direction" designates any direction perpendicular to the X-Y plane. Analogously, the term "Z-dimension" means a dimension, distance, or parameter measured parallel to the Z-direction. It should be carefully noted, however, that an element that "extends" in the Z-direction does not need itself to be oriented strictly parallel to the Z-direction; the term "extends in the Z-direction" in this context merely indicates that the element extends in a direction which is not parallel to the X-Y plane. Analogously, an element that "extends in a direction parallel to the X-Y plane" does not need, as a whole, to be parallel to the X-Y plane; such an element can be oriented in the direction that is not parallel to the Z-direction.

Figure 42:
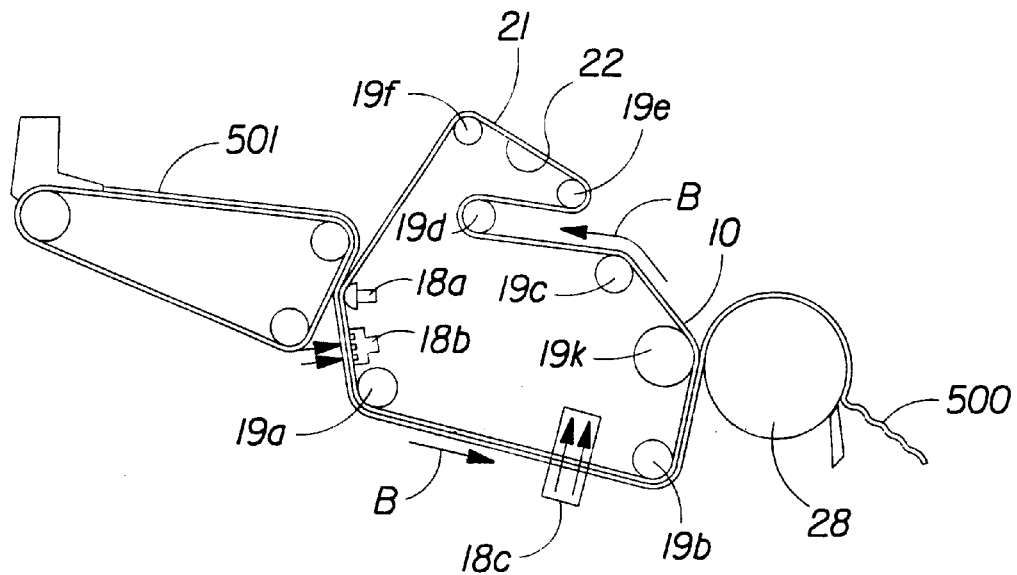
FIG. 42 is a schematic side-elevational view of the process of making a fibrous structure according to one embodiment of the present invention.

One skilled in the art will also appreciate that the reinforcing element 50, as well as the deflection member 10 as a whole, does not need to (and indeed cannot in some embodiments) have a planar configuration throughout its length, especially when used in a typical industrial process for making a fibrous structure 500 of the present invention, as the deflection member 10 in the form of an endless belt travels through the equipment in a direction indicated by a directional arrow "B" (FIG. 42). Also, and the concept of the deflection member 10 being disposed on a flat surface and having the macroscopical "X-Y" plane is conventionally used herein for the purpose of describing relative geometry of several elements of the generally flexible deflection member 10. A person skilled in the art will appreciate that when the deflection member 10 curves or otherwise deplanes, the X-Y plane follows the configuration of the deflection member 10.

As used herein, the terms containing "macroscopical" or "macroscopically" refer to an overall geometry of a structure under consideration when it is placed in a two-dimensional configuration. In contrast, "microscopical" or "microscopically" refer to relatively small details of the structure under consideration, without regard to its overall geometry. For example, in the context of the deflection member 10, the term "macroscopically planar" means that the deflection member 10, when it is placed in a two-dimensional configuration, has as a whole—only minor and tolerable deviations from the absolute planarity, which deviations do not adversely affect the deflection member's performance. At the same time, the patterned framework 20 of the deflection member 10 can have a microscopical three-dimensional pattern of deflection conduits and suspended portions, as will be described below.

The framework 20 comprises a plurality of bases 30 and a plurality of suspended portions 49. The plurality of bases 30 extends in the Z-direction. If the deflection member 10 comprises the reinforcing element 50, the plurality of bases 30 is joined to the reinforcing element 50 and extends therefrom outwardly. The suspended portions 49 laterally extend from the plurality of bases 30. The plurality of suspended portions 49 typically extend in at least one direction parallel to the X-Y plane. Since there is a virtually infinite number of directions parallel to the X-Y plane, orientations of the suspended portions 49 may be chosen based on a desired design of the end product, that can be dictated by a particular method of making the deflection member 10 or a method of making a fibrous structure, or both, as described below.

The plurality of bases 30 form spaces therebetween. The spaces between the bases 30 form so-called "deflection conduits." The deflection conduits can extend in the Z-direction from the web-side 21 toward the backside 22 of the framework 20 and provide spaces into which a plurality of fibers can be deflected during a papermaking process of the present invention, to form so-called fibrous "pillows" 540 of the fibrous structure 500 (FIGS. 27–41). In the fluid-permeable deflection member 10, the conduits extend from the web side 21 to the backside 22 through the entire thickness of the framework 20. The fibrous pillows 540 can have a density that is lower than the density of the rest of the fibrous structure 500, thus facilitating absorbency and softness of the fibrous structure 500, as a whole. The pillows 540 can have a basis weight that is greater than that of the rest of the fibrous structure 500. The pillows 540 also contribute to increasing an overall surface area of the fibrous structure 500, thereby further encouraging the absorbency and softness thereof.

Figure 23:
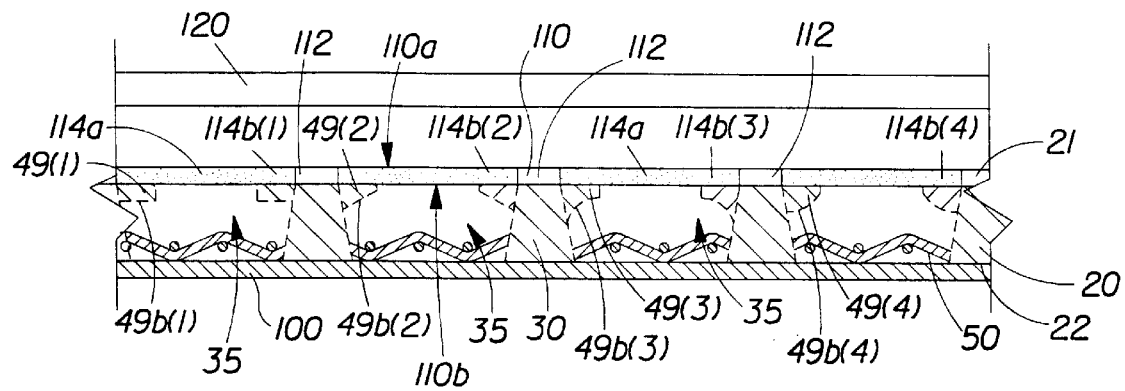
FIG. 23 is a schematic instantaneous cross-sectional view of an embodiment of the process of making the deflection member shown in FIG. 22A and taken along lines 23—23 of FIG. 22A, schematically showing selective curing of a coating of a curable material.
Figure 24:
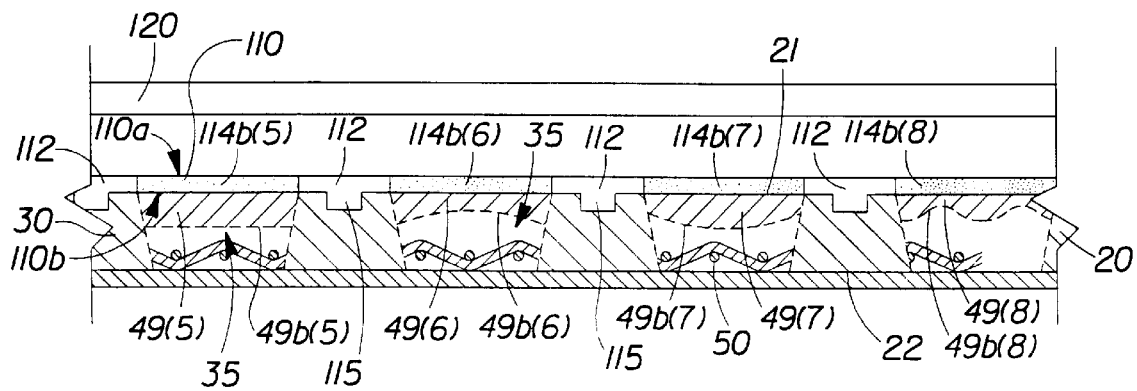
FIG. 24 is a schematic instantaneous cross-sectional view similar to that shown in FIG. 23, and taken along the line 24—24 of FIG. 22B.
Figure 25:
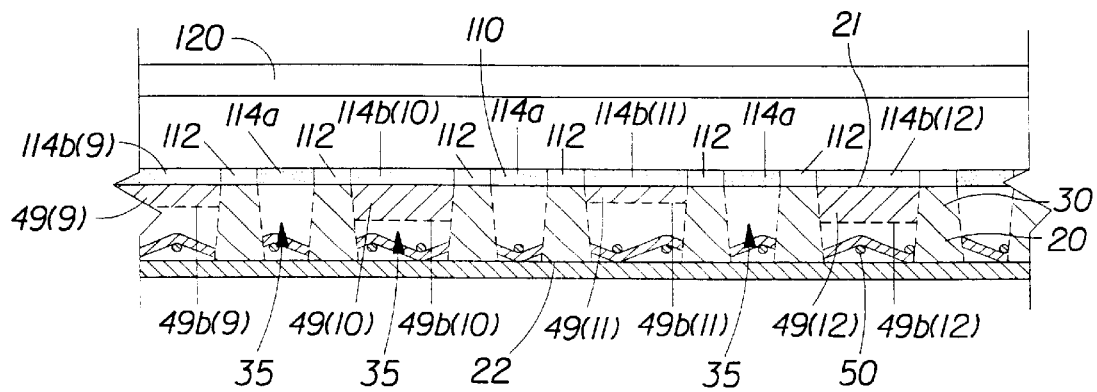
FIG. 25 is a schematic instantaneous cross-sectional view similar to that shown in FIGS. 22 and 24, and taken along the line 25—25 of FIG. 22C.

As used herein, by the requirement that the suspended portions 49 extend from the plurality of bases 30 in at least one direction, it is meant that each of the suspended portions 49, when viewed in the cross-section perpendicular to the X-Y plane, laterally extends in a direction that is not parallel to the Z-direction and that can be substantially parallel to the X-Y plane. As used herein, by the requirement that the suspended portions 49 be elevated from the X-Y plane, it is meant that there is a free space, or gap, in the Z-direction between the suspended portions 49, or at least a part thereof, and the X-Y plane. That is, the suspended portions 49 are "suspended" because they are elevated from the X-Y plane or the reinforcing element 50, and a gap, or void, exists between the suspended portion and the X-Y plane. It should be noted, however, that the suspended portion 49 need not form the gap throughout the entire length of the suspended portion 49. That is, the suspended portion 49 can, at some point of its length, touch the reinforcing element 50, due to, for example, deplaning or deformation of the deflection member 10 or the suspended portion 49, as long as the suspended portion 49 itself is not directly joined to the reinforcing element 50. Also, these gaps between the suspended portions 49 and the X-Y plane can differentiate in their respective shapes and dimensions, including Z-dimensions, i. e., they do not need to be the same for all or some of the suspended portions 49. For example, a distance between one suspended portion 49 and the reinforcing element 50 may be different from a distance between another suspended portion 49 and the reinforcing element 50 (FIG. 25). Also, the distances between the X-Y plane and the different suspended portions may gradually change or be irregular (FIGS. 23–24).

The suspended portions 49 may be either integral with or securely joined to the bases 30. As used herein, the "integral" suspended portions are those suspended portions 49 that have been formed together with formation of the bases 30, in the course of one embodiment of the process of making the deflection member 10 of the present invention, as will be described below in detail (FIGS. 22A–25A). The "joined" suspended portions are those that have been made separately from the bases 30 and then securely joined to the bases 30. An example of the joined suspended portions 49 is also described below, in the context of an embodiment of the deflection member 10 comprising a multi-layer structure, and more specifically an exemplary two-layer deflection member 10, and a process of making the same (FIGS. 1–19). In such an embodiment, one of the joined layers comprising the deflection member 10 forms the plurality of bases 30, while the other layer forms the suspended portions 49. For convenience, the layer comprising the plurality of bases 30 is also designated herein by the reference numeral 30.

When viewed in a cross-section perpendicular to the X-Y plane, the deflection member 10 of the present invention can comprise two types of the suspended portions 49—based on their relation to the bases: "bridging" suspended portions and "cantilever" suspended portions. The both "bridging" and "cantilever" terms are used herein conventionally and intended to be descriptive in that the bridging suspended portion is the suspended portion 49 which spans, or "bridges," a distance between at least two bases, thereby interconnecting the at least two bases. The bridging suspended portions are shown, for example, in FIGS. 9, 10A, 15, 24, 25, and 25A. Most typically, but not necessarily, these two interconnected bases are adjacent bases. Embodiments are contemplated, however, wherein the interconnected bases are not mutually adjacent, but are separated by another base or other bases. (See, for example, FIG. 15, the first from the right "sinusoidal" second-layer element.) Another embodiment wherein the bridging suspended portion interconnects two non-adjacent bases is the framework 20 in which the bases have differential heights so that at least some of the bases having relatively smaller height do not reach the suspended portions (not shown). Such relatively short bases can be positioned intermediate relatively high bases that are interconnected by the bridging suspended portions.

The cantilever suspended portion is the suspended portion 49 which laterally extends from one of the bases 30 but does not reach an adjacent base 30, when viewed in a particular cross-section. The cantilever suspended portions are shown, for example, in FIGS. 12 and 23.

It should be appreciated that in some instances, the same suspended portion 49 may appear as "bridging" as viewed in one cross-section, and "cantilever" as viewed in another cross-section. For example, in a cross-sectional view of FIG. 10, some of the suspended portions 49 (formed by a second semi-continuous layer 40, as will be discussed below in sufficient detail) appear to form "cantilever" portions, while other suspended portions 49 appear to be unsupported at all. At the same time, in the cross-sectional view of FIG. 10A, taken along one of the linear semi-continuous elements of the second layer 40, the suspended portion 49 appears as a "bridging" portion, because it spans, or bridges, at least two adjacent bases (formed by a first layer 30, as will be discussed below).

Figure 10:
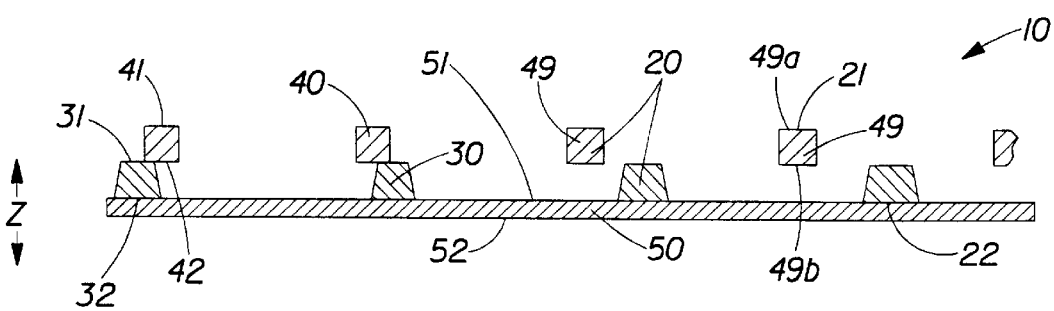
FIG. 10 is a schematic instantaneous cross-sectional view of the deflection member shown in FIG. 9, taken along lines 10—10 of FIG. 9.
Figure 10A:
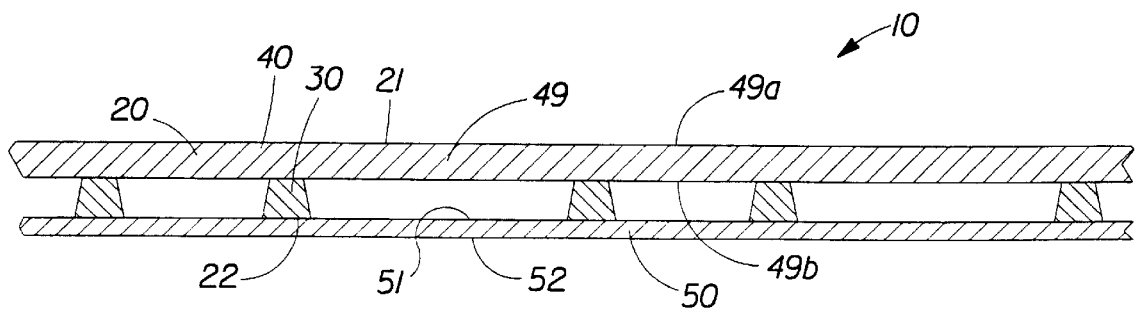
FIG. 10A is a schematic cross-sectional view of the deflection member shown in FIG. 9, taken along lines 10A—10A of FIG. 9.

Each of the suspended portions 49 has a web-oriented surface 49a and a back surface 49b (FIGS. 10 and 10A). As used herein, the term "web-oriented surface" designates that surface of the suspended portion 49 which forms the webside 21 of the framework 20. When the web is disposed on the deflection member 10, the web-oriented surface 49a is adjacent to the web. In the embodiment in which the deflection member 10 comprises the reinforcing element 50, the web-oriented surface 49a faces away from the reinforcing element 50. Typically, but not necessarily, the web-oriented surface 49a is parallel to the X-Y plane. The back surface 49b designates a surface of the suspended portion 49, which is opposite to the web-oriented surface 49a. In the embodiment in which the deflection member 10 comprises the reinforcing element 50, the back surface 49b faces the reinforcing element 50, and specifically, its upper side 51.

FIGS. 2, 4, 6, 8, 10, 10A, 12, 14, 16, 18, 23–25, 25A, 48, and 49 show, in cross-section, various embodiments of the suspended portion 49. With reference to FIGS. 23–25, the reference numeral "49" (without regard to a parenthetical suffix) is used herein to generically designate any suspended portion regardless of its specific embodiment. Analogously, the reference numerals "49a" and "49b" (without regard to a parenthetical suffix) generically designate the web-oriented surface and the back surface, respectively, of the suspended portion 49, regardless of these surfaces' specific embodiments. Each of the parenthetical suffixes "(1)," "(2)," "(3)," etc. designates an exemplary embodiment of the suspended portion 49 and its corresponding web-oriented surface 49a and back surfaces 49b, as will be explained in sufficient detail below.

The back surface 49b may be substantially parallel to the X-Y plane and/or parallel to the web-oriented surface 49a, as best shown in FIGS. 2, 4, 6, 8, 10, 12, 14, 16, 18, and 25. FIGS. 23 and 24 show embodiments in which the back surfaces 49b of some of the suspended portions 49 are not parallel to the web-oriented surfaces 49a and are not parallel to the X-Y plane. In FIG. 23, for example, the suspended portion 49(2), 49(3), and 49(4) has the back surface 49b(2), 49b(3), and 49b(4), respectively, which are "angled" relative to the X-Y plane. Moreover, the back surface 49b does not need to be linear or flat. For example, in FIGS. 23 and 24, the suspended portions 49(1) and 49(5), respectively, have essentially linear or flat back surfaces 49b(1), and 49b(5), respectively, while the suspended portions 49(3) and 49(4) (FIG. 23), and 49(6) and 49(7) (FIG. 24) have curved (concave or convex) back surfaces 49b(3) and 49b(4) (FIG. 23), and 49b(6) and 49b(7) (FIG. 24), respectively.

It should be understood that the foregoing embodiments of the suspended portion 49 and its back surface 49b are mere examples used for the purposes of illustrating the present invention, but not for the purposes of limiting the invention. There could be virtually an unlimited number of possible combinations, variations, and mutual orientations of the suspended portion 49 and its web-oriented and back surfaces 49a and 49b, including circular, curved, and irregular shapes, all of which are contemplated by the present invention. They all could be designed and shaped using the novel process of making the deflection member 10 of the present invention, as described below.

In several exemplary embodiments shown in FIGS. 1–18, the framework 20 of the deflection member 10 comprises a multi-layer composite structure formed by at least a first layer 30 and a second layer 40 joined to the first layer 30 in a face-to-face relationship therewith. By the requirement that the framework 20 comprise "at least" two layers it is meant that the framework 20 according to the present invention may comprise more than two layers—for example, three, four, five, etc. layers (not shown), as one skilled in the art should readily understand. Each of the first and second layers 30, 40, has a top surface and a bottom surface opposite to the top surface. As shown, for example, in FIGS. 4, 6, 8, 10, the first layer 30 has a top surface 31 and a bottom surface 32 opposite to the top surface 31. Analogously, the second layer 40 has a top surface 41 and a bottom surface 42 opposite to the top surface 41. In the formed framework 20, the top surface 31 of the first layer 30 contacts the bottom surface 42 of the second layer 40. A top surface 41 of the second layer 40 comprises the web-side 21 of the framework 20, and the bottom surface 32 of the first layer 30 comprises the backside 22 of the framework 20. One skilled in the art will appreciate that the terms "top" and "bottom" are descriptive only to the extent the deflection member 10 is shown herein in several cross-sectional views. Of course, during a manufacturing process, the deflection member 10 can be positioned such that the "bottom" surface is above the "top" surface.

Each of the first and second layers 30, 40 can have a conduit portion comprising at least one deflection conduit. Thus, the first layer 30 has a first conduit portion comprising at least one first deflection conduit 35, and the second layer 40 has a second conduit portion comprising at least one second deflection conduit 45. As used herein, the term "first deflection conduit" 35 designates a hole, or an empty space, in the first layer 30, which hole or empty space extends in the Z-direction from the top surface 31 toward the bottom surface 32 of the first layer 30 and is structured and configured to receive a plurality of fibers in the course of the process of making the fibrous structure 500 of the present invention. Analogously, the term "second deflection conduit" 45 designates a hole, or an empty space, in the second layer 40, which hole or empty space extends in the Z-direction from the top surface 41 toward the bottom surface 42 of the second layer 40 and is structured and configured to receive a plurality of fibers in the course of the process of making the fibrous structure 500 of the present invention.

In some embodiments, the conduit portion extends from the top surface to the bottom surface through the entire thickness of the layer, thereby causing the layer to be fluid-permeable. The fibers disposed on the deflection member during the manufacturing process can be deflected into the deflection conduits 35, 45 under the influence of a fluid pressure differential, for example, by a vacuum, or otherwise, for example, by a mechanical pressure. The fibers that have been deflected into the deflection conduits form fibrous "pillows," or "domes," of the fibrous structure, as will be explained in sufficient detail below.

The first layer 30 and the second layer 40 are joined together in a face-to-face arrangement such that some portions of the second layer 40 correspond in the Z-direction to the deflection conduits 35 of the first layer 30. These portions of the second layer 40, by virtue of being situated in the Z-direction over the deflection conduits 35 of the first layer 30, are elevated in the Z-direction from the X-Y plane, which is co-planar with the bottom surface 32 of the first layer 30, and thus can form the suspended portions 49 discussed above. As used herein, the term "correspond" and permutations thereof mean the mutual physical relationship between two or among several elements, wherein their respective geometrical projections to the X-Y plane form a common area thereon.

In some embodiments, the reinforcing element 50 is substantially fluid-permeable. The fluid-permeable reinforcing element 50 may comprise a woven screen, or an apertured element, a felt, or any combination thereof. Various types of the fluid-permeable reinforcing element 50 are described in several commonly assigned U.S. Patents, for example, U.S. Pat. Nos. 5,275,700 and 5,954,097, the disclosures of which are incorporated herein by reference. The reinforcing element 50 may comprise a felt, also referred to as a "press felt" as is used in conventional papermaking. The framework 20 may be applied to the reinforcing element 50, as taught by commonly assigned U.S. Pat. No. 5,549,790, issued Aug. 27, 1996 to Phan; U.S. Pat. No. 5,556,509, issued Sep. 17, 1996 to Trokhan et al.; U.S. Pat. No. 5,580,423, issued Dec. 3, 1996 to Ampulski et al.; U.S. Pat. No. 5,609,725, issued Mar. 11, 1997 to Phan; U.S. Pat. No. 5,629,052 issued May 13, 1997 to Trokhan et al.; U.S. Pat. No. 5,637,194, issued Jun. 10, 1997 to Ampulski et al.; U.S.

Pat. No. 5,674,663, issued Oct. 7, 1997 to McFarland et al.; U.S. Pat. No. 5,693,187 issued Dec. 2, 1997 to Ampulski et al.; U.S. Pat. No. 5,709,775 issued Jan. 20, 1998 to Trokhan et al., U.S. Pat. No. 5,795,440 issued Aug. 18, 1998 to Ampulski et al., U.S. Pat. No. 5,814,190 issued Sep. 29, 1998 to Phan; U.S. Pat. No. 5,817,377 issued Oct. 6, 1998 to Trokhan et al.; and U.S. Pat. No. 5,846,379 issued Dec. 8, 1998 to Ampulski et al., the disclosures of which are incorporated herein by reference.

Alternatively, the reinforcing element 50 may be fluid-impermeable. The fluid-impermeable reinforcing element 50 can comprise, for example, a polymeric resinous material, identical to, or different from, the material used for making a framework 20 of the deflection member 10 of the present invention; a plastic material; a metal; any other suitable natural or synthetic material; or any combination thereof. One skilled in the art will appreciate that the fluid-impermeable reinforcing element 50 will cause the deflection member 10, as a whole, to be also fluid-impermeable.

It is to be understood that the reinforcing element 50 may be partially fluid-permeable and partially fluid-impermeable. That is, some portion of the reinforcing element 50 may be fluid-permeable, while another portion of the reinforcing element 50 may be fluid-impermeable. For example, in a multi-layer deflection member 10, wherein the reinforcing element 50 is positioned adjacent to the backside 22 of the framework, the fluid-impermeable portion of the reinforcing element 50 can make the corresponding deflection conduits 35 of the first layer 30 "blind," i. e., those deflection conduits 35 of the first layer that correspond to the fluid-impermeable portion of the reinforcing element 50 may not have fluid-permeability through the first layer 30 (i. e., from the top side 31 to the bottom side 32 of the first layer 30).

If desired, the reinforcing element 50 comprising a Jacquard weave can be utilized. Illustrative belts having the Jacquard weave can be found in U.S. Pat. No. 5,429,686 issued Jul. 4, 1995 to Chiu, et al.; U.S. Pat. No. 5,672,248 issued Sep. 30, 1997 to Wendt, et al.; U.S. Pat. No. 5,746,887 issued May 5, 1998 to Wendt, et al.; and U.S. Pat. No. 6,017,417 issued Jan. 25, 2000 to Wendt, et al., the disclosures of which are incorporated herein by reference for the limited purpose of showing a principal construction of the Jacquard weave that can be used in the reinforcing element 50. It is believed that Yankeeless process described in the above-mentioned patents may benefit from using the deflection member 10 of the present invention.

Figure 53:
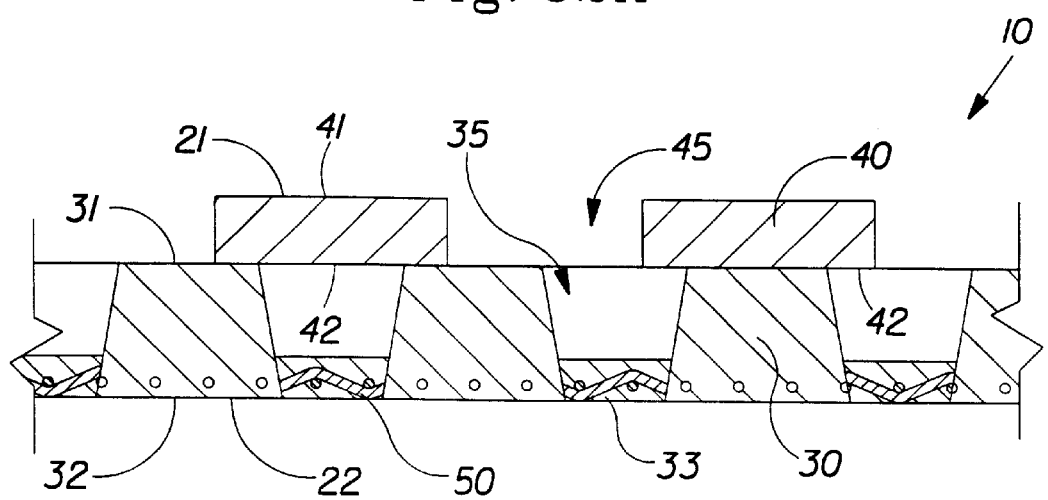
FIG. 53 is a schematic instantaneous side-elevational view of an embodiment of the deflection member of the present invention, having fluid-impermeable deflection conduits.

In accordance with the present invention, one, several, or all of the deflection conduits 35 of the first layer 30 may be "blind," or "closed," as shown in FIG. 53 and described in commonly assigned U.S. Pat. No. 5,972,813, issued to Polat et al. on Oct. 26, 1999, the disclosure of which is incorporated herein by reference. In the embodiment of the deflection member shown in FIG. 53, the deflection conduits 35 of the first layer 30 are "closed" by a material 33, such that the conduits 35 are impermeable to fluids, including air and water. As the patent cited immediately above describes, polyurethane foams, rubber, and silicone can be used to render the deflection conduits 35 fluid-impermeable.

Figure 3:
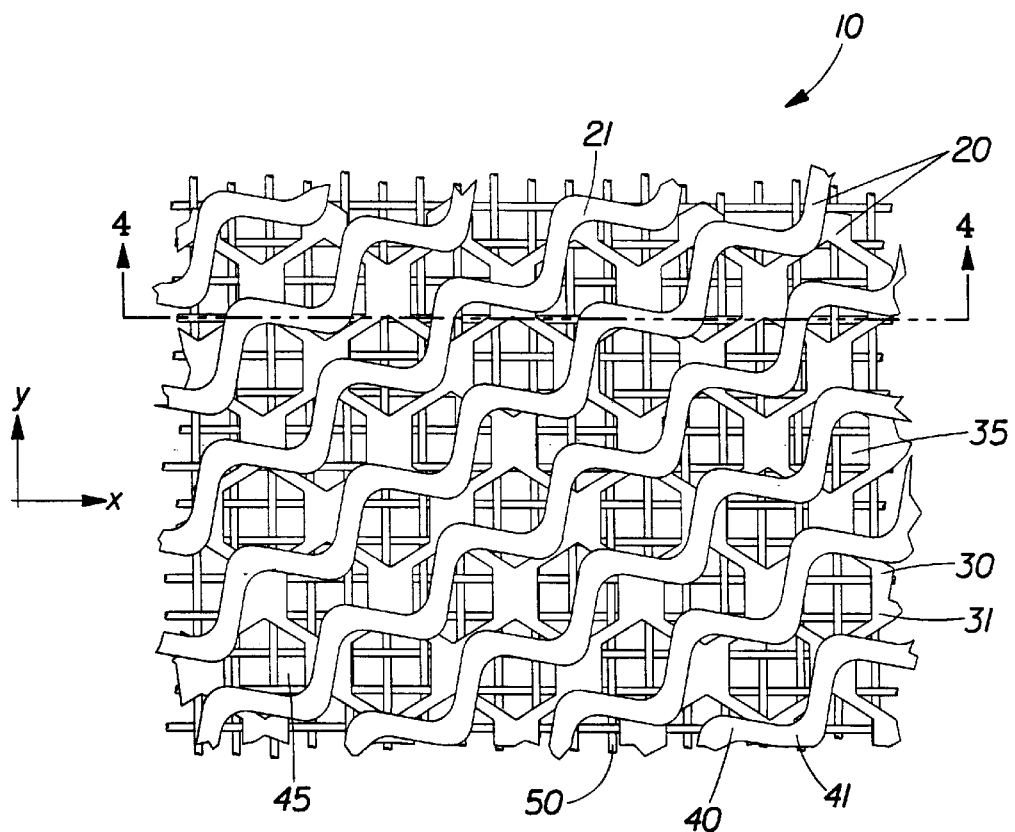
FIG. 3 is a schematic plan view of another embodiment of the deflection member of the present invention, comprising a framework formed by a first layer and a second layer joined together in a face-to-face relationship, wherein the first layer comprises a continuous network and a second layer comprises a semi-continuous network.
Figure 4:
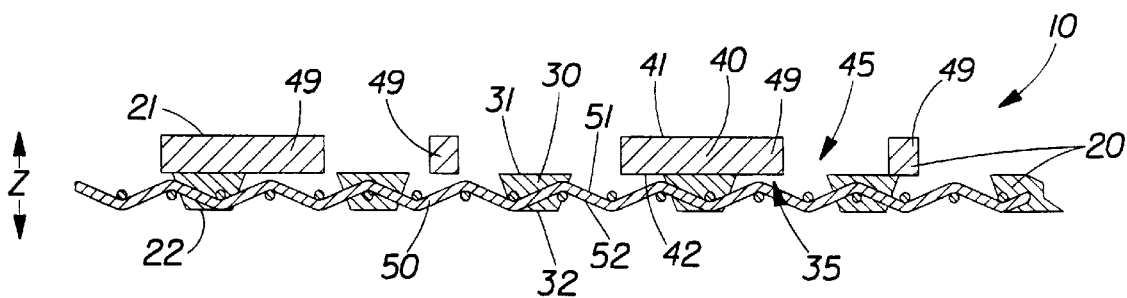
FIG. 4 is a schematic instantaneous cross-sectional view of the deflection member shown in FIG. 3, taken along lines 4—4 of FIG. 3.
Figure 5:
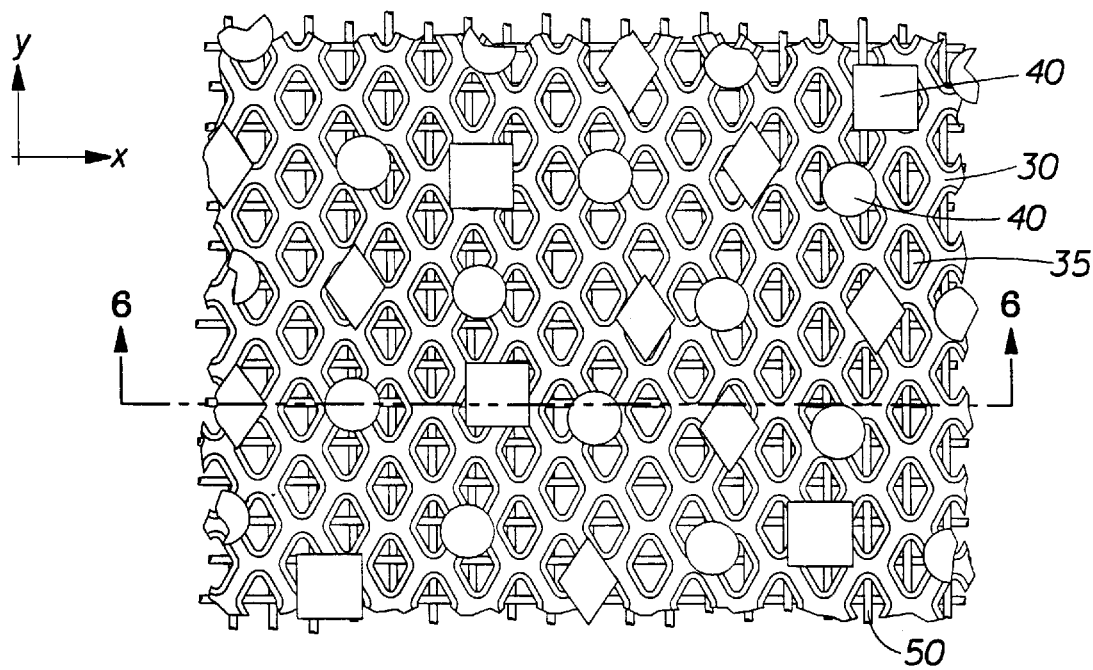
FIG. 5 is a schematic plan view of an embodiment of the deflection member of the present invention, comprising a framework formed by a first layer and a second layer joined together in a face-to-face relationship, wherein the first layer comprises a continuous network and a second layer comprises a plurality of discrete protuberances.
Figure 6:
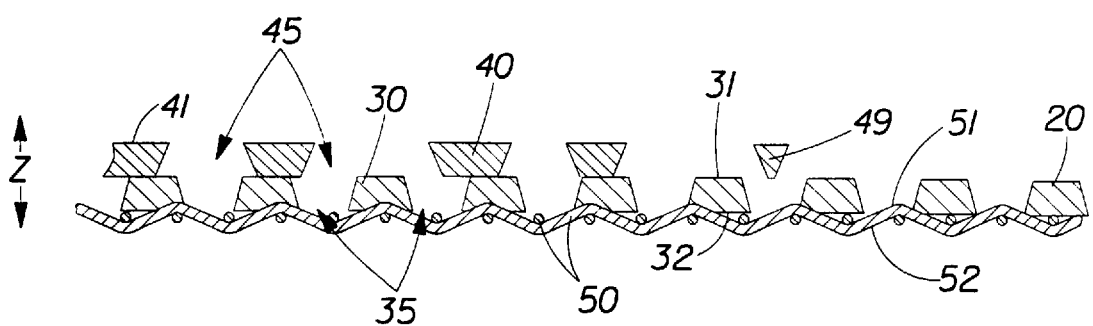
FIG. 6 is a schematic instantaneous cross-sectional view of the deflection member shown in FIG. 5, taken along lines 6—6 of FIG. 5.

Each of the first layer 30 and the second layer 40 may comprise a continuous framework, a semi-continuous framework, a plurality of discrete protuberances, or any combination thereof. As used herein, the term "substantially continuous framework" refers to a layer of the framework 20, in which layer one can connect any two points on or within that layer by an uninterrupted line running entirely on or within that layer throughout the line's length. That is, the continuous framework 20 has a substantial "continuity" in all directions parallel to the X-Y plane and is terminated only at edges of the deflection member 10. The continuous framework 20 is best shown in FIG. 1 in which each of the first layer 30 and the second layer 40 comprises a continuous framework; FIGS. 3 and 5 in which only the first layer 30 comprises a continuous framework; and FIGS. 7 and 13 in which only the second layer 40 comprises a continuous framework. The term "substantially" (in conjunction with continuous) means that while an absolute continuity of the framework 20 is preferred (and intended while designing and making the deflection member 10), minor deviations from the absolute continuity may be tolerable as long as those deviations do not appreciably affect the performance of the deflection member 10 as designed and intended. In a layer comprising a substantially continuous framework, the conduit portion typically comprises a plurality of discrete deflection conduits dispersed throughout and encompassed by the framework.

Figure 7:
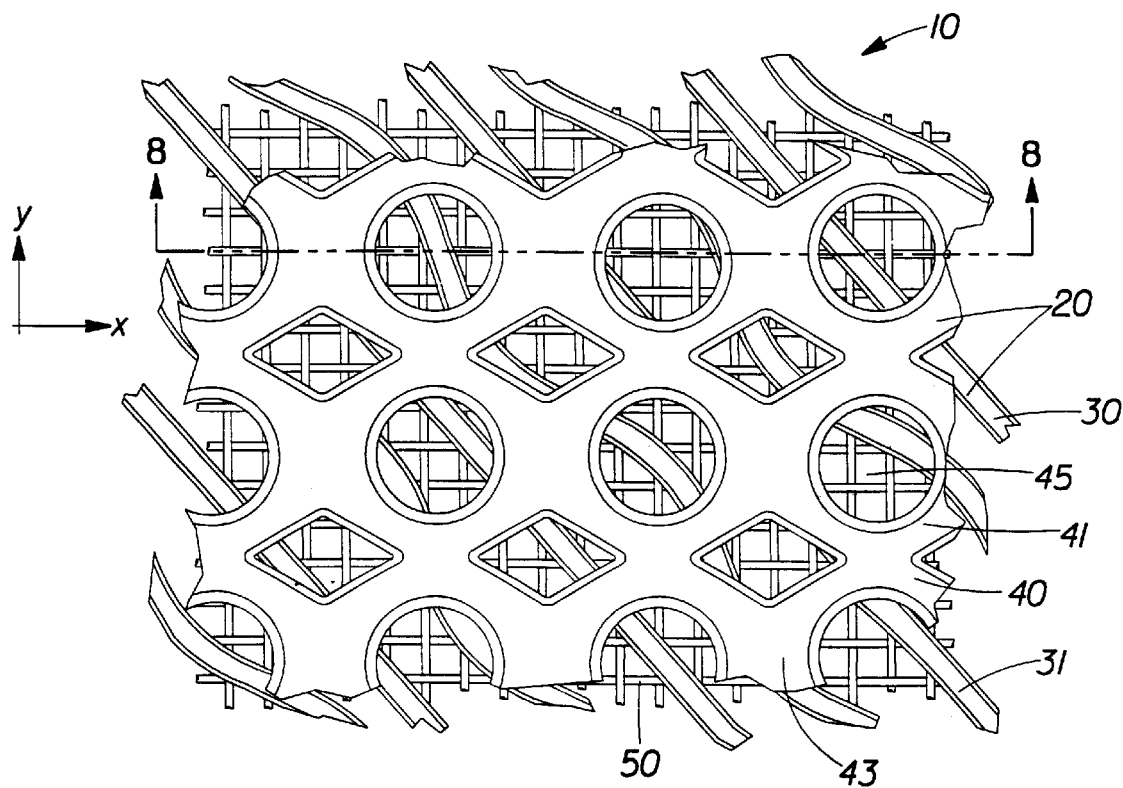
FIG. 7 is a schematic plan view of an embodiment of the deflection member of the present invention, comprising a framework formed by a first layer and a second layer joined together in a face-to-face relationship, wherein the first layer comprises a semi-continuous network and a second layer comprises a continuous network.
Figure 8:
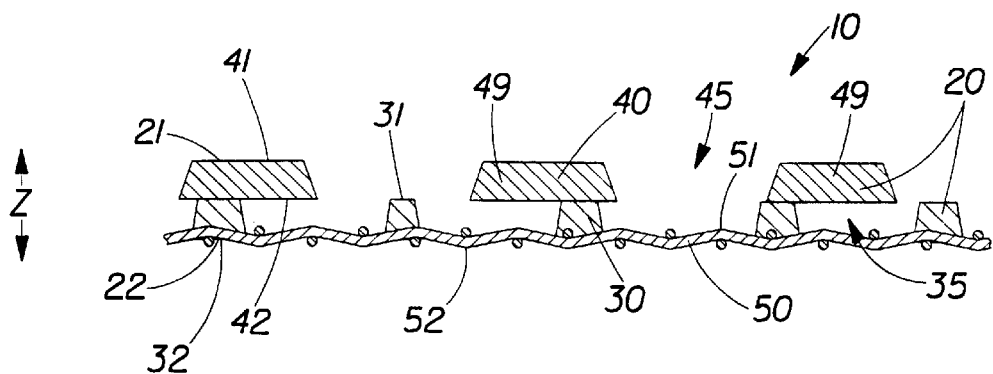
FIG. 8 is a schematic instantaneous cross-sectional view of the deflection member shown in FIG. 7, taken along lines 8—8 of FIG. 7.
Figure 9:
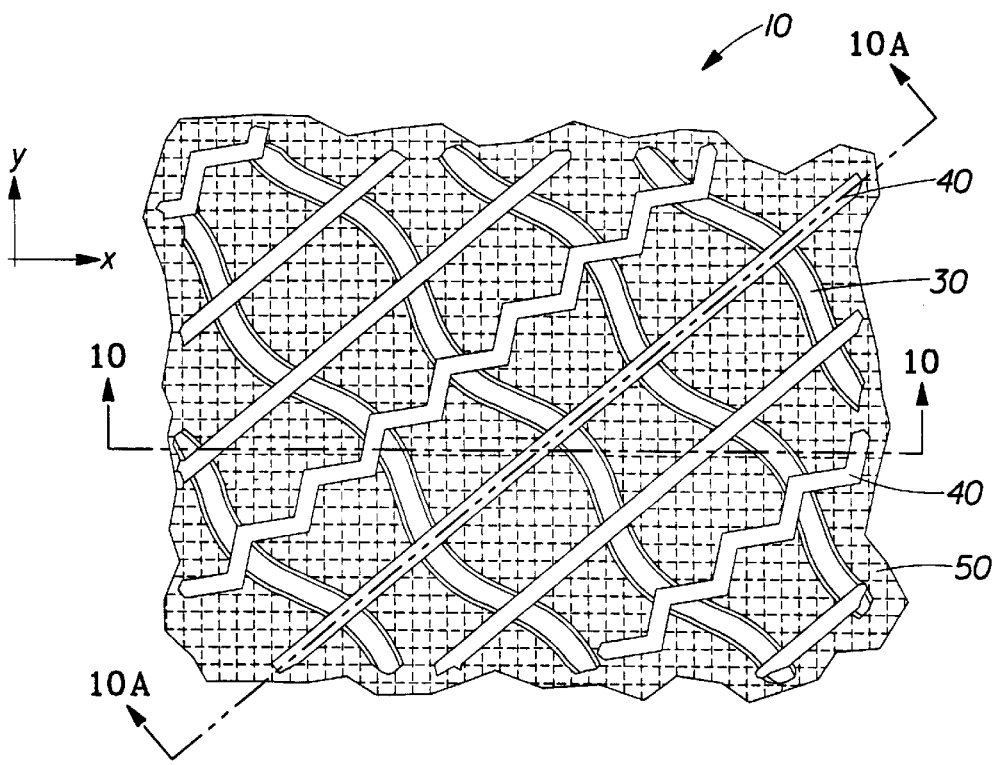
FIG. 9 is a schematic plan view of an embodiment of the deflection member of the present invention, comprising a framework formed by a first layer and a second layer joined together in a face-to-face relationship, wherein each of the first and second layers comprises a semi-continuous network.
Figure 11:
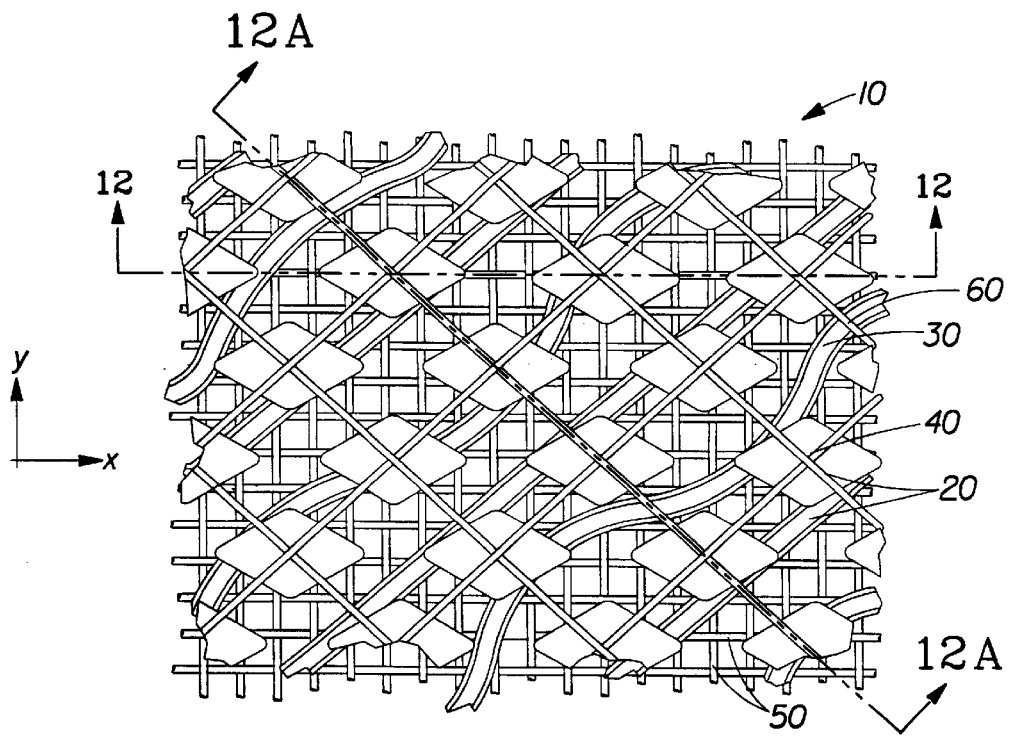
FIG. 11 is a schematic plan view of an embodiment of the deflection member of the present invention, comprising a framework formed by a first layer and a second layer joined together in a face-to-face relationship, wherein the first layer comprises a semi-continuous network and a second layer comprises a plurality of discrete protuberances.

The term "substantially semi-continuous framework" refers to a layer of the framework 20, which has "continuity" in all, but at least one, directions parallel to the X-Y plane, and in which layer one cannot connect any two points on or within that layer by an uninterrupted line running entirely on or within that layer throughout the line's length. Of course, the semi-continuous framework may have continuity only in one direction parallel to the X-Y plane. The semi-continuous framework 20 is best shown in FIG. 9 in which each of the first layer 30 and the second layer 40 comprises a semi-continuous framework; FIGS. 7 and 11 in which only the first layer 30 comprises a semi-continuous framework; and FIGS. 3 and 15 in which only the second layer 40 comprises a semi-continuous framework. By analogy with the continuous pattern described above, while an absolute continuity in all, but at least one, directions is preferred, minor deviations from such a continuity may be tolerable as long as those deviations do not appreciably affect the performance of the deflection member 10. In the layer comprising a semi-continuous framework, the conduit portion typically comprises semi-continuous deflection conduits, i. e., the deflection conduits that can have continuity in all but at least one directions parallel to the X-Y plane. Of course, the semi-continuous deflection conduit may have continuity in only one direction parallel to the X-Y plane.

Figure 13:
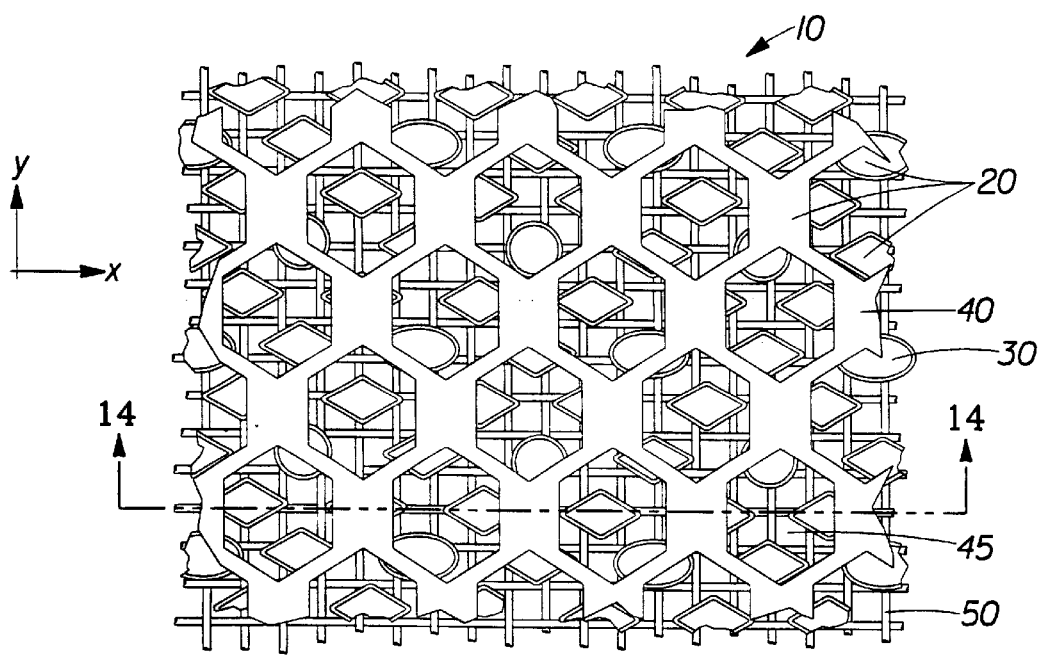
FIG. 13 is a schematic plan view of an embodiment of the deflection member of the present invention, comprising a framework formed by a first layer and a second layer joined together in a face-to-face relationship, wherein the first layer comprises a plurality of discrete protuberances and a second layer comprises a continuous network.
Figure 14:
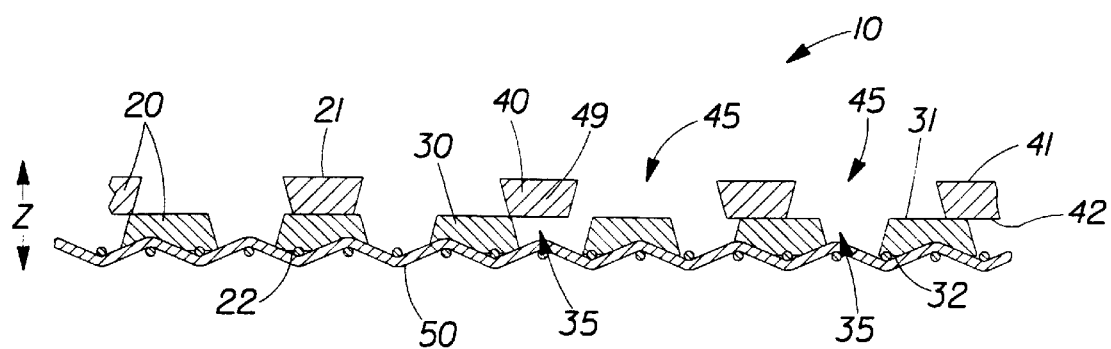
FIG. 14 is a schematic instantaneous cross-sectional view of the deflection member shown in FIG. 13, taken along lines 14—14 of FIG. 13.
Figure 15:
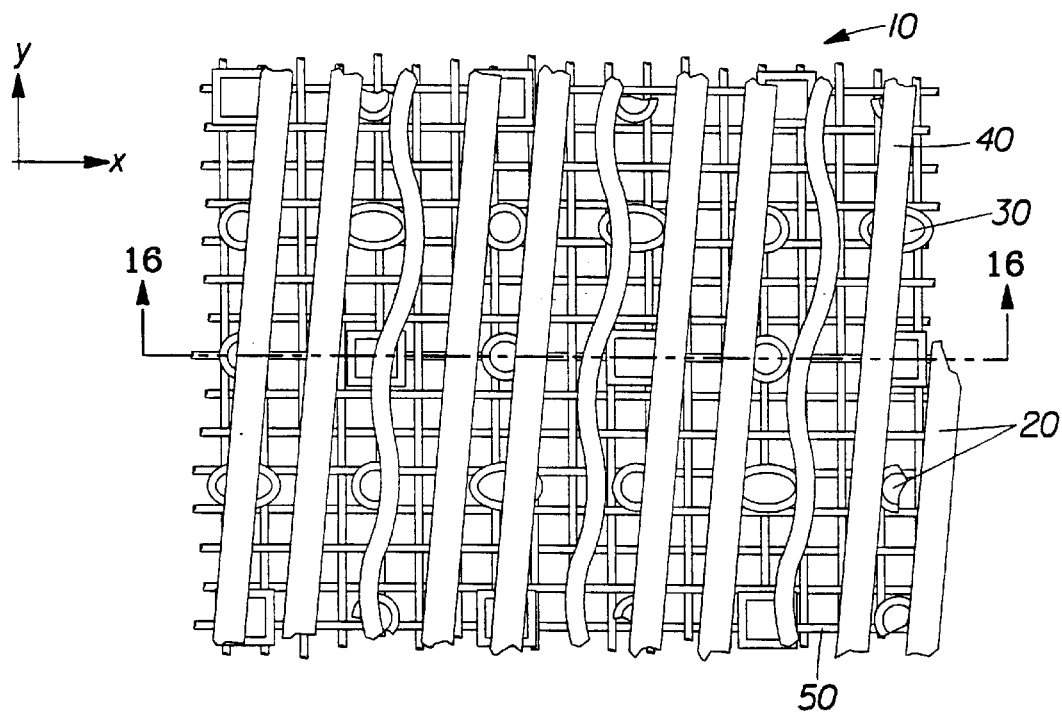
FIG. 15 is a schematic plan view of an embodiment of the deflection member of the present invention, comprising a framework formed by a first layer and a second layer joined together in a face-to-face relationship, wherein the first layer comprises a plurality of discrete protuberances and a second layer comprises a semi-continuous network.
Figure 16:
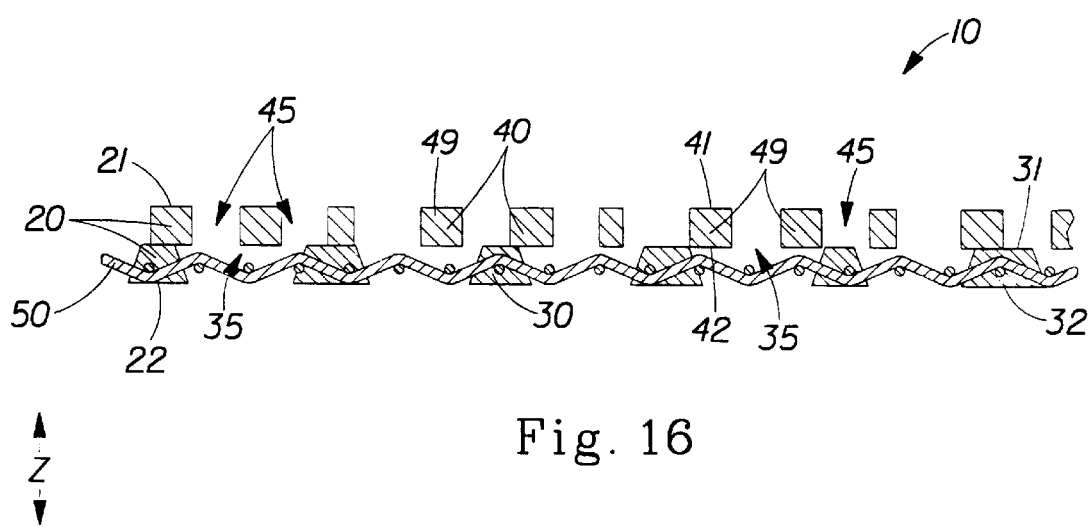
FIG. 16 is a schematic instantaneous cross-sectional view of the deflection member shown in FIG. 15, taken along lines 16—16 of FIG. 15.
Figure 17:
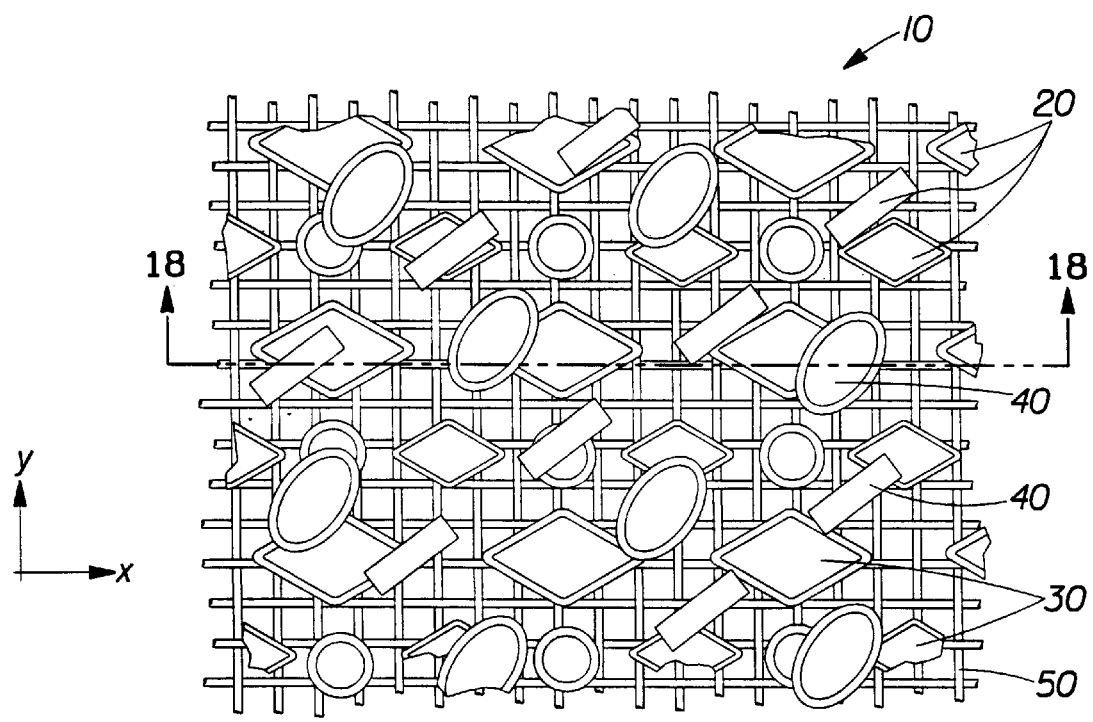
FIG. 17 is a schematic plan view of an embodiment of the deflection member of the present invention, comprising a framework formed by a first layer and a second layer joined together in a face-to-face relationship, wherein each of the first and second layers comprises a plurality of discrete protuberances.
Figure 18:
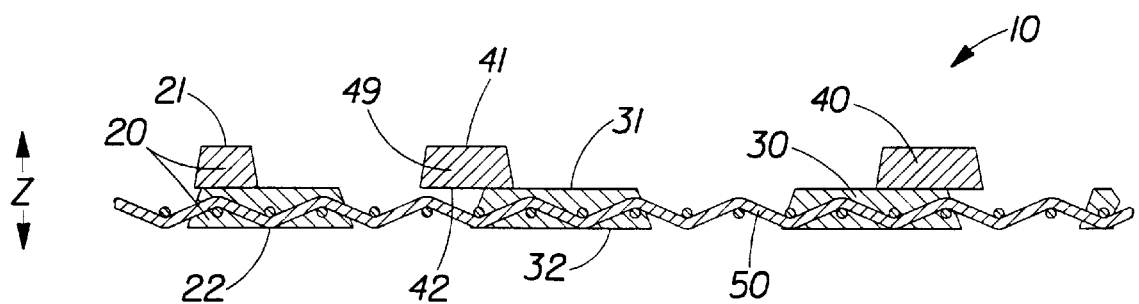
FIG. 18 is a schematic instantaneous cross-sectional view of the deflection member shown in FIG. 17, taken along lines 18—18 of FIG. 17.

The term "plurality of discrete protuberances" refers to a layer of the framework 20 comprising discrete, and separated from one another, protuberances that are discontinuous in all directions parallel to the X-Y plane. The framework 20 comprising plurality of protuberances is best shown in FIG. 17 in which each of the first layer 30 and the second layer 40 comprises a plurality of protuberances; FIGS. 13 and 15 in which only the first layer 30 comprises a plurality of protuberances; and FIGS. 5 and 11 in which only the second layer 40 comprises a plurality of protuberances. If the individual layer is formed by a plurality of discrete protuberances, the conduit portion of such a layer can be viewed as one continuous deflection conduit encompassing the discrete protuberances. As used herein, either one of the terms "conduit portion" and "at least one deflection conduit" generically describes all kinds of the deflection conduits: discrete deflection conduits, continuous deflection conduits, and semi-continuous deflection conduits, unless otherwise indicated.

In the context of a surface, as opposed to the entire framework, the term "substantially continuous" surface refers to a surface of the framework 20 (whether it is a surface of the web-side 21 or of the backside 22) wherein one can connect any two points lying upon that surface by an uninterrupted line running entirely upon that surface throughout the line's length; and the term "substantially semi-continuous" surface refers to a surface of the framework 20, which has "substantial continuity" in all, but at least one, directions parallel to the X-Y plane, and on which surface one cannot connect any two points lying upon that surface by an uninterrupted line running entirely upon that surface throughout the line's length.

It is to be understood that the present invention contemplates the deflection member wherein at least one of the layers 30, 40 comprises any combination of the continuous pattern, the semi-continuous pattern, and the pattern comprising a plurality of discrete protuberances. For example, the first layer 30 may comprise a combination (not shown) of the semi-continuous pattern and the plurality of discrete protuberances, or a combination (not shown) of the continuous pattern and the plurality of discrete protuberances disposed, for example, within the discrete deflection conduits of the continuous pattern. Geometry of the framework 20 and the deflection conduits need not be similar or repeating within any given layer.

According to the present invention, each of the layers of the multi-layer structure of the deflection member 10 can have a specific resulting open area R. As used herein, the term "specific resulting open area" (R) means a ratio of a cumulative projected open area ($\Sigma R$) of all deflection conduits of a given unit of the layer's surface area (A) to that given surface area (A) of this unit, i. e., R=$\Sigma R$/A, wherein the projected open area of each individual conduit is formed by a smallest projected open area of such a conduit as measured in a plane parallel to the X-Y plane. The specific open area can be expressed as a fraction or as a percentage. For example, if a hypothetical layer has two thousand individual deflection conduits dispersed throughout a unit surface area (A) of thirty thousand square millimeters, and each deflection conduit has the projected open area of five square millimeters, the cumulative projected open area ($\Sigma R$) of all two thousand deflection conduits is ten thousand square millimeters, (5 sq. mm×2.000=10,000 sq. mm), and the specific resulting open area of such a hypothetical layer is R=$\frac{1}{3}$, or 33.33% (ten thousand square millimeters divided by thirty thousand square millimeters). In a dual-layer deflection member 10, exemplified herein, the first layer 30 can have a first specific resulting open area R1, and the second layer 40 can have a second specific resulting open area R2.

The cumulative projected open area of each individual conduit is measured based on its smallest projected open area parallel to the X-Y plane, because some deflection conduits may be non-uniform throughout their length, or thickness of the layer—i. e., from the top surface 31 or 41 to the bottom surface 32 or 42, respectively, of the layer 30 or 40, respectively. For example, some deflection conduits 35, 45 may be tapered, i. e., have the top-surface apertures that are larger or smaller that the bottom-surface apertures (see, for example, FIG. 2), as described in commonly assigned U.S. Pat. No. 5,900,122 and U.S. Pat. No. 5,948,210, the disclosures of which are incorporated herein by reference. In other embodiments, the smallest open area of the individual conduit (35, 45) may be located intermediate the top surface (31, 41) and the bottom surface (32, 42) of the layer (30, 40, respectively).

In each individual layer 30, 40, the specific resulting open area of the individual layer can be at least $\frac{1}{5}$ (or 20%), more specifically, at least $\frac{2}{5}$ (or 40%), and still more specifically, at least $\frac{3}{5}$ (or 60%). According to the present invention, the first specific resulting open area R1 may be greater than, substantially equal to, or less than the second resulting open area R2.

Figure 48:
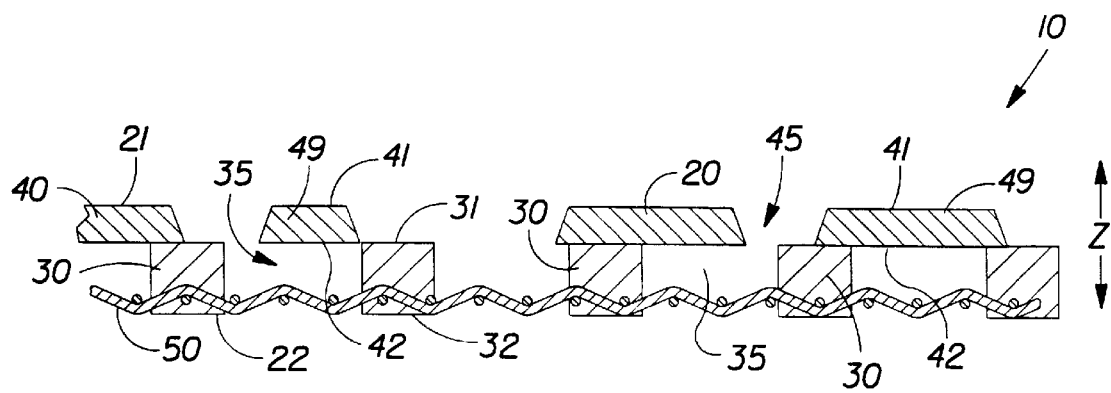
FIGS. 48 and 49 schematically show, in instantaneous cross-sectional view, another embodiment of the multi-layer deflection member of the present invention, comprising a first layer and a second layer, the first layer having a deformability greater than the deformability of the first layer.
Figure 49:
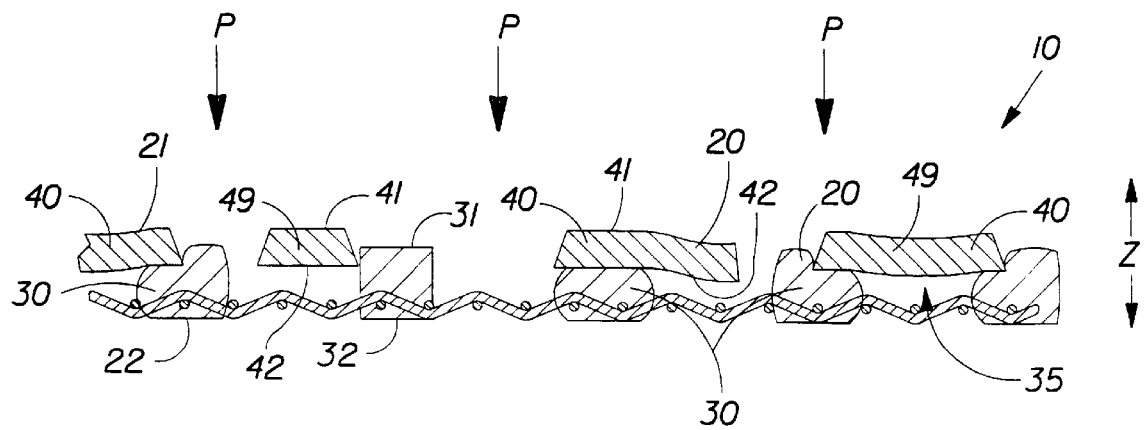

In some embodiments of the present invention, the first layer 30 may have a first deformability D1 different from a second deformability D2 of the second layer 40. As used herein, the "deformability" means an ability of the layer to change its shape while sufficiently retaining its volume under application of an external force, or pressure, typically when the deflection member 10 is pressed against a pressing surface, such as, for example, a Yankee drying drum. FIGS. 48 and 49 illustrate an embodiment of the deflection member 10, in which the first layer 30 has a first deformability D1 greater than a second deformability D2 of the second layer 40. In FIG. 48, the deflection member 10 is shown free of pressure. In FIG. 49, the deflection member 10 is shown under application of a compressive force directed substantially parallel to the Z-direction, i. e., substantially perpendicular to the general plane of the deflection member 10. Under the pressure, portions of the first layer 30 having a relatively greater deformability reduce their thickness while expanding laterally (i. e., in directions parallel to the X-Y plane). At the same time, the second layer 40 having a relatively lower deformability does not substantially change its thickness (or changes to a lesser degree relative to the first layer). Some portions of the second layer 40 directly juxtaposed with the first layer 30 can be deflected into the first layer 30 under the Z-directional compressive force. Some of the suspended portions 49 of the second layer 40 can be deflected into the deflection conduits 35 of the first layer 30, thereby further selectively densifying portions of the fibrous structure 500 disposed therein. (For clarity, the fibrous structure is not shown in FIGS. 48 and 49.)

It is contemplated that at least one of the layers may comprise a resilient material. Moreover, one of the layers may have resiliency, or elasticity, different from that of the other layer or layers. As used herein, the terms "resiliency" or "elasticity" mean capability of the deformed (strained or compressed) layer to substantially recover, on its own accord, its size and shape after a deforming force is removed. More specifically, a resiliently-deformable layer is capable to substantially recover its original, unrestrained thickness almost immediately after the deforming force has been removed. Most specifically, in the instance of a continuous process of making the fibrous structure 500 of the present invention, such a recovery should occur prior to the next application of the deforming force during repeating cycles of the continuous process. The examples of the resilient material include, without limitation: silicon rubbers, urethane rubbers, styrene-butadiene rubbers, natural rubbers, synthetic rubbers, and any combination thereof.

It is also contemplated that at least one of the layers 30, 40 may comprise a compressible material. As used herein, "compressibility" means an ability of a material to reduce its volume under application of an external force. For example, the compressible layer can reduce its thickness under application of a pressing force, without significantly expanding in lateral directions. The compressible material which is also resilient can be compressed (such as by a Z-directional compressive force) from its free, unrestrained thickness to its reduced thickness. Upon release of the force maintaining the material in a compressed configuration, the material can expand back to have a thickness which is substantially equal to, or at least about 95% of, its free, unrestrained thickness. In the context of a continuous papermaking process, wherein the deflection member 10 of the present invention is used, such a recovery of the unrestrained thickness should occur prior to the next application of the compressive force. The examples of the compressible material include, without limitation, open and closed cell foams of any suitable construction, some of which can be combined with suitable resins.

Process For Making Deflection Member

A process for making the deflection member 10, according to one embodiment of the present invention, generally comprises forming at least two layers 30, 40, each having its own individual structure, and then joining the two layers 30, 40 together in a mutual face-to-face relationship such that portions of one layer correspond in Z-direction to the deflection conduits of the other layer, thereby forming suspended portions 49. Each of the layers 30, 40 can have its own pattern of the deflection conduit portion. This embodiment of the process of making the deflection member 10 of the present invention will be described more specifically with reference to FIGS. 19–21.

Figure 19:
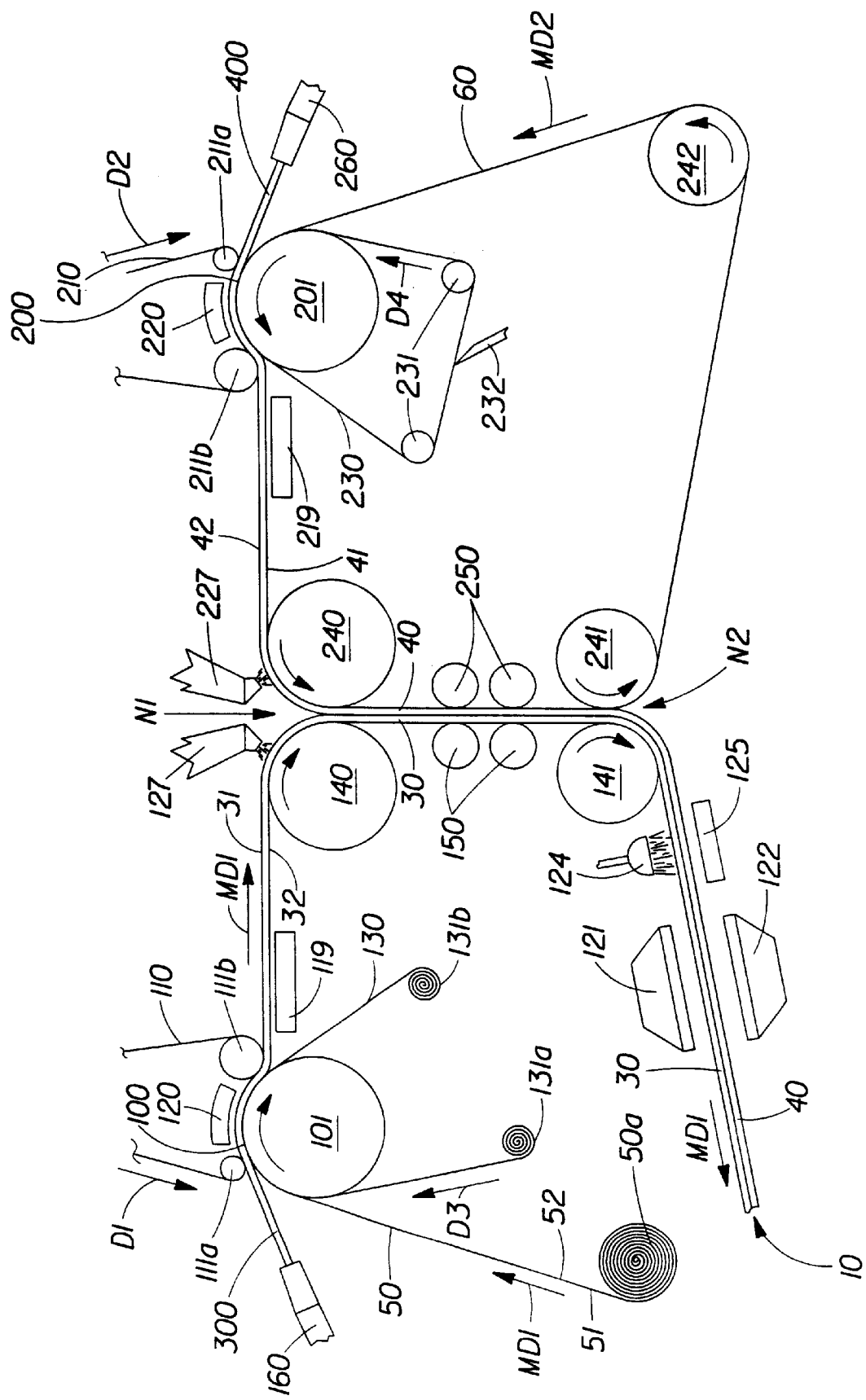
FIG. 19 is a schematic side-elevational view of an embodiment of a process for making the deflection member according to the present invention.

In FIG. 19, the first layer 30 of the framework 20 is formed using a first forming surface 100, and the second layer 40 is formed using a second forming surface 200. As used herein, the term "forming surface" means a surface of a forming unit structured and configured to support a coating of a suitable curable material, such as, for example, a liquid photosensitive resin. The curable material can be deposited directly to the forming surface, or it can be deposited to a backing film provided to cover the forming surface to avoid contamination thereof by the liquid curable material. In the embodiment shown in FIG. 19, a first curable material 300, comprising, for example, a liquid photosensitive resin, is deposited to the first forming surface 100 covered by a first backing film 130; and a second curable material 400 is deposited to the second forming surface 200 covered by a second backing film 230. The forming surfaces 100, 200 are formed by first and second forming units comprising a first drum 101 and a second drum 201, respectively. In the embodiment of the continuous process shown in FIG. 19, the drums 101 and 201 rotate towards each other, wherein the first drum 101 rotates in a clock-wise direction. It is to be understood, however, that at least one of the forming surfaces 100, 200 may comprise a non-circular or non-curved element, i. e., one or both the forming surfaces 100, 200 may be flat or planar, or have other suitable configurations, as needed.

If desired, the forming surface may comprise a deformable surface, as described in the commonly assigned U.S. Pat. No. 5,275,700, the disclosure of which is incorporated herein by reference. When the reinforcing element 50 is pressed into the deformable forming surface during the process of making, for example, the first layer 30, the deformable forming surface forms protrusions that exclude the curable material from certain areas which, when cured, will lie along the backside 22 of the framework 20. This causes the deflection member 10 to form a so-called "textured" backside 22 having passageways providing texture irregularities therein. Those texture irregularities are beneficial in some embodiments of the deflection member 10, because they prevent formation of a vacuum seal between the backside of the deflection member 10 and a surface of the papermaking equipment (such as, for example, a surface of a vacuum box or a surface of a pick-up shoe), thereby creating a "leakage" therebetween and thus mitigating undesirable consequences of an application of a vacuum pressure in a through-air-drying process of making a fibrous structure 500 of the present invention. Other methods of creating such a leakage are disclosed in commonly assigned U.S. Pat. Nos. 5,718,806; 5,741,402; 5,744,007; 5,776,311; and 5,885,421, the disclosures of which are incorporated herein by reference.

The leakage can also be created using so-called "differential light transmission techniques" as described in commonly assigned U.S. Pat. Nos. 5,624,790; 5,554,467; 5,529,664; 5,514,523; and 5,334,289, the disclosures of which are incorporated herein by reference. The deflection member is made by applying a coating of photosensitive resin to a reinforcing element that has opaque portions, and then exposing the coating to light of an activating wavelength through a mask having transparent and opaque regions, and also through the reinforcing element.

Another way of creating backside surface irregularities comprises the use of a textured forming surface, or a textured barrier film, as described in commonly assigned U.S. Pat. Nos. 5,364,504; 5,260,171; and 5,098,522, the disclosures of which are incorporated herein by reference. The deflection member is made by casting a photosensitive resin over and through the reinforcing element while the reinforcing element travels over a textured surface, and then exposing the coating to light of an activating wavelength through a mask which has transparent and opaque regions.

As shown in FIG. 19, the first and second backing films 130, 230 are provided to protect the first and second forming surfaces 100, 200, respectively, and to facilitate removal of the partially completed layers 30, 40 from the forming surfaces 100, 200, respectively. In a continuous process of FIG. 19, the backing films 130, 230 are traveling in a direction indicated by directional arrows D3, D4, respectively. As an example, in the embodiment of FIG. 19, the first backing film 130 is shown as a single-use film, which is supplied by a supply roll 131a, wound into a take-up roll 131b, and is typically discarded after the use; and the second backing film 230 is shown as comprising an endless belt traveling about return rolls 231 and being cleaned at a cleaning station 232 and reused.

For the reader's convenience, the process of constructing the individual layers 30, 40 will be discussed herein in the context of making the first layer 30. It should be understood that in the embodiment of FIG. 19, the process of constructing the second layer 40 is similar to that of the first layer 30, with some possible differences that will be specifically addressed below.

In the embodiment shown in FIG. 19, the process of forming the first layer 30 comprises the following steps. If the deflection member 10 is to have the reinforcing element, then the first reinforcing element 50 is provided. As explained above, the first reinforcing element 50 has the upper side 51 and the lower side 52. The first reinforcing element 50 is supported by the first forming surface 100 such that the lower side 52 of the first reinforcing element 50 faces the fist forming surface 100 and can be in contact therewith or with the first backing film 130 if such backing film is used, as explained above. Typically, but not necessarily, the first reinforcing element 50 is placed in a direct contact with the first backing film 130. In the continuous process illustrated in FIG. 19, the first reinforcing element 50 is supplied from a supply roll 50a. It is also contemplated in the present invention that the first reinforcing element 50 may be supplied in the form of an endless belt, as described, for example, in commonly assigned U.S. Pat. No. 4,514,345, the disclosure of which is incorporated herein by reference. In FIG. 19, the first reinforcing element 50 is traveling in a first machine direction MD1.

The use herein of the term "machine direction" is consistent with the traditional use of the term in papermaking, where this term refers to a direction which is parallel to the flow of the paper web through the papermaking equipment. In the context of the continuous process of making the deflection member 10, the "machine direction" is a direction parallel to the flow of the coating of the curable material (or the reinforcing element where applicable) during the process of the present invention. It should be understood that the machine direction is a relative term defined in relation to the movement of the coating at a particular point of the process. Therefore, the machine direction may (and typically does) change several times during a given process of the present invention. The terms "first machine direction" MD1 and "second machine direction" MD2 refer to the first and second layers 30, 40 being made, respectively, as one skilled in the art will readily understand. A term "cross-machine direction" is a direction perpendicular to the machine direction and parallel to the general plane of the deflection member 10 being constructed, or the X-Y plane.

A coating of the first curable material 300, such as, for example, a liquid photosensitive resinous material, is applied to the first reinforcing element 50, and specifically, to its upper side 51. Any technique by which the liquid curable material can be applied to the reinforcing element 50 is suitable. For example, a nozzle 160, schematically shown in FIG. 19, can be used. Typically, the first curable material 300 should be evenly applied throughout a width of the first reinforcing element 50 or a portion thereof. The width of the reinforcing element 50 and a width of the forming surface 100 extend in the cross-machine direction. If the first reinforcing element 50 has voids designed and structured to be penetrated by the first curable material 300, such as, for example, the reinforcing element comprising a plurality of interwoven yarns (shown in FIGS. 1–9 and 11–18), the curable material should be applied such that a sufficient amount of the curable material can be worked through the first reinforcing element 50 to achieve a secure joining therebetween.

Suitable curable materials that can be used for making either one or both of the first and second layers 30, 40 can be readily selected from the many those commercially available. For example, the curable material may comprise liquid photosensitive resins, such.as polymers that can be cured or cross-linked under the influence of a suitable radiation, typically an ultraviolet (UV) light. References containing more information about liquid photosensitive resins include Green et al., "Photocross-linkable Resin Systems," J. Macro-Sci. Revs. Macro Chem., C21 (2), 187–273 (1981–82); Bayer, "A Review of Ultraviolet Curing Technology," Tappi Paper Synthetics Conf. Proc., Sep. 25–27, 1978, pp. 167–172; and Schmidle, "Ultraviolet Curable Flexible Coatings," J. of Coated Fabrics, 8, 10–20 (July, 1978). All the preceding three references are incorporated herein by reference. Example of the suitable liquid photosensitive resins are included in the Merigraph series of resins made by MacDermid GRAPHICARTS, Incorporated, of Wilmington, Del.

The next step is optional and comprises controlling a thickness of the coating to a pre-selected value. In some embodiments, this pre-selected value is dictated by a desired thickness of the first layer 30 and will influence the resulting thickness of the deflection member 10. In other embodiments, the thickness of the coating will become the thickness of the resulting deflection member 10—if the deflection member 10 comprises a single layer. This resulting thickness of the deflection member 10 is primarily dictated by the expected use of the deflection member 10. For example, when the deflection member 10 is to be used in a process for making a fibrous structure, described hereinafter, the deflection member 10 is typically from about 0.3 mm to about 10.0 millimeters thick. Other applications, of course, can require thicker deflection members which can be as high as 30.0 millimeters thick or even thicker, all of which are included in the scope of the present invention. Any suitable means for controlling the thickness of the first layer 30 can be used in the process. For example, illustrated in FIG. 19 is the use of a roll 111a. A clearance between the roll 111a and the forming surface 100, or more specifically between the roll 111a and the backing film 130, can be controlled manually or mechanically, by any conventional means (not shown).

Mask

Figure 20:
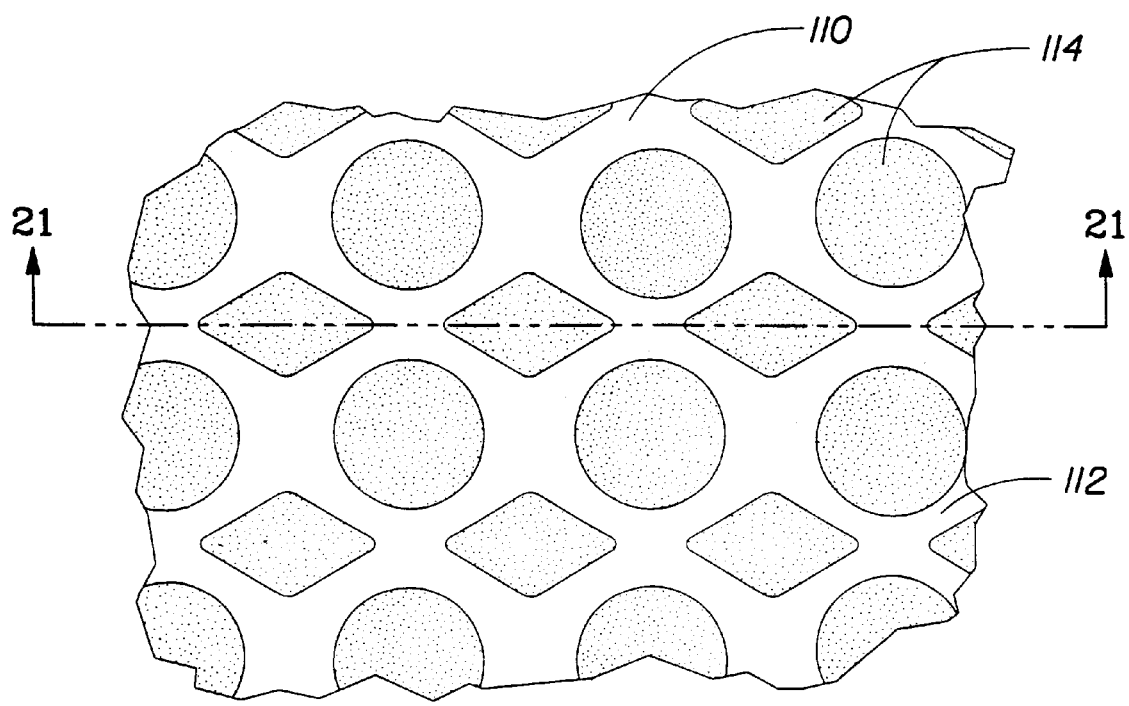
FIG. 20 is a schematic plan view of a fragment of the embodiment of the process of making the deflection member according to the present invention, showing a mask having transparent and opaque regions, the mask being disposed on the top of a coating of the curable material.
Figure 21:
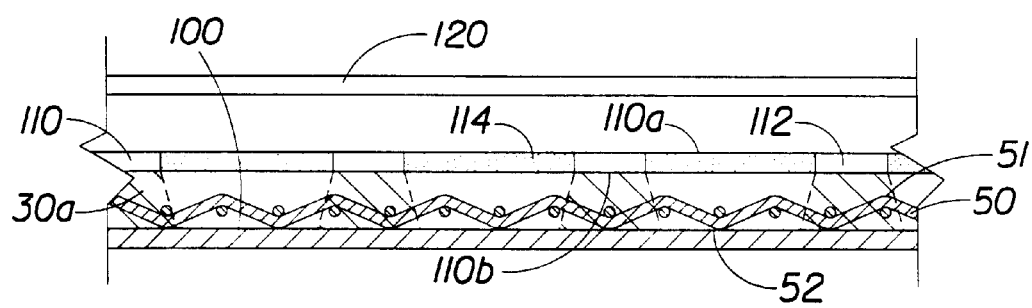
FIG. 21 is a schematic cross-sectional view of the embodiment of the process for making the deflection member, schematically showing selective curing of the coating of the curable material through the mask shown in FIG. 20, and taken along lines 21—21 of FIG. 20.

The next step comprises providing a mask 110 and positioning the mask 110 between the coating of the first curable material 300 and a source of curing radiation 120. In the instance of a photosensitive resin, the source of curing radiation 120 may comprise, for example, a mercury arc lamp. The mask 110, schematically shown in FIGS. 19–25A, comprises a relatively thin and flexible structure, typically in the nature of film, having a top side 110a and a bottom side 110b opposite to the top side 110a. In some embodiments, the mask 110 may be juxtaposed in contacting relation with the coating. As schematically shown in FIG. 20, the mask 110 comprises transparent regions 112 and opaque regions 114. As used herein, the term "opacity" and "opaque" mean lack of transparency or translucency in certain areas of the mask 110, and designates those areas' quality of being shaded such as to be impervious or partially impervious to the rays of curing radiation.

The primary purpose of the mask 110 is to shield certain areas of the coating, i. e., those areas that are shielded by the opaque regions 114, from exposure to curing radiation. The transparent regions 112 of the mask 110 allow other (unshielded or partially shielded) areas of the coating to be exposed to and receive the curing radiation which results in hardening, i. e., curing, of these unshielded portions. The shielded areas of the coating typically form a pre-selected pattern corresponding to the desired pattern of the deflection conduits 35 of the layer being constructed. The mask having a three-dimensional structure can also be used to imprint a pattern in the coating, as described below.

The mask 110 of the present invention may have multiple differential opacities, i. e., the mask 110 may have the opaque regions 114 that differ in opacity. Those differential opacities may comprise discrete opacities and/or gradient opacities. As used herein, the term "gradient opacity" means an opacity having a gradually changing intensity. Gradual opacity does not have a defined "border line" therein that would separate one opacity from the other. That is, the gradient opacity is a non-monotone opacity, wherein the change in opacity in at least one direction is gradually incremental, as opposed to discrete.

One method of constructing the mask 10 having regions of differential opacities comprises printing a transparent film to form a pattern of opaque regions having a certain initial opacity, and then printing the film a second time to form a pattern of opaque regions having another opacity different from the initial opacity. For example, first the film can be printed with ink to form regions of the initial opacity, and then printed again to apply the ink to at least several of the regions already having the initial opacity, thereby increasing the opacity of said several regions. In another method, the differential opacities can be formed in one-step printing, by using a printing roll, such as, for example, a Gravure roll, having a differential-depths pattern therein for receiving ink. During printing, the ink deposited to the transparent film will have regions of differential intensities, reflecting the differential depths of the roll's pattern. Other methods of forming opaque regions can be used in the present invention. Such methods include, but are not limited to, chemical, electromagnetic, laser, heat, etc.

Figure 22A:
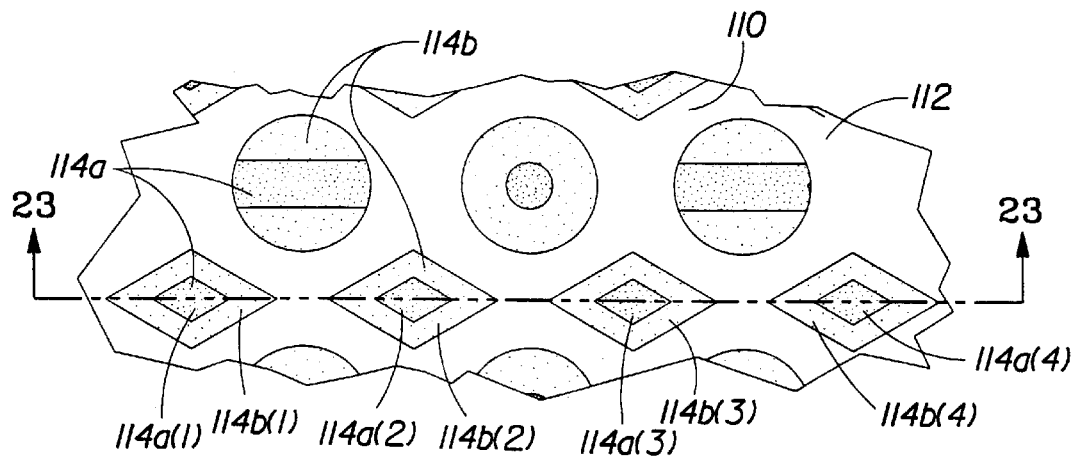
FIGS. 22A–22C are schematic and partial plan views of embodiments of the process for making the deflection member according to the present invention, each showing an exemplary embodiment of the mask having transparent and opaque regions.
Figure 22B:
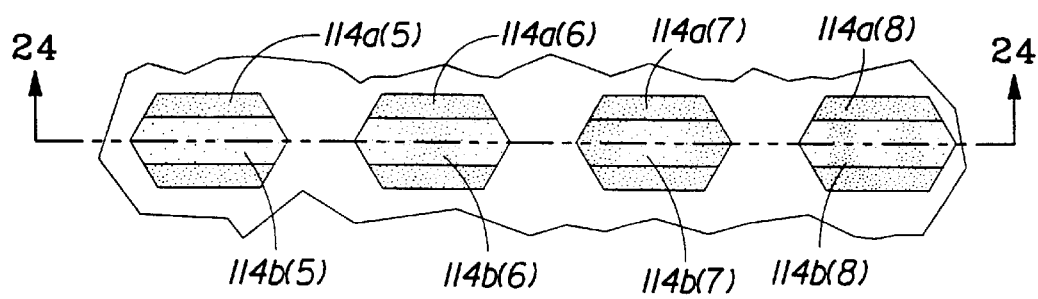
Figure 22C:
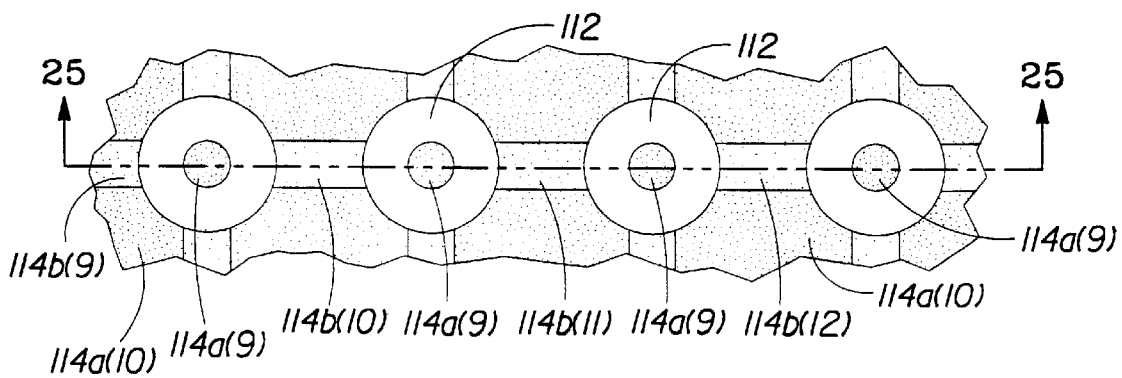

In exemplary embodiments of the mask shown in FIGS. 22A–22C, the mask 110 has first opaque regions 114a having a first opacity and second opaque regions 114b having a second opacity (also defined herein as "partial" opacity) less than the first opacity. The terms "partially opaque" and "partially transparent" may be used herein interchangeably. Each of the first opaque regions 114a and the second opaque regions 114b may form a discontinuous pattern of a plurality of discrete areas (FIGS. 22A–22C), a semi-continuous pattern (not shown), or a substantially continuous pattern (not shown). The second opaque regions 114b may comprise areas adjacent to the first opaque regions 114a (FIGS. 22A–22C).

Figure 50:
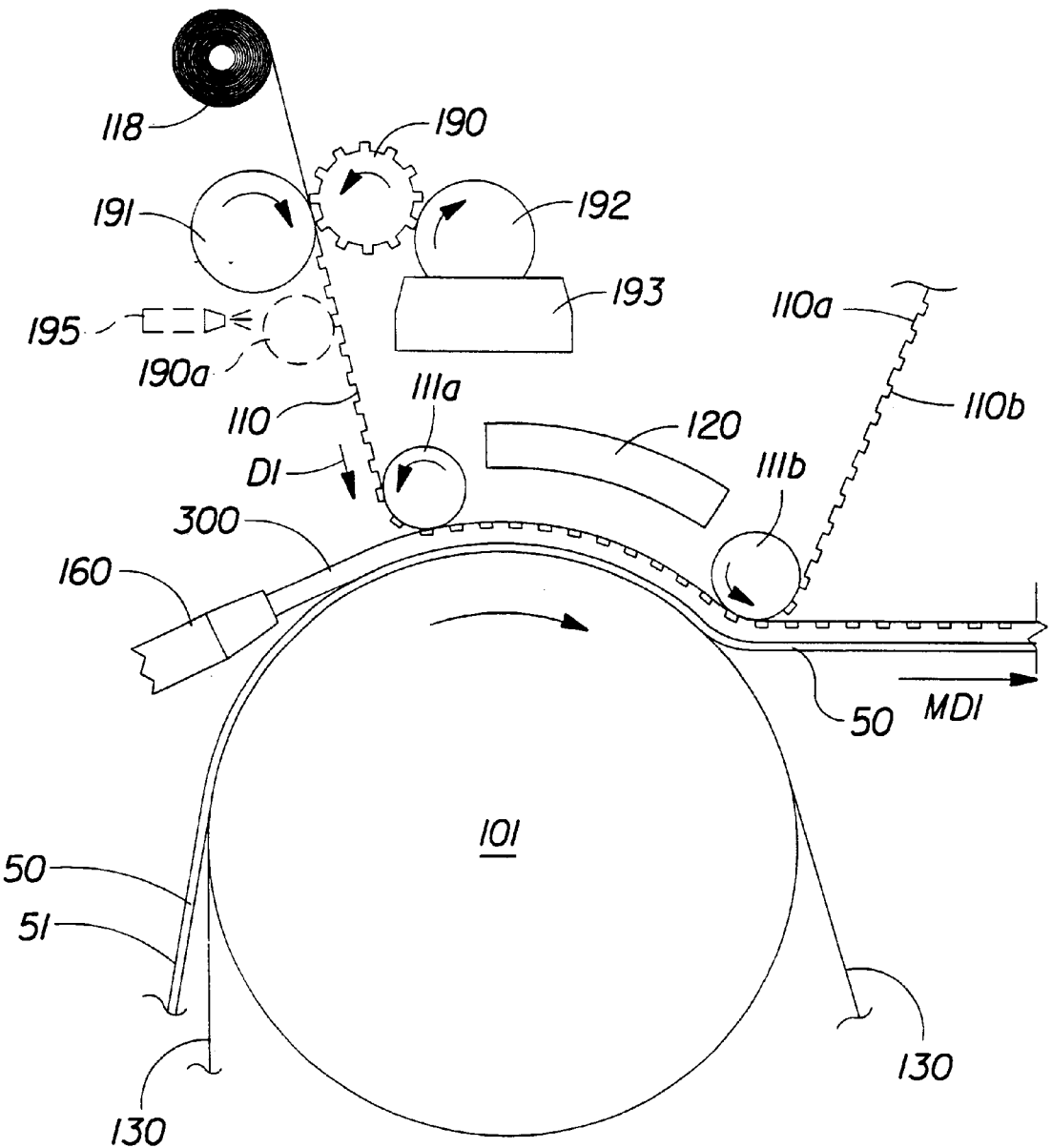
FIG. 50 is a schematic side-elevational view of an embodiment of the process for making the deflection member according to the present invention, showing a process of forming a mask having protrusions.

The mask 110 can be made in a form of an endless loop (all the details of which are not shown in FIG. 19 but should be readily apparent to one skilled in the art), or it can be supplied from a supply roll (FIG. 50) to a take-up roll (not shown). As shown in FIGS. 19 and 50, the mask 110 travels in the direction indicated by a directional arrow D1, turns under the nip roll 111a where it can be brought into contact with the surface of the first coating 300, travels to a mask guide roll 111b in the vicinity of which it can be removed from the contact with the first coating 300.

The mask 110 can be made of any suitable material which can be provided with opaque and transparent regions. A material in the nature of a flexible photographic film may be suitable. Such a flexible film can comprise polyester, polypropylene, polyethylene, cellulosic, or any other suitable material, or any combination thereof. The opaque regions 114 can be applied to the mask 110 by any convenient means known in the art, such as, for example, spraying, photographic, Gravure, flexographic, or rotary-screen printing. Gradient opacity can be formed, for example, by printing multiplicity of lines of incrementally varying opacity, wherein the overall opacity gradually changes in at least one direction, or by using inks of varying optical density. Gradient opacity can also be formed by using a printing roll having gradually-changing differential depths of the roll's patterned depressions receiving ink, which ink, when transferred from the roll to the film during printing, will have regions of differential intensity reflecting the differential depths of the roll's pattern. Superimposition of two or more masks, each having its own pattern of transparent/opaque regions, to form a combined structure having regions of combined opacity is also contemplated in the present invention.

Commonly assigned patent application Ser. No. 09/346, 061, titled "Papermaking Belts Having Patterned Framework With Synclines Therein And Paper Made Therewith," filed on Jul. 1, 1999 in the name of Trokhan, is incorporated herein by reference. This application discloses a framework that is interrupted (on its web-side) and subdivided by synclines. The framework, synclines, and deflection conduits, respectively, impart first, second, and third values of intensive properties to regions of a paper made on these portions of the belt. The value of the intensive property of the regions of the paper corresponding to the synclines is intermediate to those of the paper regions corresponding to the framework and the deflection conduits. For example, if the belt is used as a through-air-drying belt, the density of the paper regions corresponding to the synclines may be less than the density of the paper regions corresponding to the framework but greater than the density of the paper regions corresponding to the deflection conduits; and if the belt is used as a forming wire, the basis weight of the paper regions corresponding to the synclines may be greater than the density of the paper regions corresponding to the framework but less than the basis weight of the paper regions corresponding to the deflection conduits.

The mask 110 can be made using a photosensitive material, such as a photosensitive film, in which instance the opaque regions can be created by selectively exposing predetermined areas of the film to the light. The Ozalid®, or diazo, process is used to makes copies from a variable optical density original. Typically the originals are either black and white or gray scale in nature. Copies can be made on different substrates, but for the purposes of this invention they can be made on transparent polyester film coated with a sensitized diazo dye. The translucent original containing the desired image is first placed in contact with the coated polyester film. The original and the copy are then exposed to ultra violet light, typically from a mercury arc lamp. The light first passes through the translucent original. The sensitized coating on the copy is destroyed in those areas of the film that are exposed to the light, ultimately leaving those areas transparent. In areas shielded by the original image, the sensitized coating remains as a latent image. After separation of the original and the copy, the copy is exposed to ammonia gas. The ammonia reacts with the remaining diazo dye and forms a visible and essentially permanent image on the film. The density of the image on the copy is directly proportional to the optical density of the image on the original. Such film is suitable for use as a mask in the photo-polymerization process. Diazo reproduction equipment is commonly sold by the A. M. Bruning Company of Itasca, Ill. A suitable device is the Bruning Model 750. Similar equipment is sold by The Diazit Company, Inc. of Youngsville, N.C. A suitable device from Diazit Company is the Executrac.

Figure 25A:
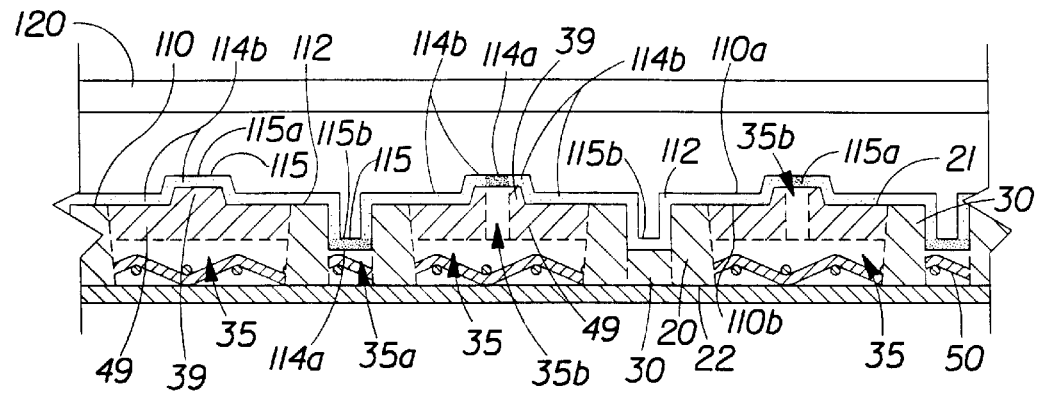
FIG. 25A is a schematic instantaneous cross-sectional view similar to that shown in FIG. 24, showing an embodiment of a three-dimensional pattern of the mask.

In some embodiments, the mask 110 has a three-dimensional topography. As used herein, the term "three-dimensional topography" refers to Z-directional dimensions of the mask 110, which are greater than the thickness of the material the mask 110 is made of. For example, the three-dimensional topography of the mask 110 may comprise protrusions from the general plane of the mask 110 (when the mask 110 is viewed as disposed on a flat surface). These protrusions can outwardly extend from the top side 110a, bottom side 110b, or both sides 110a, 110b, of the mask 110 (FIGS. 24 and 25A) and can have regular/repeating or irregular/non-repeating pattern. In FIG. 24, the mask's bottom side 110b has a pattern of protrusions 115 extending therefrom. When such a mask 110 is positioned adjacent to the coating, the pattern of protrusions 115 can be imprinted into the coating to form a corresponding pattern of depressions therein. FIG. 25A shows the mask 110 of the present invention, comprising two patterns of protrusions 115: one pattern of protrusions 115a extends from the top side 110a, and the other pattern of protrusions 115b extends from the bottom side 110b of the mask 110. The protrusions 115a extending from the top side of the mask 110 are hollow and form voids into which the fluid curable material can flow to form corresponding protrusions on the web-side 21 of the framework 20.

Either one of the patterns of protrusions 115a, 115b may correlate with the pattern of transparent regions 112 and opaque regions 114. Thus, the patterns of protrusions 115a, 115b and the pattern of the opaque/transparent regions 114/112 can work in combination to form a desired three-dimensional pattern of the framework 20 of the deflection member 10 (FIG. 25A), whether the mask 110 has the pattern of protrusions 115a extending from the top side 110a of the mask, the pattern of protrusions 115b extending from the bottom side 110b of the mask 110, or both pattern of protrusions 115a, 115b.

The protrusions 115 can be integral or adjunct. As used herein, the integral protrusions are protrusions that are formed from a material constituent with, or inherent to, the mask 110, and as such, the integral protrusions are not separable from the rest of the mask 110. One way of forming the integral protrusions in the mask 110 is schematically shown in FIG. 50. In FIG. 50, a mask film 118 is supplied in the form of a supply roll. The mask film 118 is embossed by an embossing roll 190 against a support roll 191. As FIG. 50 shows, the opaque regions 114 can be created, by printing a pattern of the opaque regions 114 simultaneously with embossing. For example, ink can be applied to the embossing roll 190, and more specifically, to distal surfaces of the roll's embossing protrusions, by using, for example, an ink roll 192 partially submerged into an ink reservoir 193 containing therein a suitable ink. The ink can also be sprayed to the print roll 192, or directly to the embossing roll 190 (both variations not shown). Alternatively or additionally to depositing the suitable ink to the embossing roll 190, the embossed film 118 may be printed after the step of embossing, for example, by a roll 190a receiving the ink from a spray 195 (as schematically shown in FIG. 50 in dashed lines). Other means known in the art, such as chemical, electromagnetic, laser, heat, etc., can be used, additionally or alternatively, to create opaque regions in the mask 110.

In FIG. 50, when the embossing roll 190 having ink thereon embosses the film 118, it applies, by contact, the ink to the film 118 in a predetermined pattern, for example, a pattern corresponding to the pattern of the embossing protrusions on the embossing roll 190. When the mask 110 contacts the coating 300 of the curable material, the pattern of protrusions 115 creates a corresponding "negative" pattern of voids in the coating 300. For example, the mask 110 can been printed such that the distal surfaces of the protrusions 115 are sufficiently opaque to preclude curing of areas of the coating corresponding to the opaque regions 115. Thus, the amount of the liquid resin that is shielded from the radiation and later washed out, can be reduced by excluding some of that resin from the shielded portions of the coating prior to the step of curing. Consequently, by using a three-dimensional mask 110 of the present invention, one can save a sufficient amount of the curable material.

Figure 51:
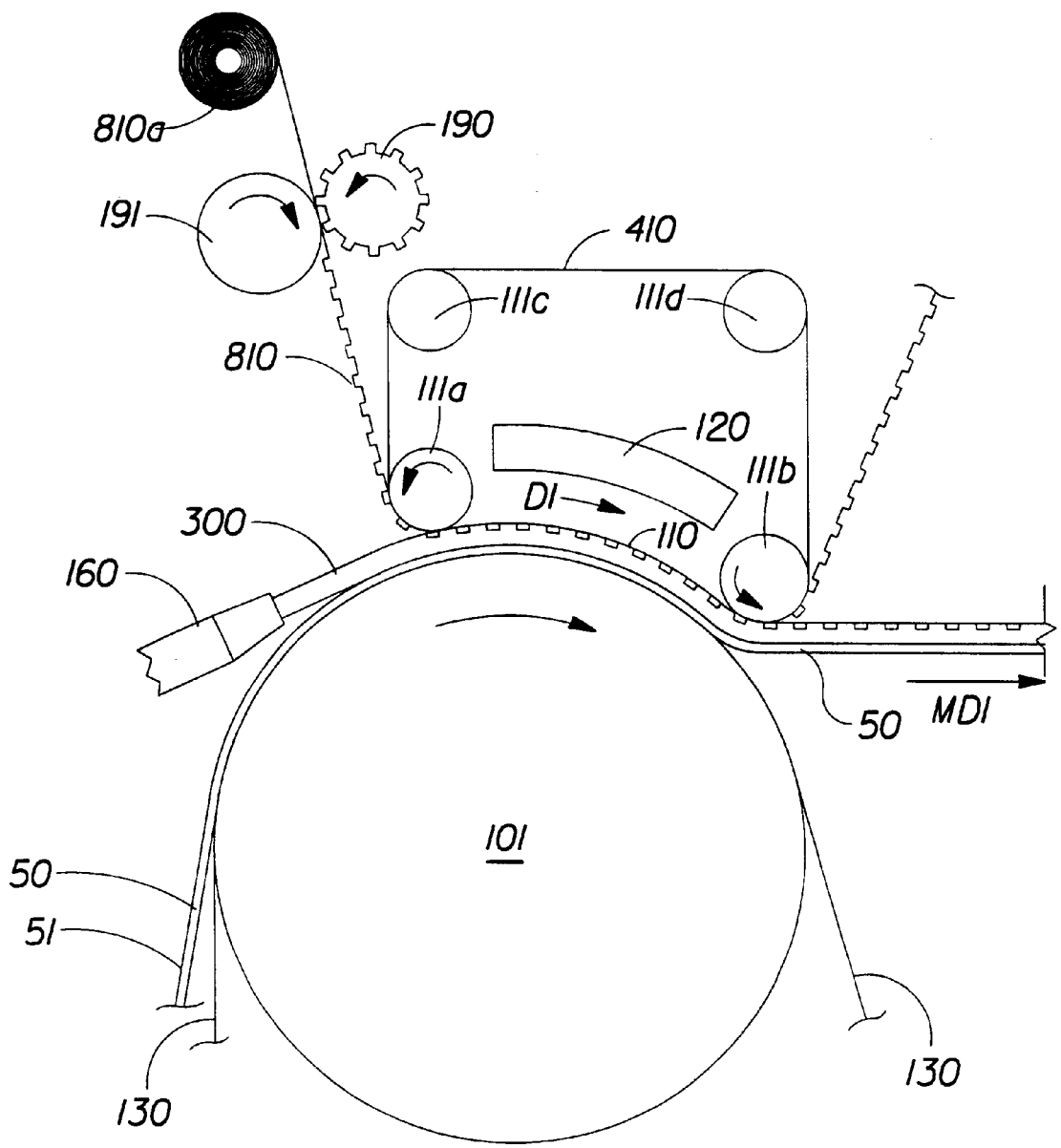
FIG. 51 is a schematic side-elevational view of an embodiment of the process for making the deflection member of the present invention, using a three-dimensional embossing element.

As used herein, the adjunct protrusions are protrusions that are formed from the material that is not inherent to the material of the mask 119. The adjunct protrusions can be formed independently from the mask 110. It does not exclude, however, the adjunct protrusions 115 formed from the same material as the mask 110. The adjunct protrusions can be attached (by adhesive, or by a chemical process, for example) to the mask 110 to form an integral structure therewith. Alternatively, a pattern of adjunct protrusions may be independently supplied and superimposed upon the coating 300, independently from and without being attached to, the mask 110, as schematically shown in FIG. 51. The adjunct protrusions can be made from a variety of suitable materials, including organic and non-organic materials, such as—without limitation—plastic, resin, glass, wood, metal, leather, textile fabric, and any combination thereof.

In FIG. 51, the three-dimensional mask 110 comprises a first element 410 having a pattern of transparent and opaque regions and an embossing element 810. The first element 410 travels about rolls 111a, 111b, 111c, and 111d; and the embossing element 810 is supplied from a roll 810a. Both the first element 410 and the embossing element 810 can be fed into the nip formed between the coating 300 and the nip roll 111a, at which point the first element 410 and the embossing element 810 come together to form a composite structure in which the pattern of the transparent and opaque regions 112/114 and the pattern of the protrusions 115 work in cooperation to form a desired three-dimensional pattern of the framework 20 of the deflection member 10. This arrangement is believed to provide a greater flexibility in controlling (and changing, if necessary) a mutual correlation between the transparent/opaque pattern 112/114 and the pattern of protrusions 115.

Figure 52:
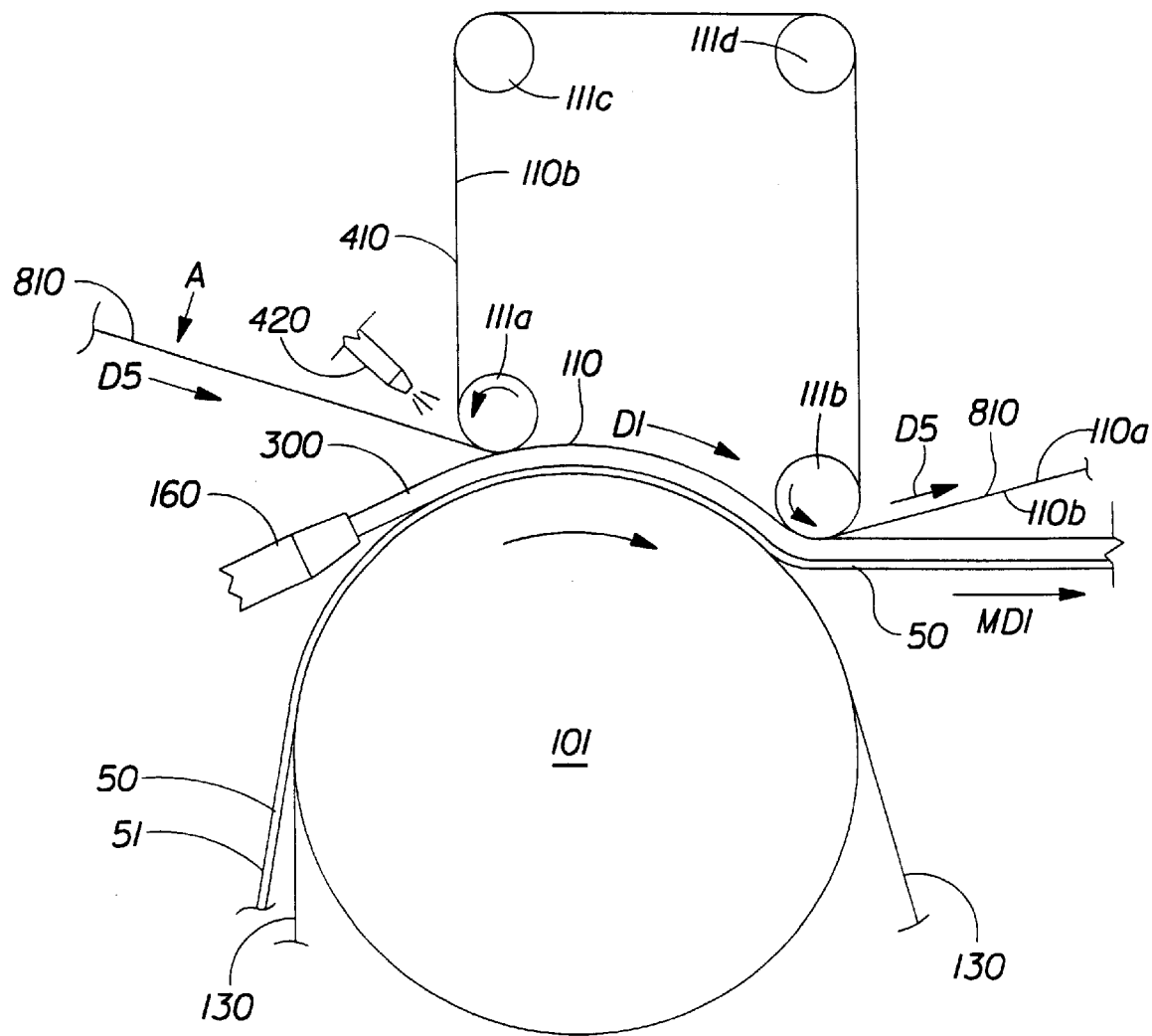
FIG. 52 is a schematic side-elevational view of an embodiment of the process for making the deflection member of the present invention, wherein the mask comprises a composite structure.
Figure 52A:
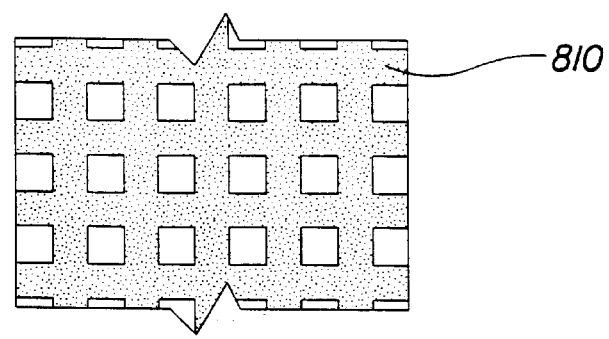
FIG. 52A is a partial plan view of an embossing element taken in the direction of the arrow A of FIG. 52.

FIG. 52 shows yet another embodiment of the process, in which the mask 110 is formed by at least two independent elements. In FIG. 52, both the first element 410 comprising an endless transparent film traveling around rolls 111a, 111b, 111c, and 111d, and the embossing element 810 are fed into the nip formed between the coating 300 and the nip roll 111a. One embodiment of the embossing element 810, best shown in FIG. 52A, comprises a structure in the nature of an air-permeable grid, which can be formed by, for example, interwoven filaments, or by means of die forging, die forming, or by any other means known in the art. The pattern shown in FIG. 52a is, of course, one exemplary embodiment, and variety of other suitable patterns can be used in the embossing element 810.

As the film 410 and the embossing element 810 travel between the rolls 111a and 111b, they form the composite mask 110, wherein the embossing element 810 creates a three-dimensional pattern in the coating 300 and can, at the same time, shield selected areas of the coating 300 from the curing radiation. The transparent film 410 can also be used to restrict areas of the coating 300 from expending beyond the contours of the embossing element 810. If desired, the film 410 can also have a pattern of opaque regions to work in cooperation with the pattern of the embossing element 810. Alternatively, the embossing element 810 can be transparent or translucent so that the film 410 alone forms the opaque regions.

In both embodiments shown in FIGS. 51 and 52, the two elements comprising the composite three-dimensional mask can be joined together, even if temporarily, by, for example, an adhesive (shown, as an example, in FIG. 52 as being sprayed to the first element 410 by an adhesive applicator 420), or the embossing element 810, or both, before said elements 410, 810 come into contact. This may prevent the embossing element 810 from being undesirably submerged into the coating 300 between the rolls 111a and 111b, or from misalignment with the first element 410 when an alignment between the embossing element 810 and the first element 410 is required.

The next step comprises exposing the first curable material 300 to the curing radiation from the source 120 through the mask 110, thereby inducing curing of the coating in those areas which are not completely shielded by the first opaque regions 114a, i. e., in those areas that can receive the curing radiation through the transparent regions 112 or through the partially transparent (or partially opaque) regions of the mask 110. In the embodiment illustrated in FIG. 19, the backing film 130, the reinforcing element 50, the first curable material 300, and the first mask 110 all form a unit traveling together from the nip roll 111a to the mask guide roll 111b. Intermediate the nip roll 111a and the mask guide roll 111 b, and positioned at a location where the backing film 130 and the reinforcing element 50 are still juxtaposed with the first forming surface 100, the first curable material 300 is exposed to curing radiation generated by the source of the curing radiation 120. If the curable material comprises the liquid photosensitive resin, an exposure lamp, in general, may be selected to provide illumination primarily within the wavelength that causes curing of the liquid photosensitive resin. That wavelength is a characteristic of the liquid photosensitive resin. Any suitable source of illumination, such as mercury arc, pulsed xenon, electrodeless, and fluorescent lamps, can be used. Curing is generally manifested by a solidification, or a partial solidification, of the coating of the curable material in the exposed areas through a predetermined depth, or thickness, of the coating. Conversely, the unexposed areas, or portions beyond the reach of the curing radiation, remain fluid and can be removed from the coating.

The intensity of the radiation and its duration depend upon the degree of curing required in the areas exposed to the radiation. In the instance of the photosensitive resin, the absolute values of the exposure intensity and time depend upon the chemical nature of the resin, its photo characteristics, the pattern selected, and the thickness of the coating, or of the desired depth of its areas, to be cured. Further, the intensity of the exposure and the angle of incidence of the curing radiation can have an important effect on the presence or absence of taper in the walls of the pre-selected pattern of the framework to be constructed. The disclosure of commonly assigned U.S. Pat. No. 5,962,860, issued Oct. 5, 1999 in the name of Trokhan et al. is incorporated by reference herein. This patent discloses an apparatus for generating controlled radiation for curing a photosensitive resin, comprising a reflector having a plurality of elongate reflective facets that are adjustable such as to direct the curing radiation substantially to a desired direction. The patent further discloses a radiation management device comprising a mini-reflector juxtaposed with the source of radiation for controlling the direction and intensity of the curing radiation.

The next step comprises removing from the partly-constructed first layer substantially all the first curable material 300 which was not cured. In the embodiment shown in FIG. 19, at a point in the vicinity of the mask guide roll 111b, the mask 110 and the backing film 130 are physically separated from the composite comprising the reinforcing element 50 and the partly-constructed first layer. That composite first layer travels to the vicinity of a first removal shoe 119, where a vacuum or other means may be applied to the composite so that a substantial quantity of the still-liquid (uncured) material can be removed from the composite.

The second layer 40 can be made by a substantially similar process, from the second curable material 400. In some embodiments the second layer 40 does not have the reinforcing element permanently joined to the second curable material 40. During the process of making the second layer 40, the use of a second reinforcing element 60 may be desirable, especially when the second layer 40 comprises a semi-continuous pattern or a pattern of a plurality of discrete protuberances. The second reinforcing element 60 may comprise a temporary reinforcing element. As used herein, the term "temporary reinforcing element" means a reinforcing element that is used during the steps of constructing a particular (first or second) layer and/or joining the first and second layers together, and is removed after serving its intended function so that the final deflection member does nor have it. The temporary reinforcing element can be made of any suitable material, such as a material in the nature of a flexible sheet or film. Such a flexible sheet can comprise polyester, polyethylene, cellulosic, or any other suitable material, or any combination thereof. It may be beneficial to use material having critical surface energy greater than that of the curable material.

Figure 12:
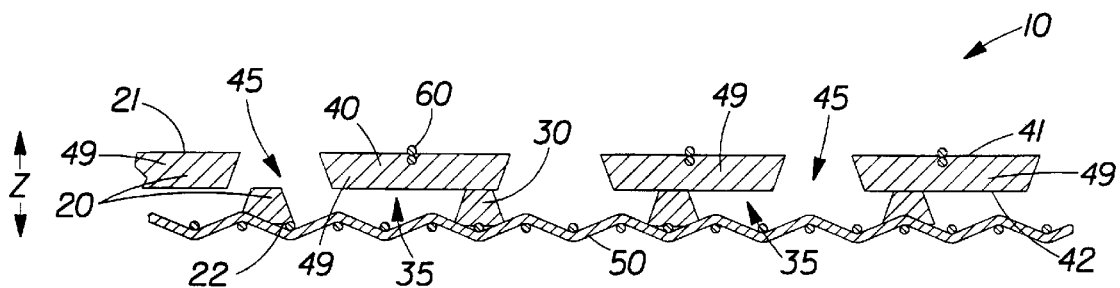
FIG. 12 is a schematic instantaneous cross-sectional view of the deflection member shown in FIG. 11, taken along lines 12—12 of FIG. 11.
Figure 12A:
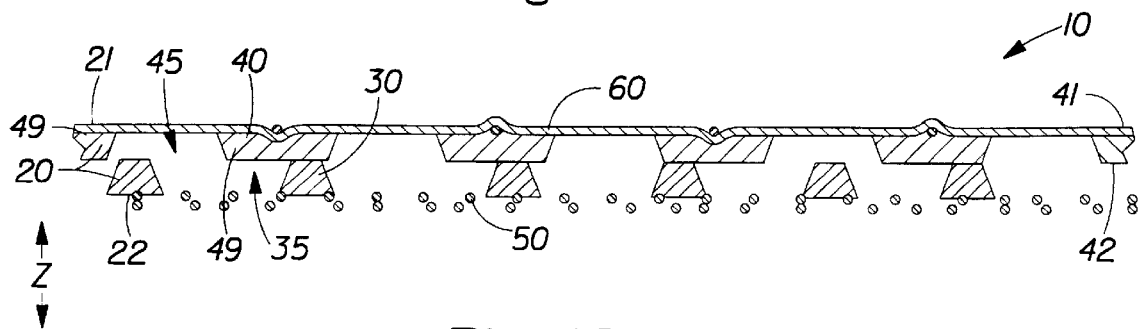
FIG. 12A is a schematic instantaneous cross-sectional view of the deflection member shown in FIG. 11, taken along lines 12A—12A of FIG. 11.

The foregoing, however, does not exclude embodiments in which the second layer 40 has the second reinforcing element 60 permanently joined to the second layer 40, as is shown, for example, in FIGS. 11 and 12A. Such a reinforcing element permanently-joined to the second layer 40 should not substantially interfere with the fibers' ability to deflect into the deflection conduits of the deflection member 10, including the deflection conduits 35 formed in the first layer 30. To that effect, such a reinforcing element 60 can comprise, for example, a plurality of interwoven yarns, wherein parallel yarns are spaced apart at a distance sufficient to minimize an interference of the reinforcing element 60 with the fibers' ability to reach the deflection conduits of the deflection member 10.

The reinforcing element comprising so-called "fugitive tie yarns" may be beneficially used for the second layer 40. Commonly assigned PCT application WO 99/14425, published on Mar. 25, 1999, and titled Multiple Layer Foraminous Belts With Fugitive Tie Yarns, discloses a belt for supporting a cellulosic fibrous structure in a papermaking process and a method of producing the belt. The belt comprises a reinforcing element having two layers, a web-contacting first layer and a machine-facing second layer, and a pattern layer comprising a cured photosensitive resin, the pattern layer having a plurality of conduits therethrough. The two layers of the reinforcing element are joined together by either integral or adjunct tie yarns such that at least a portion of the tie yarns which lies within the conduits is removable after the photosensitive resin has been cured. These "fugitive" tie yarns are substantially transparent to actinic radiation and can be removed by chemical or mechanical processes when they are no longer needed to stabilize the relationship between the web-facing layer and the machine-facing layer of the reinforcing element. In particular, the portion of the fugitive tie yarns that lies within the conduits can be removed so that belt properties, such as projected open area, are substantially isotropic across the belt. A means to remove the fugitive adjunct tie yarns may include a combination of solubilization and mechanical energy provided by a showering systems that are part of the belt-making and papermaking processes. Suitable materials for the fugitive tie yarns comprise those that can be controllably removed by chemical or mechanical means. The disclosure of PCT application WO 99/14425 is incorporated herein by reference.

In FIG. 19, the temporary reinforcing element 60 is shown in the form of an endless band traveling in a second machine direction, indicated by a directional arrow MD2, about rolls 240, 241, and 242. It is to be understood, however, that the temporary reinforcing element 60 may be supplied in the form of a supply roll to be wound into a take-up roll, analogously to the arrangement comprising the supply roll 131a and the take-up roll 131b used for the backing film 130, described above.

Analogously to the steps of making the first layer 30, a coating of the second curable material 400 and the temporary reinforcing element 60 can be supported by the second forming surface 200. The second curable material 400 can be deposited by using, for example, a nozzle 260. The second curable material 400 may be identical to, or different from, the first curable material 300. Controlling the thickness of the coating of the second curable material 400 to a pre-selected value can be accomplished by, for example, a nip roll 211a. As has been explained above, the resulting thickness (or caliper) of the deflection member 10 is formed by the combined thickness of the first layer 30 and the second layer 40. The coating of the second curable material 400 is exposed to a curing radiation from a second source 220 of the curing radiation, through a second mask 210, having a pattern of transparent and opaque regions. The second mask 210 travels in the direction indicated by a directional arrow D2, turns under the nip roll 211a where the second mask 210 can be brought into contact with the surface of the second coating 400, travels to a mask guide roll 211b in the vicinity of which the second mask 210 can be removed from the contact with the second coating 400. Then, substantially all the second curable material 400 which was not cured is removed from a partly-made second layer 40, by, for example, a second removal shoe 219, where a vacuum can be applied to the composite so that a substantial quantity of the liquid uncured material can be removed from the composite.

After the first and second layers 30, 40 are substantially formed, the first layer 30 and the second layer 40 are brought together in a face-to-face relationship at a nip indicated in FIG. 19 as "N1." Any conventional means for bringing the first and second layers 30, 40 together may be utilized. In the embodiment of FIG. 19, the first layer 30 travels around a first nip roll 140, and the second layer 40 travels around a second nip roll 240. The nip N1 is formed between respective outer surfaces of the nip rolls 140 and 240. Mutual alignment of the two patterns—the first and second layers 30, 40—may be required, so that a desired combined three-dimensional pattern formed by superimposition of two respective patterns can be obtained at the nip N1.

According to one embodiment of the process of the present invention, the first layer 30 and the second layer 40 are cured to the extent that their respective surfaces of contact retain some adhesive properties sufficient to enable the first and second layers 30, 40 to be securely joined upon contact therebetween. That is, when the first and second layers 30, 40 are brought together at the nip N1, the outer surfaces of the first and second layers 30, 40 facing one another retain sufficient amount of surface energy and are capable of being joined together by virtue of not being completely hardened. With reference to FIG. 19, the top surface 31 of the first layer 30 and the bottom layer 42 of the second layer 40, before being brought together in the nip N1, may not be cured to a complete hardness and can remain in a partially cured condition to retain a sufficient amount of surface energy to enable joining of the first and second layers 30, 40 together.

The joining of the first and second layers 30, 40 in the nip N1 may be facilitated by an application of pressure exerted by the first and second nip rolls 140, 240. At the nip N1, the first and second surfaces 30, 40 are pressed against each other, and the combined structure travels farther from the nip N1 to a nip N2 during a predetermined period of time. Any conventional means may be used to impart the pressure upon the first and second layers 30, 40 to join securely them together. In FIG. 19, auxiliary press rolls 150 and 250 are schematically shown to press the first and second layers 30, 40 towards each other.

After the partly-formed deflection member 10, comprising the first and second layers 30, 40 joined together, exits the nip N2, it can be brought into the vicinity of a resin wash shower 124 and a resin wash station drain 125, at which point the composite can be thoroughly washed with water or other suitable liquid to remove essentially all of the remaining uncured (and still liquid) material 300, 400 which can be discharged from the system through the resin wash station drain 125. Further, if desired, an additional resin removal shoe (not shown) may be utilized to remove, by vacuum or otherwise, any residual uncured material 300, 400. Then, a final curing can be performed, for example, from sources 121 and 122 of the curing radiation disposed at opposite sides of the composite framework 20 being formed, to complete the process of joining the layers 30, 40, and hardening the composite structure, thereby forming the deflection member 10 of the present invention. If the temporary reinforcing element 60 has been used, the temporary reinforcing element 60 can be separated or removed from the second layer 40 at the nip N2 or later when the deflection member 10 is substantially formed, depending on a specific embodiment of the process.

The present invention contemplates an embodiment in which one or both of the first and second layers 30, 40, or at least their respective surfaces of contact 31, 42, comprise(s) a chemically-active ingredient or ingredients, to enable, or facilitate, joining of the first and second layers 30, 40. As used herein, the "chemically-active ingredient" means a substance that is capable of forming, under certain conditions, chemical bonds or other favorable associations with another material in contact therewith. Suitable materials include primers and coupling agents. The primers can comprise multi-functional and multi-component formulations. One of the functional groups is capable of forming chemical bonds with the material of the first layer while another functional group or groups bond(s) or beneficially associate(s) with the second layer. An example of such a material for potentiating the joining of a methacrylate photopolymer layer and a polyester layer would be an acrylate-terminated polybutadiene. Such an ingredient can also have a secondary binder such as a vinyl copolymer (vinyl acetate/chloride/alcohol terpolymer). Suitable coupling agents include the titanate and zirconate coupling agents sold by Kenrich Petrochemicals Inc. of Bayonne, N.J. Without being bound by theory, it is believed that these tetra-functional organo-metallic coupling agents based on titanium and zirconium work because the central metal's tetravalency is conducive to electron sharing which in turn enhances adhesion between dissimilar materials.

The chemically-active ingredient or ingredients may be inherently present in at least one of the first curable material 300 and the second curable material 400. Alternatively, the chemically-active ingredient or ingredients may be added to at least one of the first and second curable materials 300, 400, or at least one of the first and second layers' surfaces of contact. In FIG. 19, a first chemically-active ingredient is schematically shown as being sprayed on the top surface 31 of the first layer 30 with an applicator 127; and a second chemically-active ingredient is schematically shown as being sprayed on the bottom surface 42 of the second layer 40 with an applicator 227. The chemical composition of such chemically-active ingredient(s) is dictated primarily by the chemical compositions of the first and second curable materials 300, 400. For example, if the first and second curable materials 300, 400, are identical and comprise a liquid photosensitive resin, an additional amount of the liquid photosensitive resin may be applied to one or both surfaces 31, 42 to be joined. After joining, additional UV radiation may be supplied to cross-link the applied resin with residual monomer still present in layers 30 and 40.

One skilled in the art will appreciate that in lieu of, or in addition to, the first and second chemically-active ingredients, various adhesive materials may be utilized to enable or facilitate joining of the first and second layers 30, 40 together. It is contemplated that in such embodiments, at least one of the first and second layers 30, 40 may be completely cured to the final hardness prior to the step of joining.

According to another embodiment, one or both of the first and second layers 30, 40 may be made by first providing a ply of a suitable material having a pre-selected thickness and then forming a conduit portion therein. For example, a plurality of the discrete deflection conduits may be formed by any conventional means known in the art, such as by drilling, by a chemical process, by printing, by a laser cutting, etc. If one of the layers comprises a semi-continuous pattern or a pattern comprising a plurality of discrete protuberances, it can be formed by providing individual discrete elements and attaching these individual discrete elements to the other layer.

FIGS. 22A–25A schematically show several embodiments of the deflection member 10 of the present invention, and a process for making such a deflection member 10 using the mask 110 of the present invention, having differential opacities and gradient opacities. The following process may also be used for constructing any of the individual layers of the composite framework 20 comprising a multi-layer structure. To the extent that a construction of one of the layers 30, 40 is concerned, many steps of this process are analogous to the process steps described above in the context of making an individual layer, and therefore would be readily appreciated by one skilled in the art without repeating all the details common for the both processes.

As illustrated in FIGS. 22A–25A, and mentioned above, the mask 110 has the transparent regions 112 and the opaque regions 114. The opaque regions 114 comprise at least the first opaque regions 114a having the first opacity, and the second opaque regions 114b having the second opacity different from the first opacity. For example, the first opacity may be greater than the second opacity. The first opaque regions 114a may have optical density that is greater than that of the second opaque regions 114b. In the exemplary embodiments of FIGS. 22A–25A, the first opacity is the opacity that completely precludes curing of the areas (defined herein as "first areas") of the curable material shielded by the first opaque regions. In the instance of the curable material comprising a photosensitive resin, most typically such first opaque regions 114a are solid black that completely blocks light of an activating wavelength. At the same time, the mask's second opaque regions 114b, having the second opacity, allow the areas of the coating shielded thereby (defined herein as "second areas") to partially cure, i. e., to cure to a certain depth, or thickness, while the rest of the thickness of those second areas remains uncured. In the instance of the curable material comprising a photosensitive resin, such first opaque regions 114a may be "gray" that allows the curing light of an activating wavelength to penetrate the coating to a certain depth thereof, i. e., through a certain predetermined portion of the coating's thickness.

When the coating of the curable material is subjected to the curing radiation from the source 120 through the mask 110 having regions of differential opacity, the first areas of the coating, which are shielded by the first opaque regions 114a, remain uncured (e. g., liquid) through the entire thickness of the coating, while the second areas of the coating, which are shielded by the second opaque regions 114b, remain uncured only through a certain portion of the thickness of the coating, as best shown in FIGS. 23–25. At a given intensity of the curing radiation, the second opacity can be chosen such as to pre-select and control a desired extent of penetration of the curing radiation to cure the coating through a desired depth, or thickness, defined herein as "second thickness." The transparent regions 112 allow the rest of the coating (defined herein as "third areas") to cure the curable material through the entire thickness of the coating (defined herein as "first thickness"), as has been explained above.

As schematically shown in FIGS. 22A–25A, various shapes and cross-sectional configurations of the suspended portions 49 can be created by using the mask of the present invention comprising regions having differential opacities and gradual opacities. For convenience, as used in FIGS. 22A–25, reference numerals having parenthetical numerical suffix designate various exemplary embodiments of the first opaque regions 114a (from 114a(1) to (114a(8)), the second opaque regions 114b (from 114b(1) to 114b(12)), and the suspended portions 49 (from 49(1) to 49(12)) and their back surfaces 49b (from 49b(1) to 459b(12)); while the reference numerals (112a, 114b, 49, and 49b) used without said suffix generically designate these elements.

In FIGS. 22A–25, the first opaque regions 114a of the mask 110 cause the corresponding first areas of the coating to remain uncured through their entire thickness and thus be removed from the partly-formed deflection member to form discrete deflection conduits 35. The second opaque regions 114b, adjacent to the first opaque regions 114a, cause the corresponding second areas of the coating to cure through only a portion of the entire thickness of the coating, i. e., through the second thickness, to form the suspended portions 49. The rest of the coating, i. e., the third areas corresponding to the transparent regions 112 of the mask 110 is exposed to the curing radiation through the transparent regions 112, to cure through the entire thickness of the coating. The resulting structure, best shown in cross-sectional views of FIGS. 23–25, comprises the plurality of bases 30 and plurality of suspended portion 49 laterally extending from the plurality of bases 30.

For example, as shown in FIGS. 22A and 23, some of the second opaque regions 114b, specifically 114b(1) through 114b(4), are adjacent to and surround the diamond-shaped discrete first opaque regions 114a. After the curing is complete, the resulting framework 20 comprises a substantially continuous pattern having a plurality of diamond-shaped discrete deflection conduits 35 dispersed throughout the framework 20. Each of the deflection conduits 35 is surrounded at the web-side 21 by the suspended portions 49 formed from the coating's second areas which are cured only through a portion of the coating's thickness (FIG. 23).

In FIGS. 22A and 23, the mask's second opaque region 114b(1) comprises a constant, non-gradient opacity, while each of the second opaque regions 114b(2), 114b(3), and 114b(4) comprises a gradient opacity. As has been noted above, using the gradient opacity, one can create suspended portions having differential and gradually changing thickness, as well as the back surfaces 49b having differential shapes. For example, in FIG. 23, the back surface 49b(1) of the suspended portion 49(1) is substantially microscopically monoplanar and parallel to the X-Y plane, because during the curing it was superimposed with (and thus partially shielded by) the mask's opaque region having a constant, non-gradient opacity. At the same time, the back surface 49b(2) of the suspended portion 49(2) is tapered, or "angled" relative to the backside 22, because during the curing it corresponded to the mask's opaque region having a gradient opacity. One skilled in the art will appreciate that a degree of a taper and/or shape of the back surface 49(b) created by using the gradient opacity regions depend(s) upon a particular pattern of distribution of the gradient opacity in the opaque regions. As an example, the suspended portions 49(3) and 49(4) are shown in FIG. 23 as having their back surfaces 49b(3) and 49b(4), respectively, curved in mutually opposite directions. Such shapes of the back surface 49b of the suspended portions 49 can be created by using non-linearly changing gradient opacity.

While the suspended portions 49 shown in FIGS. 22A and 23 comprise "cantilever" suspended portions, FIGS. 22B and 24 show "bridging" suspended portions 49, as explained above. As viewed in the cross-section, each of the suspended portions 49 shown in FIG. 24 bridges two adjacent bases 30. Here again, the second opaque region 114b(5) of the mask 110 has monotonous, non-gradient, opacity, and the resulting corresponding suspended portion 49(5) has a constant thickness and a substantially planar back surface 49b(5) parallel to the backside 22 of the resulting framework 20. At the same time, the second opaque regions 114b(6) and 114b(7) have patterns of gradient opacities therein, and the suspended portions 49(6) and 49(7) have their respective back surfaces 49b(6) and 49b(7) shaped as curvatures. The suspended portion 49(8), corresponding to the second opaque region 114b(8), has its back surface 49b(8) comprising a sinusoidal, or "wavy" shape in the cross-section. The framework 20 exemplified in FIGS. 22B and 24 is substantially continuous, with a plurality of discrete deflection conduits 35 dispersed therethrough, a central portion of each of the deflection conduits 35 being partially "covered" by a suspended portion 49. FIG. 24 also shows the pattern of protrusions 115 extending from the mask's bottom side 110(b), as described above.

In FIGS. 22C and 25, showing another exemplary embodiment of the framework 20 comprising the suspended portions 49, each of the second opaque regions 114b of the mask 110 is shown to have a constant, non-gradient opacity. However, these opacities are differential relative to one another: the second opaque regions 114b(10) and 114b(12) are less opaque than the second opaque regions 114b(9) and 114b(11). Consequently, the suspended portions 49(10) and 49(12) corresponding to the second opaque regions 114b(10) and 114b(12), respectively, have been cured through a greater thickness and in the result are thicker than the suspended portions 49(9) and 49(11) corresponding to the second opaque regions 114b(9) and 114b(11), respectively. In FIGS. 22C and 25, there are two kinds of the first opaque regions 114a, based on their geometrical pattern: the first opaque regions 114a(9) comprising a plurality of discrete circular areas, each encompassed by the discrete transparent region 112; and the first opaque regions 114a(10) comprising areas separated by the pattern of the first and second opaque regions 114a, 114b. Both kinds of the first opaque regions 114a has the opacity that completely precludes the corresponding third areas of the coating from curing throughout the entire coating's thickness. The resulting framework 20 comprises a plurality of discrete protuberances, each having therein a discrete deflection conduit 35 extending through the entire thickness of the framework 20 from the web-side 21 to the backside 22, and a plurality of the suspended portions 49 that bridge mutually adjacent protuberances. As is explained herein above, these suspended portions 49 can have differential thickness.

FIG. 25A shows another exemplary embodiment of the process for making the deflection member 10 of the present invention, using the mask 110 of the present invention comprising the pattern of transparent/opaque regions and a pattern of a three-dimensional topography. The mask's three-dimensional topography comprises protrusions 115a outwardly extending from the top side 110a of the mask, and protrusions 115b outwardly extending from the bottom side 111b of the mask 110. When the mask 110 is placed on the top of the coating of the fluid curable material 30, the pattern of protrusions 115b, extending from the bottom side 110b of the mask 110, is submerged into the coating thereby excluding the fluid curable material 30 therefrom and thus forming a corresponding pattern of depressions in the coating; and the pattern of protrusions 115a, extending from the top surface 110a of the mask 110 and comprising voids structured and configured to receive the fluid curable material, receives the curable material 30 that fills these voids to form corresponding projections 39 on the would-be web-side 21 of the framework 20 being constructed.

The pattern of opaque regions of the mask 110 shown in FIG. 25A has differential opacities, as described above. The first opaque regions 114a completely block the curing radiation, thereby causing the curable material corresponding thereto (i. e., the first areas) to remain liquid. Upon removal of that liquid curable material, conduits 35a and 35b are formed, the conduits 35b being formed in the suspended portions 49. The second opaque regions 114b allow the curing radiation to cure the coating to a certain depth, thereby forming the suspended portions 49. The transparent regions 112 cause the curing radiation to cure the third areas of the coating through the entire thickness of the third areas. It should be noted that in FIGS. 23–25A, differential shading of the framework 20 is used only for illustrative purposes and convenience of a reader, to distinguish differential portions of the framework 20 being made. A single layer of the framework 20, when made using the mask 110 illustrated in FIGS. 22A–25A, is an integral structure having no visual "border lines" separating parts thereof.

It is to be understood that the mask 110 may have a third, fourth, fifth, etc. differential opacities, which would enable one to create a variety of three-dimensional patterns of the framework 20 of the present invention, all of which are contemplated by, and within the scope of, the present invention. The foregoing embodiments of the deflection member 10 of the present invention should be construed as mere examples which are intended to illustrate a variety of possible variations and permutations of the mask 110 and the deflection member 10, but not to limit the present invention. One skilled in the art would appreciate that virtually unlimited number of embodiments and variations of geometrical shapes and mutual positions of the bases 30 and the suspended portions 49 may be formed using the mask 110 and based on the principles of the present invention described herein, which are all included in the scope of the present invention.

After the uncured, or liquid, material is removed, the cured, or hardened, material is left to form the framework 20 having a pre-selected pattern. The third areas that have been cured throughout the entire thickness of the coating form the bases 30; and the second areas that have been partially cured through oily the second thickness form the suspended portions 49. Since the curable material can be cured from that surface of the coating which will form the web-surface 21 of the framework 20 being made, the second thickness extends from the web-side 21 towards the backside 22 of the framework 20 being made. Therefore, when the liquid uncured material is removed, the suspended portions 49 are disposed at a distance, i. e., "elevated," or "suspended," from the plane defined by the bottom surface of the layer being made, or from the backside 22 of the framework 20, to form void spaces between the suspended portions 49 and the plane defined by the backside 22. It is to be understood that when this process is used for making an individual layer (30, 40) of a multi-layer composite deflection member 10, the curing of the coating may be conducted from either the top side (31, 41) or the bottom side (32, 42) of the individual layer (30, 40) being made, in which instance the suspended portions 49 can be elevated from the plane defined by that surface which is opposite to the surface first receiving curing radiation.

The distance between any given suspended portion 49 and the X-Y plane is defined by a thickness of the uncured material that has been removed from the member being constructed. The suspended portions 49 can laterally extend from the bases 30 in at least one direction. As used herein, the term "lateral" and permutations thereof generally mean an orientation which is different from the Z-direction, including but not limited to any direction that is substantially parallel to the X-Y plane. It is to be appreciated that while it is said that the suspended portion 49 "extends" in at least one of the directions substantially parallel to the X-Y plane, the suspended portion 49 itself, as a whole, does not need to be parallel to the X-Y plane.

Fibrous Structure

One use of the deflection member 10 is in the production of an improved fibrous structure, such as, for example, a paper web. With reference to FIGS. 26—28 41, the fibrous structure 500 of the present invention comprises a first plurality of micro-regions (or simply, a first region) 510 having first properties, and a second plurality of micro-regions (or simply, a second region) 540 having second properties. The first properties are different, in at least one respect, from the second properties.

As shown in FIGS. 26–29, the first region 510 is substantially macroscopically-monoplanar and defines a first plane parallel to the X-Y plane. The first region 510 has a first elevation. The second region 540 outwardly extends from the first region 510 (or from the first plane defined thereby) in a direction perpendicular to the first plane (i. e., the Z-direction), to define a second elevation. It is to be understood that the "second elevation" need not be uniform, i. e., differential portions which form the second region 540 can have differential heights.

In one embodiment, the first plurality of micro-regions 510 has a relatively high density, and the second plurality of micro-regions 540 has a relatively low density. In another embodiment, the first and second pluralities of micro-regions 510, 540 can differentiate by their respective basis weight. For example, the second plurality of micro-regions 540 can have a basis weight that is greater than that of the first plurality of micro-regions 510. All such embodiments are included in the scope of the present invention.

According to the present invention, the second region 540 comprises fibrous domes 530 that extend generally upwardly from the first plane, and a fibrous cantilever portions 549 that laterally extend from the fibrous domes 530 at the second elevation. As used herein, the term "dome" is descriptive with respect to the fibrous web's cross-section perpendicular to the X-Y plane. The fibrous domes can comprise a continuous pattern, a semi-continuous pattern, a plurality of discrete elements, or any combination thereof. The term "fibrous pillow" (or simply "pillow") 540 is used herein to define the dome 530 and the cantilever portion 549 extending therefrom, if such a cantilever portion 549 exists with respect to that dome 530. The fibrous pillows can also comprise a continuous pattern, a semi-continuous pattern, a plurality of discrete elements, or any combination thereof.

Because the fibrous cantilever portions 549 laterally extend from the fibrous domes 530 at the second elevation, a plurality of pockets 560 comprising substantially void spaces can be formed between the first region 510 and the fibrous cantilever portions 549. Thus, the fibrous cantilever portions 549 form characteristic pockets 560 defined between the area of the first region 510, the fibrous domes 530 extending therefrom, and the fibrous cantilever portions 549, as shown in FIGS. 27 and 29–41. In large part due to the existence of these substantially void pockets 560, the fibrous structure 500 of the present invention is believed to exhibit very high, for a given basis weight, absorbency characteristics. The pockets 560 are characterized by having none or very little amount of fibers therein. One skilled in the art will appreciate that due to a process of making the fibrous structure 500, as discussed below, and because of a highly flexible nature of the fibers and the fibrous structure 500 as a whole, some amount of individual fibers present in the pockets 560 is tolerable as long as those fibers do not interfere with the designed pattern of the fibrous structure 500 and its intended properties. In these context, the term "substantially void"spaces/pockets is intended to recognizes that due to a highly flexible nature of the fibrous structure 10 and individual fibers comprising it, some insignificant amount of fibers or their portions may be found in the pockets 560, as long as these pockets 560 could be easily distinguished from the rest of the fibrous structure 500, as best shown in photomicrographs of FIGS. 32–41. A density of the pockets 560 is not greater than 0.005 gram per cubic centimeter (g/cc), more specifically, not greater than 0.004 g/cc, and still more specifically not greater than 0.003 g/cc.

Figure 30:
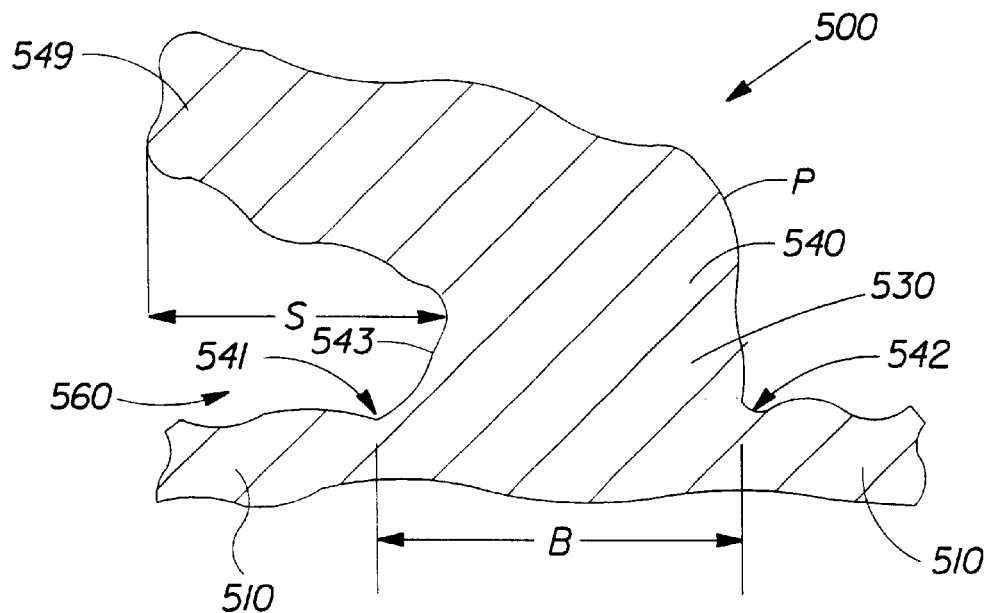
FIG. 30 is a schematic instantaneous cross-sectional view of a portion of the fibrous structure of the present invention, showing in more detail a pillow having a fibrous cantilever portion.
Figure 31:
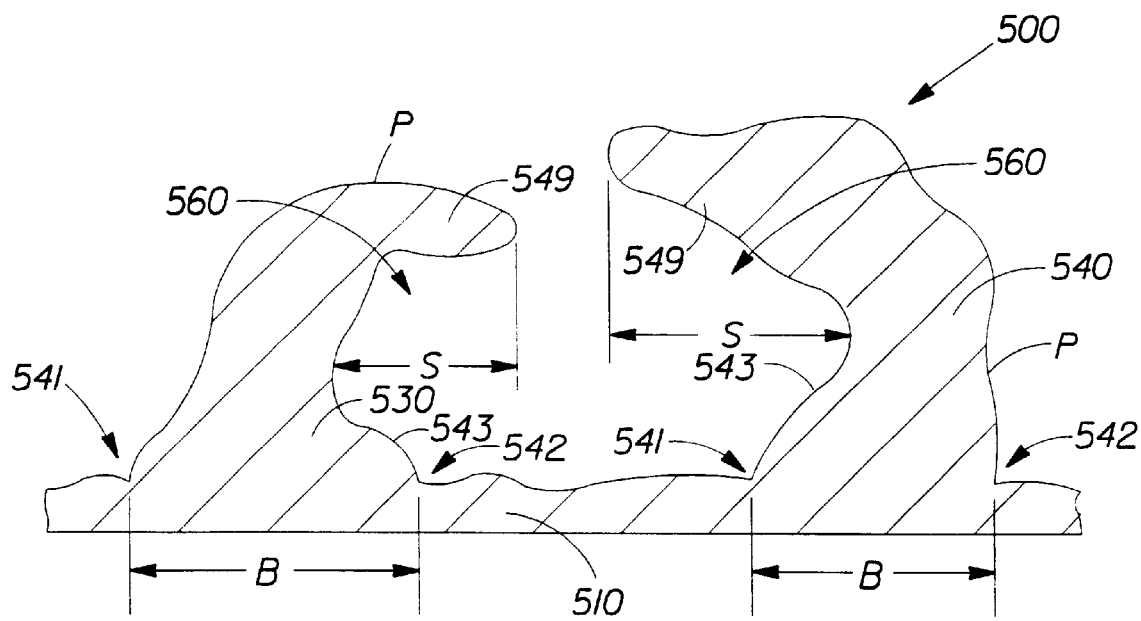
FIG. 31 is another schematic instantaneous cross-sectional view of the fibrous structure, similar to that shown in FIG. 30.
Figure 32:
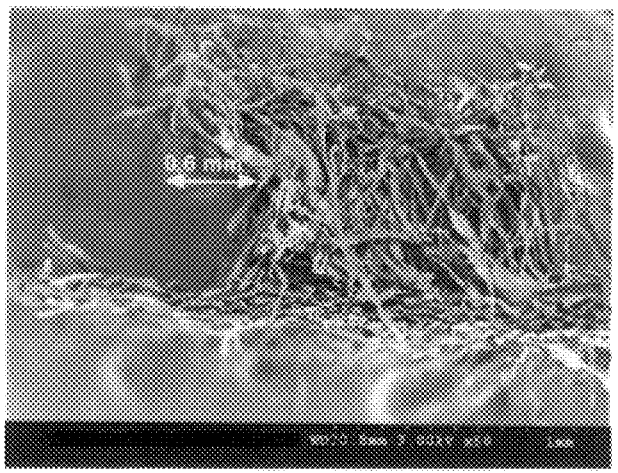
FIGS. 32–41 are photomicrographs showing, in cross-section, examples of the fibrous structure of the present invention.
Figure 33:
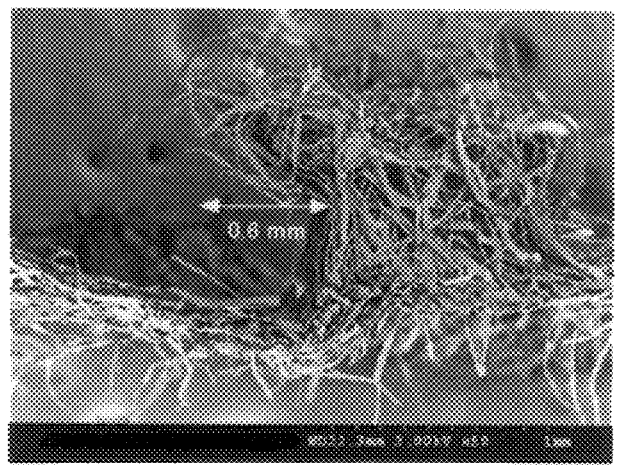
Figure 34:
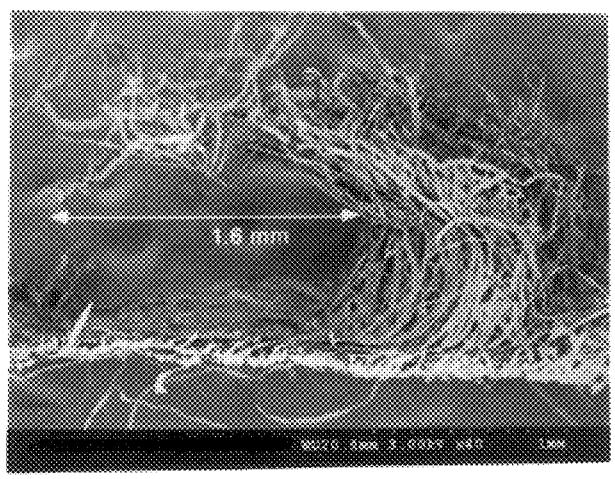
Figure 35:
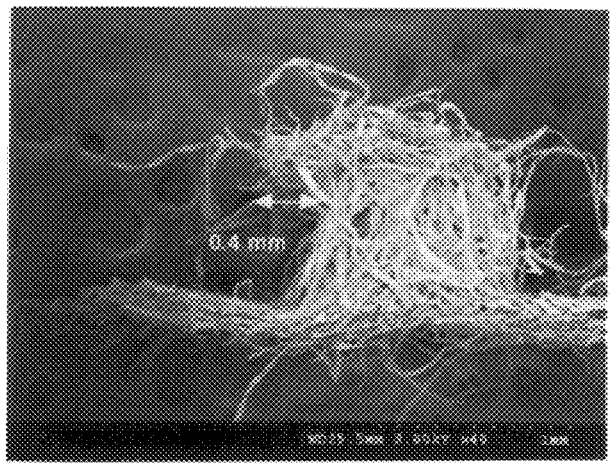

Typically, the fibrous cantilever portion 549 is oriented in a general direction parallel to the first plane, as schematically shown in FIGS. 30 and 31 and photomicrographs of FIGS. 32–41. It should be understood that while it is said that the fibrous cantilever portions 549 is oriented, or "extend," parallel to the first plane, the fibrous cantilever portions 549 themselves do not have to be parallel to the first plane. As photomicrographs of FIGS. 32–41 show, the fibrous cantilever portions 549 can be angled relative to the first plane, curved, or otherwise positioned. Again, one skilled in the art should appreciate that the fibrous and highly flexible nature of the fibrous structure 550 can cause many of the fibrous cantilever portion to be irregularly and non-similarly positioned relative to one another, even if those cantilever portions have been formed by identical or similar elements of the deflection member 10 of the present invention.

According to the invention, a maximal horizontal dimension of the pocket 560 can be at least 0.3 millimeter, in some embodiments at least 0.7 millimeter, in still some embodiments at least 1.1 millimeter, and still in other embodiments at least 1.5 millimeter. As used herein, the "maximal horizontal dimension" of the pocket 560 is defined as the longest parameter of the pocket area, as viewed in a cross-section perpendicular to the first plane, and measured in the direction substantially parallel to the first plane. Stated differently, the maximal horizontal dimension of the pocket 560 is a projected (i. e., "horizontal") length of the fibrous cantilever portion 549, as measured from a side wall 543 of the fibrous dome 530 of the pillow 540 (FIGS. 30 and 31). It is again pointed out that because of the fibrous and highly flexible nature of the product, in some embodiments it may be difficult to precisely outline the exact boundaries of the pocket 560, and some approximation may be needed, for example, exclusion of some individual fibers extending from a mass of the fibrous dome 530 and/or its cantilever portion 549. Still, one skilled in the art can easily reproduce the images of the fibrous structure 500, similar to those shown in photomicrographs of FIGS. 32–41, and make all the necessary measurements, using the following equipment.

Photomicrographs shown in FIGS. 32–41 were taken with a Hitachi S-3500N Scanning Electron Microscope (SEM) in a "normal mode." Acceleration voltage was set from 3 kV to 5 kV to acquire a crisp and clean image. Magnification was set anywhere from 35× to 50×, in order to view the level of detail desired. All samples were mounted on metal sample holders and gold coated for imaging. Samples were mounted such as to acquire a cross-sectional view of the web structure.

Figure 26:
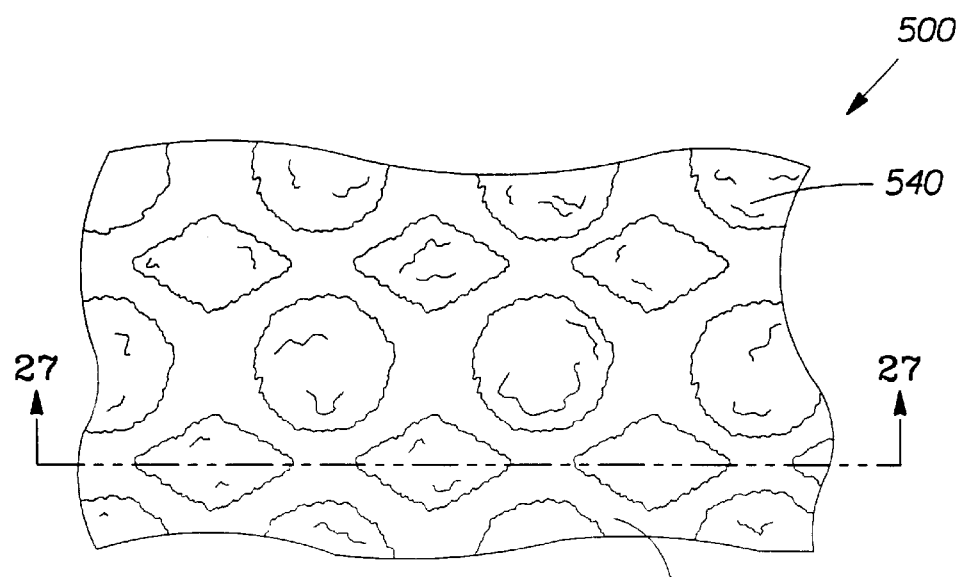
FIG. 26 is a schematic plan view of a fibrous structure of the present invention, comprising a substantially continuous and macroscopically monoplanar network area and a plurality of discrete pillows dispersed therethrough.
Figure 27:
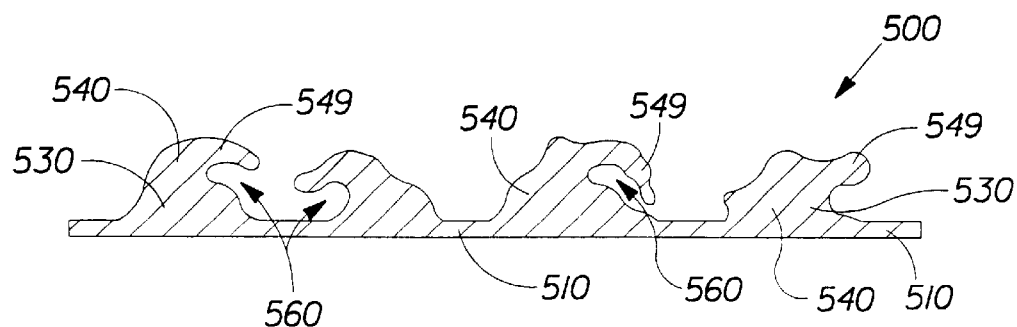
FIG. 27 is a schematic instantaneous cross-sectional view of the fibrous web shown in FIG. 26 and taken along lines 27—27.

One embodiment of the fibrous structure 500, schematically shown in FIGS. 26 and 27, has the first plurality of micro-regions 510 comprising a substantially continuous network, and the second plurality of micro-regions 540 comprising a plurality of pillows. As used herein, for convenience, the reference numeral 540 may be used to indicate both the "second plurality of micro-regions"(or the "second region") and the pillow. The first plurality of micro-regions 510 is continuous, macroscopically monoplanar, and forms a pre-selected pattern corresponding to the pattern of the presumably continuous web-contacting side 21 of the framework 20 of the deflection member 10 on which the fibrous structure 500 has been made. The pillows 540 are dispersed throughout the whole of the network region, separated from one another by the network region, and extend outwardly from the first plane formed by the network region. FIGS. 32–41 show photomicrographs of several embodiments of the fibrous structure of the present invention, having the pockets and comprising the first plurality of micro-regions in the form of a substantially continuous network, and the second plurality of micro-regions in the form of a plurality of discrete fibrous pillows, each comprising a fibrous dome portion and a fibrous cantilever portion.

Figure 28:
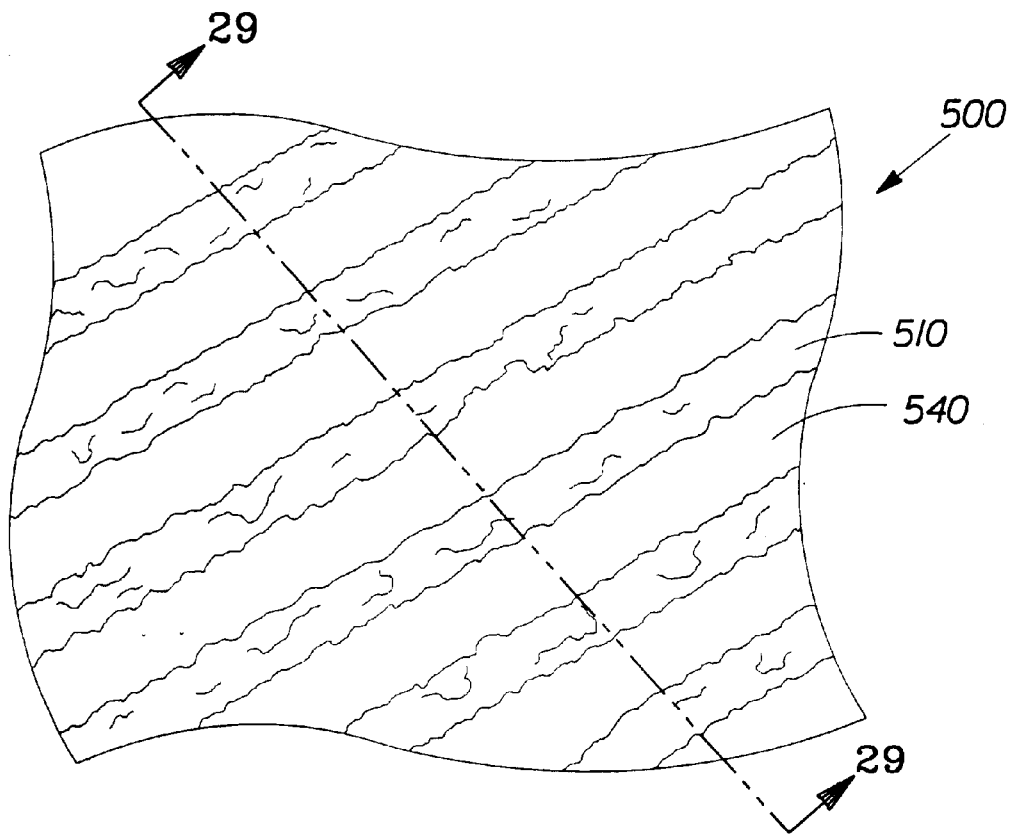
FIG. 28 is a schematic plan view of the fibrous structure of the present invention, comprising a semi-continuous patterns of network area and pillows.
Figure 29:
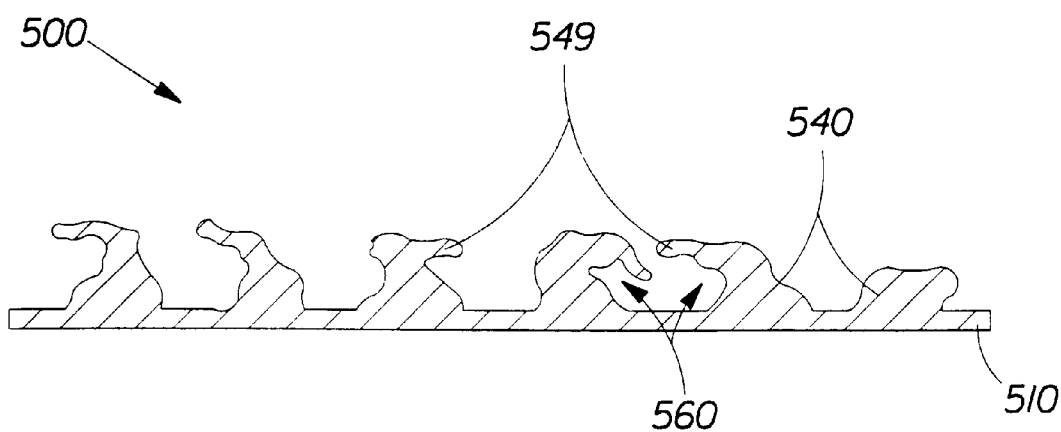
FIG. 29 is a schematic instantaneous cross-sectional view of the fibrous web shown in FIG. 28 and taken along lines 29—29.

Another, prophetic, embodiment of the fibrous web 500, shown in FIG. 28, comprises the first plurality of micro-regions 510 forming a semi-continuous pattern, and the second plurality of micro-regions 540 forming a semi-continuous pattern of the pillows 540. Still another prophetic embodiment (not shown) of the fibrous structure 500 comprises the first plurality of micro-regions 510 forming a pattern of discrete areas, while the second plurality of micro-regions 540 forms a substantially continuous pattern of the pillows 540.

The novel fibrous structure 500 of the present invention has a sufficiently increased surface area, relative to comparable fibrous structures of the prior art. By "comparable" fibrous structures of the prior art it is meant those prior art fibrous structures that have approximately the same basis weight and the overall pattern of the pillows, as the structure 500 of the present invention. One skilled in the art will appreciate that the increased surface area provides conditions for the increased absorbency of the fibrous structure 500. The surface area of the fibrous structure can be estimated and measured as described herein below. A cross-sectional parameter P of the pillow (FIG. 30), representative of the surface area of the second region 540, is measured and approximated, if needed, based on the photomicrographs of the fibrous structure 500, exemplified in FIGS. 32–41. As used herein, the term "perimeter" of the pillow 540 is defined by a line approximately outlining an overall configuration, or shape, of the individual pillow =540, as viewed in a cross-section perpendicular to the first plane.

Figure 36:
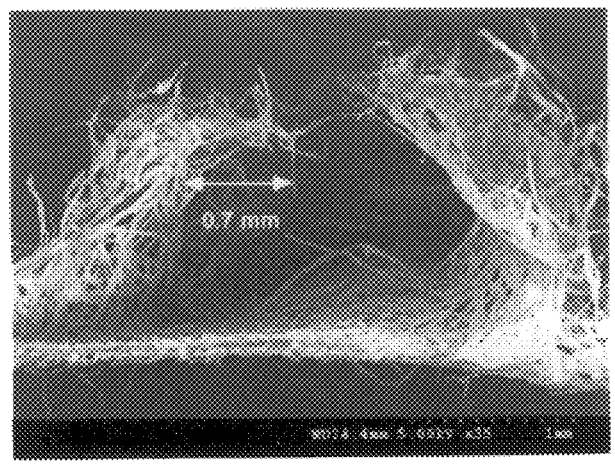
Figure 37:
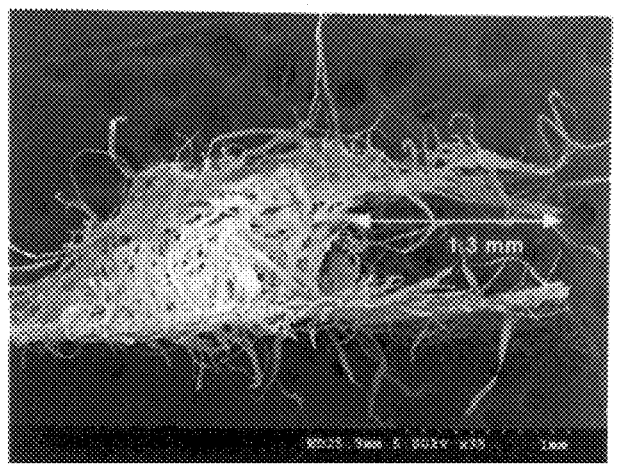
Figure 38:
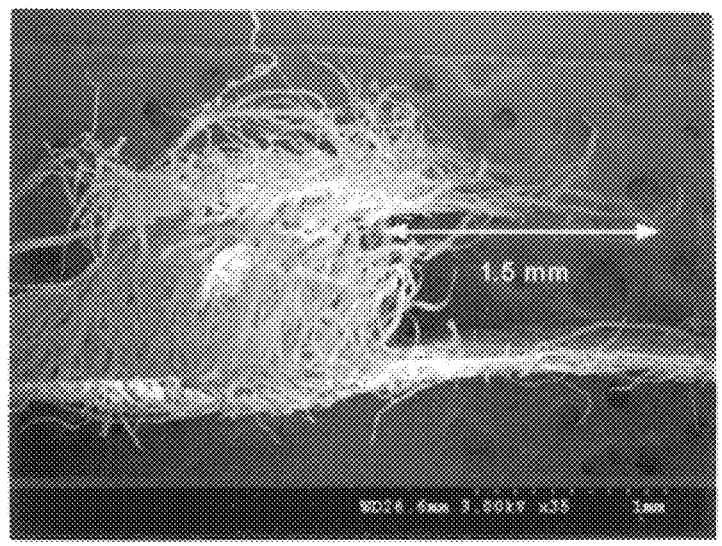
Figure 39:
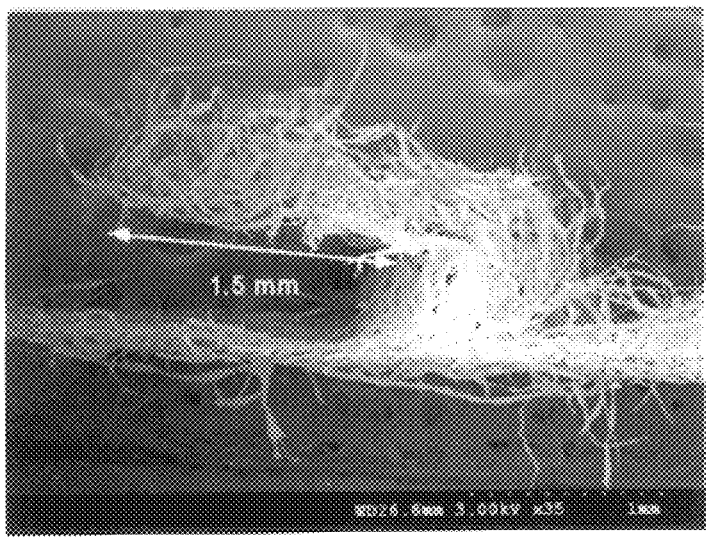
Figure 40:
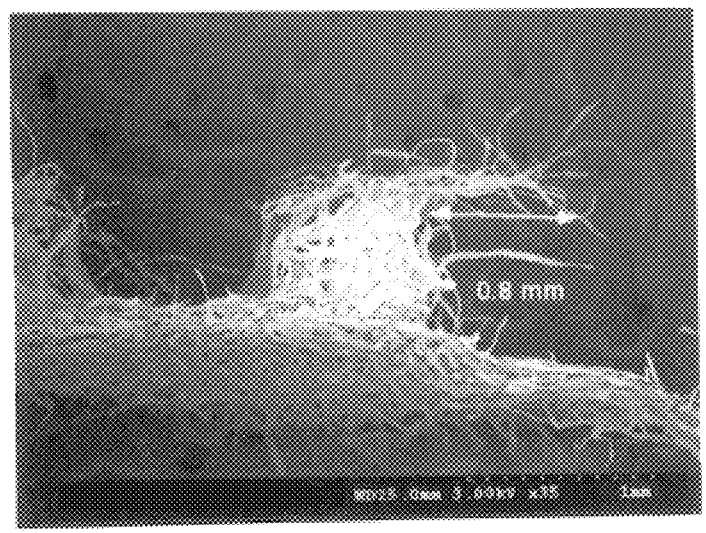
Figure 41:
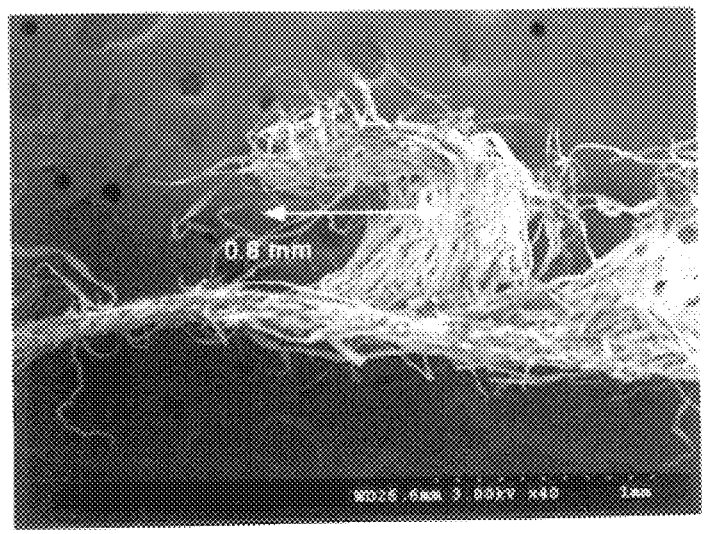

In FIGS. 32–41, one skilled in the art can readily draw a line generally outlining the configuration of a given pillow 540 and disregarding individual fibers that "stick out." For example, FIG. 30 is intended to approximately replicate (without regard to the scale) the configuration of the pillow 540 shown in the photomicrograph of FIG. 39; and FIG. 31 is intended to approximate (also without regard to the scale) the configuration of the pillows 540 shown in the photomicrograph of FIG. 36. In FIGS. 30 and 31, the points 541 and 542 conventionally designate the "beginning" and the "end" of the line representing the perimeter P of the pillow 540; and a distance between the points 541 and 542 defines a cross-sectional base B of the pillow 540. Stated differently, the points 541 and 542 approximate the points at which the line representing the parameter P intersects the plane of the first region 510. Then, with the understanding that the resulting line only approximates the cross-sectional perimeter P of the given pillow 540, one can easily measure the length of the resulting line representing the parameter P, as well as the length of the base B of the pillow 540.

Figure 45:
FIGS. 45 and 46 are photomicrographs showing examples of cross-sectional configurations of the fibrous structure of the prior art.
Figure 46:
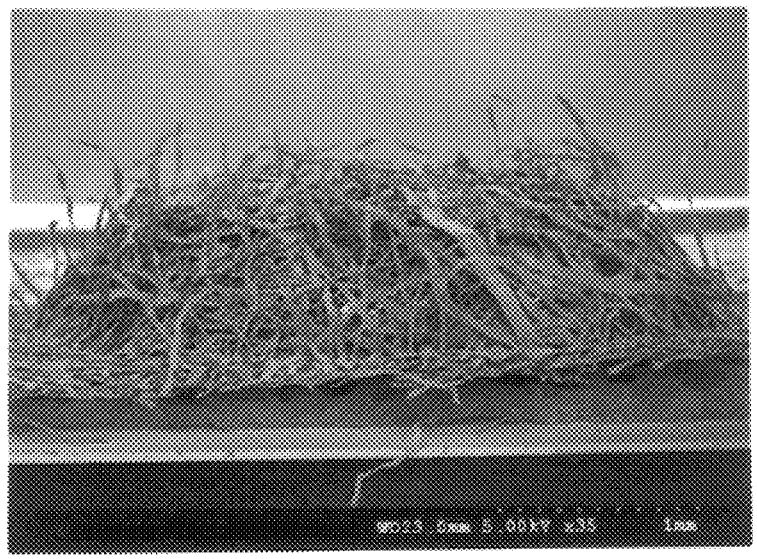
Figure 47:
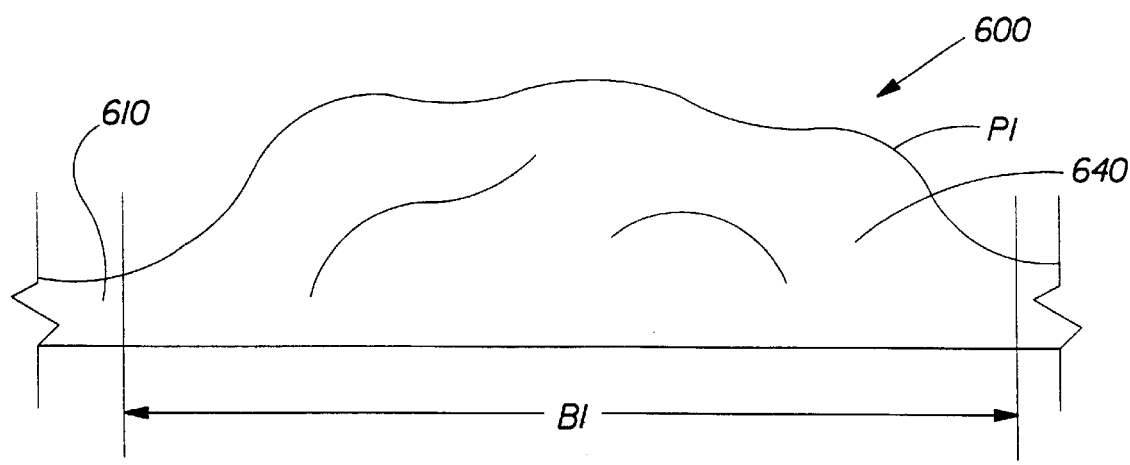
FIG. 47 is a schematic cross-sectional view of the pillow of the prior art fibrous structure shown in FIG. 46.

According to the present invention, a ratio P/B of the cross-sectional perimeter P of the pillow 540 to a cross-sectional base B of the same pillow 540, taken in a cross-section perpendicular to the first plane, is at least 4/1, in other embodiments is at least 6/1, still in other embodiments, is at least 8/1, and yet in other embodiments is at least 10/1. Thus, the ratio P/B of the fibrous structure 500 of the present invention is significantly higher than that of the structured papers of the prior art. For illustration, FIGS. 45 and 46 show photomicrographs of several exemplary embodiments of the structured paper produced by the present assignee and generally described, for example, in commonly assigned U.S. Pat. No. 4,637,859. In FIG. 47, which generally outlines a fragment of the prior art fibrous structure shown in FIG. 46, a relatively low-density pillow region is designated as 640, and a relatively high-density network area is designated as 610. The pillow 640 of the prior art structure, schematically shown in FIG. 47, has a perimeter P1 and a base B1. The ratio P1/B1 is about 4/3, which is significantly lower than the ratio P/B of the fibrous structure 500 of the present invention. It is to be understood that the foregoing ratios may be had in the fibrous structure of the present invention, even if its fibrous pillows 540 comprise only the fibrous dome portions 530. As has been pointed above, in some embodiments, at least some of the fibrous pillows 540 might not have the cantilever portions 549.

Figure 43:
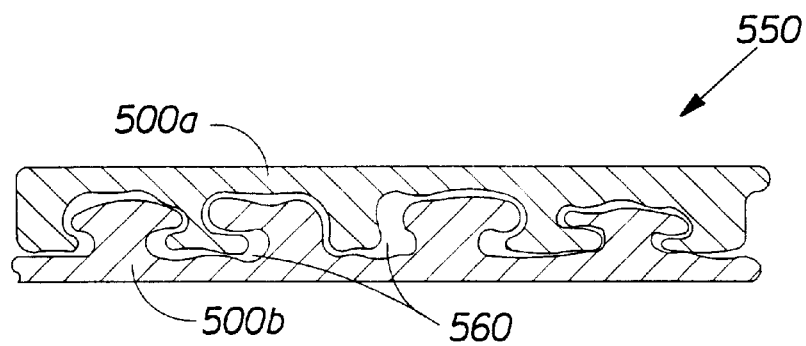
FIG. 43 is a schematic cross-sectional view of an embodiment of a laminated fibrous structure of the present invention, comprising two laminae joined together.
Figure 44:
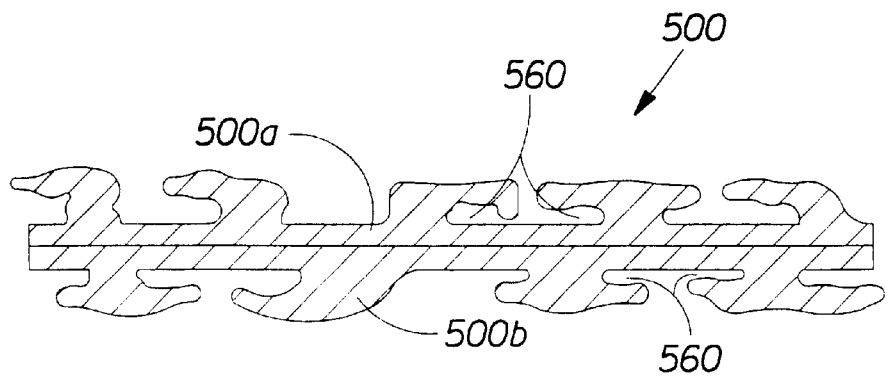
FIG. 44 is a schematic cross-sectional view of another embodiment of the laminated fibrous structure of the present invention comprising two laminae joined together.

The fibrous structure of the present invention can comprise a laminated structure. FIGS. 43 and 44 show two prophetic embodiments of the laminated fibrous structure 550 of the present invention, each embodiment comprising two laminae 500a and 500b. In FIG. 42, the two individual laminae 500a, 500b are joined such that their respective pillows 540 having fibrous cantilever portions 549 face one another. It is believed that the present invention allows one to form plies so structured that they could be joined together by using their respective fibrous cantilever portions, as schematically shown in FIG. 43. The plies so joined would have a limited movability relative to one another, primarily in lateral directions, without tearing of either one of the plies or separation thereof.

In the laminated paper structures of the prior art, laminae are rigidly joined together (usually, by an adhesive or mechanically, or by a combination thereof such that during the use of the laminated structure, the relative movement of the individual sheets forming the laminated structure is not possible without tearing or separation of the individual sheet. Therefore, during the use, when the laminated structure is naturally subjected to bending, rumpling, creasing, and so on, the rigid connection of the individual sheets comprising the laminates of the prior art affects the flexibility of these laminates. Otherwise, the integrity of one or both of the sheets comprising the laminated structure, or their connection, may be compromised. Not intending to be limited by theory, the applicant believes that the resistance to rumpling (which may include both bending and buckling) of one or both of the laminae affects the flexibility of the laminated structures of the prior art.

In contrast with the prior art, the individual sheets 500*a*, 500*b* of the laminated structure 550 shown in FIG. 43 are believed to be able to move relative one another during the use of the laminated structure by a consumer, without tearing of either the sheets 500*a*, 500*b*, or separation thereof. The ability of the individual sheets 500*a*, 500*b* which form the laminated structure 550 to move relative one another is accomplished by providing a non-rigid, flexible connection between the sheets, due to a highly flexible nature of the pillows 540 and their fibrous cantilever portions 549. In FIG. 43, the sheets 500*a*, 500*b* are believed to be able to move relative each other, primarily in lateral directions. In the sheet wherein the first region 510 is substantially continuous, the integrity of the first region 510, which most typically provides strength in the fibrous structure, is not affected by the flexibility of the pillows 540 and their fibrous cantilever portions 549. At the same time, since the respective first regions 510 of the individual laminae 500*a*, 500*b* are not directly attached to one another, when the laminated structure as a whole is deformed, the possible inequality in deformation of the individual laminae is compensated by their lateral movement relative one another. Thus, the movable connection between the individual sheets 500*a*, 500*b* minimizes potential excessive tension and/or compression of the laminae 500*a*, 500*b*.

The disclosure of commonly assigned US patent application titled "Laminated Fibrous Structure and Method Of Manufacturing Same" (Paul D. Trokhan), Ser. No. 08/934,406, filed on Sep. 19, 1997, allowed Jul. 03, 2000, issue fee paid on Jul. 20, 2000, Batch No. 092, is incorporated herein by reference. This application teaches a laminated fibrous structure in which laminae are able to move relative one another without tearing or separation of any one of the laminae, during its use. The laminae may be movably joined by a bonding material, by mechanically engaging upstanding fibers created on the interfacing surfaces of the laminae, or by a combination thereof.

In FIG. 44, the individual laminae 500*a*, 500*b* are joined such that their respective pillows 540 having the fibrous cantilever portions 549 are disposed on the outside of the laminated structure 550. It is believed that such a structure can provide enhanced absorbency characteristics of the resultant laminated structure, by increasing the outside surface area of the laminated structure and by exposing on the outside the pockets 560 formed by adjacent fibrous domes 530 and the fibrous cantilever portions 549.

It is to be understood that an embodiment (not shown) of the laminated structure 550 is possible in which the pillows side of one of the individual laminae is joined to the side opposite to the pillows side of the other laminae. It is also to be understood that the laminated structure 550 comprising two laminae is merely an illustrative example, and the laminated structure 550 comprising more than two laminae (not shown) is contemplated by the present invention.

Process For Making Fibrous Structure

With reference to FIG. 42, one exemplary embodiment of the process for producing the fibrous structure 500 of the present invention comprises the following steps. First, a plurality of fibers 501 is provided and is deposited on the deflection member 10 of the present invention.

The present invention contemplates the use of a variety of fibers, such as, for example, papermaking cellulosic fibers, synthetic fibers, or any other suitable fibers, and any combination thereof. Papermaking fibers useful in the present invention include cellulosic fibers commonly known as wood pulp fibers. Fibers derived from soft woods (gymnosperms or coniferous trees) and hard woods (angiosperms or deciduous trees) are contemplated for use in this invention. The particular species of tree from which the fibers are derived is immaterial. The hardwood and softwood fibers can be blended, or alternatively, can be deposited in layers to provide a stratified web. U.S. Pat. No. 4,300,981 issued Nov. 17, 1981 to Carstens and U.S. Pat. No. 3,994,771 issued Nov. 30, 1976 to Morgan et al. are incorporated herein by reference for the purpose of disclosing layering of hardwood and softwood fibers.

The wood pulp fibers can be produced from the native wood by any convenient pulping process. Chemical processes such as sulfite, sulfate (including the Kraft) and soda processes are suitable. Mechanical processes such as thermomechanical (or Asplund) processes are also suitable. In addition, the various semi-chemical and chemi-mechanical processes can be used. Bleached as well as unbleached fibers are contemplated for use. When the fibrous web of this invention is intended for use in absorbent products such as paper towels, bleached northern softwood Kraft pulp fibers may be used. Wood pulps useful herein include chemical pulps such as Kraft, sulfite and sulfate pulps as well as mechanical pulps including for example, ground wood, thermomechanical pulps and Chemi-ThermoMechanical Pulp (CTMP). Pulps derived from both deciduous and coniferous trees can be used.

In addition to the various wood pulp fibers, other cellulosic fibers such as cotton linters, rayon, and bagasse can be used in this invention. Synthetic fibers, such as polymeric fibers, can also be used. Elastomeric polymers, polypropylene, polyethylene, polyester, polyolefin, and nylon, can be used. The polymeric fibers can be produced by spunbond processes, meltblown processes, and other suitable methods known in the art. It is believed that thin, long, and continuous fibers produces by spunbond and meltblown processes may be beneficially used in the fibrous structure of the present invention, because such fibers are believed to be easily deflectable into the pockets of the deflection member of the present invention.

The paper furnish can comprise a variety of additives, including but not limited to fiber binder materials, such as wet strength binder materials, dry strength binder materials, and chemical softening compositions. Suitable wet strength binders include, but are not limited to, materials such as polyamide-epichlorohydrin resins sold under the trade name of KYMENE™ 557H by Hercules Inc., Wilmington, Del. Suitable temporary wet strength binders include but are not limited to synthetic polyacrylates. A suitable temporary wet strength binder is PAREZ™ 750 marketed by American Cyanamid of Stanford, Conn. Suitable dry strength binders include materials such as carboxymethyl cellulose and cationic polymers such as ACCO™ 711. The CYPRO/ACCO family of dry strength materials are available from CYTEC of Kalamazoo, Mich.

The paper furnish can comprise a debonding agent to inhibit formation of some fiber to fiber bonds as the web is dried. The debonding agent, in combination with the energy provided to the web by the dry creping process, results in a portion of the web being debulked. In one embodiment, the debonding agent can be applied to fibers forming an intermediate fiber layer positioned between two or more layers. The intermediate layer acts as a debonding layer between outer layers of fibers. The creping energy can therefore debulk a portion of the web along the debonding layer. Suitable debonding agents include chemical softening compositions such as those disclosed in U.S. Pat. No. 5,279,767 issued Jan. 18, 1994 to Phan et al., the disclosure of which is incorporated herein by reference Suitable biodegradable chemical softening compositions are disclosed in U.S. Pat. No. 5,312,522 issued May 17, 1994 to Phan et al. U.S. Pat. Nos. 5,279,767 and 5,312,522, the disclosures of which are incorporated herein by reference. Such chemical softening compositions can be used as debonding agents for inhibiting fiber to fiber bonding in one or more layers of the fibers making up the web. One suitable softener for providing debonding of fibers in one or more layers of fibers forming the web 20 is a papermaking additive comprising DiEster Di (Touch Hardened) Tallow Dimethyl Ammonium Chloride. A suitable softener is ADOGEN® brand papermaking additive available from Witco Company of Greenwich, Conn.

The embryonic web can be typically prepared from an aqueous dispersion of papermaking fibers, though dispersions in liquids other than water can be used. The fibers are dispersed in the carrier liquid to have a consistency of from about 0.1 to about 0.3 percent. Alternatively, and without being limited by theory, it is believed that the present invention is applicable to moist forming operations where the fibers are dispersed in a carrier liquid to have a consistency less than about 50 percent. In yet another alternative embodiment, and without being limited by theory, it is believed that the present invention is also applicable to airlaid structures, including air-laid webs comprising pulp fibers, synthetic fibers, and mixtures thereof.

Conventional papermaking fibers can be used and the aqueous dispersion can be formed in conventional ways. Conventional papermaking equipment and processes can be used to form the embryonic web on the Fourdrinier wire. The association of the embryonic web with the deflection member can be accomplished by simple transfer of the web between two moving endless belts as assisted by differential fluid pressure. The fibers may be deflected into the deflection member 10 by the application of differential fluid pressure induced by an applied vacuum. Any technique, such as the use of a Yankee drum dryer, can be used to dry the intermediate web. Foreshortening can be accomplished by any conventional technique such as creping.

The plurality of fibers can also be supplied in the form of a moistened fibrous web (not shown), which should preferably be in a condition in which portions of the web could be effectively deflected into the deflection conduits of the deflection member and the void spaces formed between the suspended portions and the X-Y plane.

In FIG. 42, the embryonic web comprising fibers 501 is transferred from a forming wire to the deflection member 10 by a vacuum pick-up shoe 18a. Alternatively or additionally, a plurality of fibers, or fibrous slurry, can be deposited to the deflection member 10 directly (not shown) from a headbox or otherwise. The deflection member 10 in the form of an endless belt travels about rolls 19a, 19b, 19k, 19c, 19d, 19e, and 19f in the direction schematically indicated by the directional arrow "B."

Then, a portion of the fibers 501 is deflected into the deflection portion of the deflection member 10 such as to cause some of the deflected fibers or portions thereof to be disposed within the void spaces formed by the suspended portions 49 of the deflection member 10. Depending on the process, mechanical, as well as fluid pressure differential, alone or in combination, can be utilized to deflect a portion of the fibers 501 into the deflection conduits of the deflection member. For example, in a through-air drying process shown in FIG. 42, a vacuum apparatus 18b, applies a fluid pressure differential to the embryonic web disposed on the deflection member 10, thereby deflecting fibers into the deflection conduits of the deflection member 10. The process of deflection may be continued as another vacuum apparatus 18c applies additional vacuum pressure to even further deflect the fibers into the deflection conduits of the deflection member 10. According to the present invention, a portion of the deflected fibers is disposed in the void spaces formed between the suspended portions 49 of the framework 20 and the plane formed by its backside 22, or the reinforcing element 50, as described above.

Figure 54:
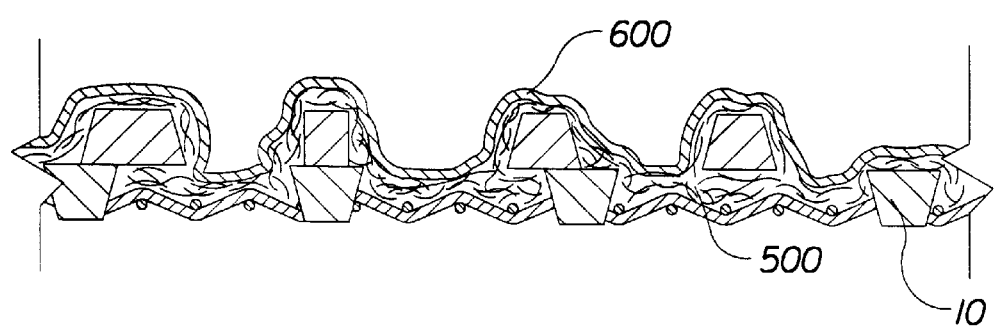
FIG. 54 is a schematic instantaneous cross-sectional view of one embodiment of the process of the present invention, wherein fibers are disposed between the deflection member of the present invention and a flexible sheet of material.

The step of deflecting the fibers into the deflection conduits of the deflection member 10 of the present invention may be beneficially accomplished by using a process disclosed in commonly assigned U.S. Pat. No. 5,893,965, issued in the name of Trokhan et al. on Apr. 13, 1999, the disclosure of which is incorporated herein by reference. According to this process, a web disposed on the deflection member is overlaid with a flexible sheet of material such that the web is disposed intermediate the sheet of material and the deflection member, as schematically shown in FIG. 54. The sheet of material has an air permeability less than that of the deflection member. In one embodiment, the sheet of material is air-impermeable. An application of a fluid pressure differential to the sheet of material causes deflection of at least a portion of the sheet of material towards the deflection member and thus deflection of at least a portion of the web into the conduits of the papermaking belt.

It is believed that this process can be especially beneficial if used with the deflection member 10 of the present invention, having void spaces formed by the suspended portions. The process of the present invention for making the fibrous structure 500, particularly when used with the fluid-impermeable flexible sheet, or the sheet of material having relatively low air-permeability, is believed to allow one to apply a high deflection pressure without creating pinholes in the fibrous structure being constructed. The pinholes may result when a certain amount of the fibers pass through the deflection member—under the application of a fluid pressure differential. The higher the pressure the higher the risk that some fibers separate from the fibrous structure and pass through the deflection member, thereby creating pinholes in the fibrous structure. The fluid-impermeable sheet prevents such an occurrence. At the same time, high deflection pressure will encourage the fibers to better deflect into the deflection conduits and the void paces of the deflection member 10, as schematically shown in FIG. 54, in which he sheet of the flexible material overlaying the plurality of fibers is designated by reference numeral 600.

Finally, a partly-formed fibrous structure associated with the deflection member 10 can be separated from the deflection member, to form the fibrous structure 500 of the present invention.

The process may further comprise a step of impressing the deflection member 10 having the fibers therein against a pressing surface, such as, for example, a surface of a Yankee drying drum 28, thereby densifying the first region 510. In some instances, those fibers that are disposed within the voids formed between the reinforcing element 50 and the suspended portions 49 can also be at least partially densified. In FIG. 42, the step of impressing the web against the Yankee drying drum is performed by using the pressure roll 19k. This also typically includes a step of drying the fibrous structure. As the deflection member 10 is impressed into the web, the suspended portions 49 can densify the corresponding portions of the web, thereby encouraging creation of the fibrous cantilever portions 59 of the finished product. Then, based on the density, the fibrous structure may comprise three pluralities of micro-regions: the first plurality of micro-regions having a relatively high density, the second plurality of micro-regions comprising fibrous domes extending from the first plurality of micro-regions and having a relatively low density, and a third plurality of micro-regions comprising fibrous cantilever portions laterally extending from the domes and having an intermediate density relative to the relatively high density of the first plurality of micro-regions and the relatively low density of the second plurality of micro-regions.

EXAMPLE

The deflection member 10 of the present invention was produced with a first layer 30 comprising nine discrete deflection conduits per square inch, and a second layer 40 comprising forty-one deflection conduits per square inch ("41/9" pattern). The conduits' geometry was a diamond with filleted vertices. The cumulative projected open area (ΣR) of the deflection conduits 35 of the first layer 30 was 0.0756 square inches, and the cumulative projected open area of the second layer's deflection conduits was 0.0161 square inches. The first and second specific resulting open areas R1 and R2 (i. e., ratios of the cumulative projected open area of a given layer to a given surface area) was computed to be: R1=68% for the first layer, and R2=66% for the second layer. The thickness of each layer was 0.020 inches. The two-layer structure was bonded to a dual-layer 48×55 mesh belt known commercially as a stacked, warped, dual-layer belt, which is produced by the Appleton Wire Division of Albany International of Appleton, Wis.

Paper handsheets were produced using the "41/9" deflection member 10 as described above, according to a modified TAPPI handsheet method. The handsheets comprised 80% NSK (Northern Softwood Kraft), 18% CTMP (Chemi:Thermo Mechanical Pulp), and 2% Eucalyptus Pulps. The pulp slurry was disintegrated per TAPPI standards and diluted to yield a conditioned basis weight of 13 pounds per 3000 square feet (at 2 hours at 70° F. and 50% RH). The handsheet was directly formed, vacuumed, and dried on the 41/9 deflection member 10 of the present invention. Once dried, the handsheet was peeled off of the deflection member 10. Several photomicrographs reproduced herein in FIGS. 32–41 show cross-sectional configurations of these handsheets.

What is claimed is:

1. A deflection member comprising:
a single-layer patterned framework having a backside forming an X-Y plane and a web-side opposite to the backside, the framework comprising a plurality of bases extending from the X-Y plane in a Z-direction perpendicular to the X-Y plane, and a plurality of suspended portions laterally extending from the plurality of bases in at least one direction substantially parallel to the X-Y plane, wherein the suspended portions are elevated in the Z-direction from the X-Y plane to form void spaces between the X-Y plane and the suspended portions, and
a fluid-permeable reinforcing element joined to the plurality of bases and positioned between the web-side and at least a portion of the backside of the framework.

2. The deflection member according to claim 1, wherein each of the suspended portions has a web-oriented surface comprising the web-side of the framework, and a back surface opposite thereto.

3. The deflection member according to claim 2, wherein at least one of the suspended portions has the back surface that is substantially parallel to the X-Y plane.

4. The deflection member according to claim 2, wherein at least one of the suspended portions has the back surface that is not parallel to the web-oriented surface.

5. The deflection member according to claim 1, wherein at least one of the suspended portions forms a cantilever portion in a cross-section.

6. The deflection member according to claim 1, wherein at least one of the suspended portions bridges at least two bases in a cross-section.

7. The deflection member according to claim 1, wherein the framework has a fluid-permeable conduit portion extending from the web-side to the backside of the framework.

8. The deflection member according to claim 1, wherein at least one of the web-side and the backside of the framework comprises a substantially continuous pattern having a plurality of discrete openings dispersed therethrough, the plurality of discrete openings comprising a plurality of discrete deflection conduits.

9. The deflection member according to claim 1, wherein at least one of the web-side and the backside of the framework comprises a substantially semi-continuous pattern.

10. The deflection member according to claim 1, wherein at least one of the web-side and the backside of the framework is formed by a plurality of discrete protuberances.

11. The deflection member according to claim 7, wherein the conduit portion is at least partially closed by a fluid-impermeable material.

12. A deflection member comprising:
a macroscopically monoplanar reinforcing element; and
a macroscopically monoplanar, single-layer patterned framework joined to the reinforcing element and having a web-side and a backside opposite to the web-side, wherein the framework comprises a plurality of bases outwardly extending from the reinforcing element, and a plurality of suspended portions laterally extending from the plurality of bases and elevated from the reinforcing element to form void spaces between the reinforcing element and the suspended portions.

13. The deflection member according to claim 12, wherein the plurality of bases comprises a substantially continuous pattern, a substantially semi-continuous pattern, a pattern of discrete protuberances, or any combination thereof.

14. The deflection member according to claims 12 or 13, wherein the plurality of suspended portions comprises a substantially continuous pattern, a substantially semi-continuous pattern, a pattern of discrete protuberances, or any combination thereof.

15. A process for making a deflection member, the process comprising the steps of:
(a) providing a coating of a liquid photosensitive resin supported by a forming surface, the coating having a bottom surface facing the forming surface and a top surface opposite to the bottom surface, and a preselected first thickness defined between the top and bottom surfaces;

(b) providing a source of curing radiation;

(c) providing a mask having transparent regions and opaque regions, the opaque regions comprising at least first opaque regions and second opaque regions, the first opaque regions having a first opacity, and the second opaque regions having a second opacity less that the first opacity;

(d) positioning the mask between the coating and the source of curing radiation;

(e) curing the liquid photosensitive resin through the mask, wherein
the first opaque regions of the mask shield first areas of the coating from the curing radiation to preclude curing of the first areas of the coating through the first thickness of the coating,
the second opaque regions of the mask partially shield second areas of the coating to allow the curing radiation to cure the second areas of the coating to a predetermined second thickness less than the first thickness of the coating, and
the transparent regions of the mask leave third areas of the coating unshielded to allow the curing radiation to cure the third areas through the first thickness of the coating,
thereby forming a partly-formed deflection member; and (f) removing substantially all uncured liquid photosensitive resin from the partly-formed deflection member to leave a hardened resinous structure which forms a macroscopically monoplanar, patterned framework having a web-side formed from the top surface of the coating, and a backside formed from the bottom surface of the coating and defining an X-Y plane, wherein
the framework comprises a plurality of bases formed from the third areas of the coating and a plurality of suspended portions formed from the second areas of the coating, wherein the suspended portions laterally extend from the plurality of bases and are spaced from the X-Y plane to form void spaces between the X-Y plane and the suspended portions.

16. The process according to claim 15, further comprising steps of providing a reinforcing element supported by the forming surface, and depositing the liquid photosensitive resin onto the reinforcing element.

17. The process according to claim 15, wherein the step of providing a mask comprises providing a mask in which the first opaque regions form a pattern comprising a plurality of discrete areas, a substantially semi-continuous pattern, a substantially continuous pattern, or any combination thereof.

18. The process according to claim 15, wherein the step of providing a mask comprises providing a mask in which the second opaque regions comprise areas adjacent to the first opaque regions.

19. The process according to claim 15, wherein the step of providing a mask comprises providing a mask in which the opaque regions comprise at least one region having a gradient opacity that gradually changes in at least one direction.

20. The process according to claim 15, wherein the step of providing a mask comprises providing a mask having opaque regions comprising at least third opaque regions having a third opacity intermediate the first opacity and the second opacity.

21. The process according to claim 15, wherein the step of providing a mask comprises providing a mask having a pattern of a three-dimensional topography structured and configured to cause the coating to approximate said pattern of a three-dimensional topography when placed in contact therewith.

* * * * *

UNITED STATES PATENT AND TRADEMARK OFFICE
CERTIFICATE OF CORRECTION

PATENT NO. : 6,576,090 B1  Page 1 of 1
DATED : June 10, 2003
INVENTOR(S) : Paul Dennis Trokhan et al.

It is certified that error appears in the above-identified patent and that said Letters Patent is hereby corrected as shown below:

Column 42,
Line 63, "oily" should read -- only --.

Column 43,
Line 33, "FIGS. 26----28 41" should read -- FIGS. 26-41 --.

Column 50,
Line 60, "paces" should read -- spaces --.
Line 61, "he sheet" should read -- the sheet --.

Signed and Sealed this

Twenty-third Day of December, 2003

JAMES E. ROGAN
*Director of the United States Patent and Trademark Office*